(12) United States Patent     (10) Patent No.:   US 12,610,579 B2

Yu et al.     (45) Date of Patent:   Apr. 21, 2026

(54) SEMICONDUCTOR DEVICE AND METHOD OF FORMING THEREOF

(71) Applicant: Taiwan Semiconductor Manufacturing Co., Ltd., Hsinchu (TW)

(72) Inventors: Li-Zhen Yu, New Taipei City (TW); Lin-Yu Huang, Hsinchu (TW); Cheng-Chi Chuang, New Taipei City (TW); Chih-Hao Wang, Baoshan Township (TW); Huan-Chieh Su, Tianzhong Township (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 180 days.

(21) Appl. No.: 18/067,213

(22) Filed: Dec. 16, 2022

(65) Prior Publication Data

US 2023/0123733 A1     Apr. 20, 2023

Related U.S. Application Data

(62) Division of application No. 17/093,345, filed on Nov. 9, 2020, now Pat. No. 11,532,714.

(Continued)

(51) Int. Cl.
*H10D 30/62*     (2025.01)
*H01L 21/3065*     (2006.01)
(Continued)

(52) U.S. Cl.
CPC ..... *H10D 30/6219* (2025.01); *H01L 21/3065* (2013.01); *H01L 21/76895* (2013.01);
(Continued)

(58) Field of Classification Search
CPC ........... H10D 30/6219; H10D 84/0149; H10D 84/38; H10D 30/6757; H10D 64/017; H10D 30/6735; H10D 61/118; H10D 84/0186; H10D 84/0193; H10D 84/853; H10D 62/121; H10D 84/0128; H10D 84/013;
(Continued)

(56) References Cited

U.S. PATENT DOCUMENTS 9,209,247 B2   12/2015   Colinge et al.
9,236,267 B2   1/2016   De et al.
(Continued)

FOREIGN PATENT DOCUMENTS

CN     104916620 A    9/2015
CN     109427588 A    3/2019
(Continued)

*Primary Examiner* — Moin M Rahman
(74) *Attorney, Agent, or Firm* — Slater Matsil, LLP

(57) ABSTRACT

A device includes a device layer including a first transistor, a first interconnect structure on a front-side of the device layer, and a second interconnect structure on a backside of the device layer. The second interconnect structure includes a first dielectric material on the backside of the device layer, a contact extending through the first dielectric material to a first source/drain region of the first transistor, and a first conductive layer including a first conductive line electrically connected to the first source/drain region through the contact.

20 Claims, 72 Drawing Sheets

Related U.S. Application Data

(60) Provisional application No. 63/044,112, filed on Jun. 25, 2020.

(51) Int. Cl.

| | |
|---|---|
| *H01L 21/768* | (2006.01) |
| *H01L 23/48* | (2006.01) |
| *H01L 23/522* | (2006.01) |
| *H01L 23/528* | (2006.01) |
| *H10D 84/01* | (2025.01) |
| *H10D 84/03* | (2025.01) |

(52) U.S. Cl.
CPC .......... *H01L 23/481* (2013.01); *H01L 23/522* (2013.01); *H01L 23/5283* (2013.01); *H10D 84/0149* (2025.01); *H10D 84/038* (2025.01)

(58) Field of Classification Search
CPC .......... H10D 84/0135; H10D 84/0151; H10D 84/0144; H10D 30/6728; H10D 30/6733; H10D 62/118; H10D 89/931; H10D 64/252; H10D 84/0188; H10D 84/201; H10D 18/60; H10D 30/024–0245; H10D 84/0158; H10D 86/011; H10D 84/834; H10D 86/215; H10D 84/0165–0195; H10D 84/85–859; H10D 84/907–994; H10D 30/673; H10D 30/62; H10D 30/689; H10D 30/0323; H10D 30/6713; H10D 30/6744; H10D 62/021; H10D 64/015; H10D 64/021; H10D 30/60; H10D 62/151; H10D 62/364; H10D 30/797; H10D 64/671; H10D 30/031; H10D 48/362; H10D 30/472; H10D 30/014; H10D 30/43; H10D 30/01; H10D 62/80; H10D 62/8303; H10D 62/882; H10D 99/00; H10D 62/235; H10D 89/10; H10D 84/0167; H10D 84/038; H10D 62/292; H01L 21/3065; H01L 21/76895; H01L 23/481; H01L 23/522; H01L 23/5283; H01L 21/28518; H01L 21/76831; H01L 23/485; H01L 23/5286; H01L 21/76804; H01L 21/76897; H01L 21/76805; H01L 23/528; H01L 21/76816; H01L 21/76844; H01L 21/76224; H01L 21/31116; H01L 21/30604; H01L 29/66545; H01L 21/76846; H01L 21/76849; H01L 29/7845; H01L 21/76834; H01L 29/41791; H01L 21/76801; H01L 21/0037; H01L 21/28247; H01L 21/28568; H01L 21/3086; H01L 21/31105; H01L 21/31144; H01L 21/823481; H01L 21/823807; H01L 21/823814; H01L 21/823821; H01L 21/823842; H01L 21/823857; H01L 21/823871; H01L 21/823878; H01L 23/53266; H01L 27/0924; H01L 27/1104; H01L 28/24; H01L 29/0847; H01L 29/516; H01L 29/6653; H01L 29/7854; B82Y 10/00; B82Y 40/00; H02K 15/027; A23B 2/783; A45C 11/003; A61K 40/4218; H10F 77/955; H10H 20/826; H10B 12/056; B81C 2203/0728; B81C 2203/0735; B81C 2203/0742
See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,653,347 | B1 * | 5/2017 | Leobandung ........ H10D 84/038 |
| 10,734,412 | B2 | 8/2020 | Glass et al. |
| 2014/0367753 | A1 | 12/2014 | Huang et al. |
| 2015/0262876 | A1 | 9/2015 | Yang et al. |
| 2018/0301371 | A1 * | 10/2018 | Wang ................. H10D 64/667 |
| 2019/0221649 | A1 | 7/2019 | Glass et al. |
| 2019/0259699 | A1 | 8/2019 | Morrow et al. |
| 2020/0027959 | A1 | 1/2020 | Cheng et al. |
| 2020/0091288 | A1 | 3/2020 | Lee et al. |
| 2020/0105759 | A1 | 4/2020 | Bowonder et al. |
| 2020/0119004 | A1 | 4/2020 | Ching et al. |
| 2020/0126987 | A1 | 4/2020 | Rubin et al. |
| 2020/0135848 | A1 | 4/2020 | Lim et al. |
| 2020/0135871 | A1 * | 4/2020 | Tsai ................. H01L 21/76856 |
| 2020/0294998 | A1 | 9/2020 | Lilak et al. |
| 2020/0303509 | A1 | 9/2020 | Mehandru et al. |
| 2021/0296439 | A1 | 9/2021 | Yang et al. |

FOREIGN PATENT DOCUMENTS

| | | | |
|---|---|---|---|
| CN | 109906513 | A | 6/2019 |
| KR | 20170045616 | A | 4/2017 |
| KR | 20190015269 | A | 2/2019 |
| KR | 20200049940 | A | 5/2020 |

* cited by examiner

SEMICONDUCTOR DEVICE AND METHOD OF FORMING THEREOF

PRIORITY CLAIM AND CROSS-REFERENCE

This application is a divisional of U.S. patent application Ser. No. 17/093,345, filed on Nov. 9, 2020, entitled "Semiconductor Device and Method of Forming Thereof," which claims the benefit of U.S. Provisional Application No. 63/044,112, filed on Jun. 25, 2020, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
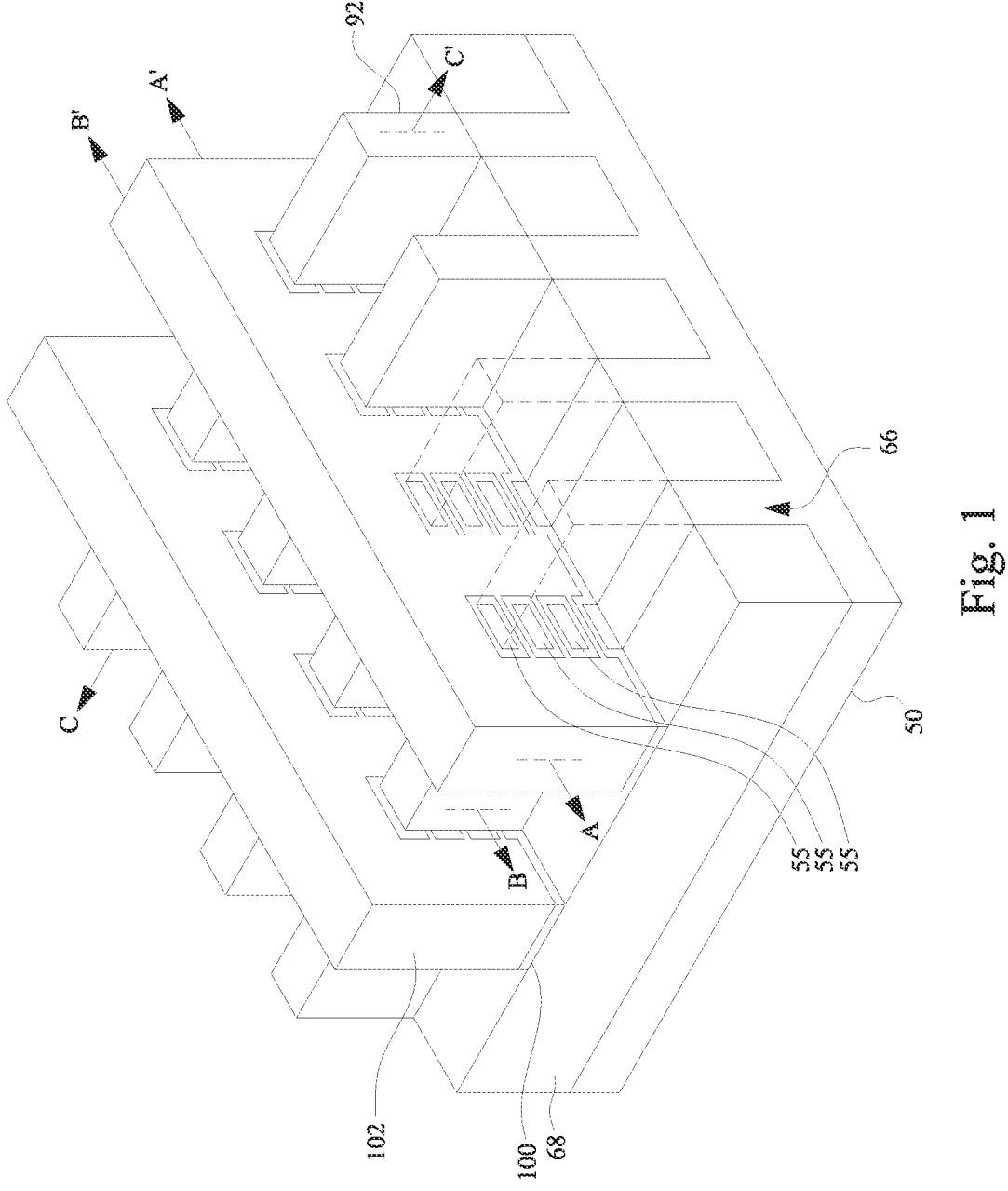
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for forming nano-FETs in semiconductor devices and semiconductor devices including the same. By forming backside vias prior to removing substrates, the size of the backside vias may be widened. Subsequent liner deposition and etching processes may be applied to the external surfaces of the already formed backside vias, so that the liner formation and subsequent etches do not reduce the width of the backside vias. The larger backside vias may be useful for silicide formation and a larger contact area to obtain better contact resistance and resulting in better device performance.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is in a YZ plane along a longitudinal axis of a gate electrode 102 and in a direction, for example, perpendicular to the direction of current flow between the epitaxial source/drain regions 92 of a nano-FET. Cross-section B-B' is in an YZ plane parallel to cross-section A-A' and extends through epitaxial source/drain regions 92 of multiple nano-FETs. Cross-section C-C' is in an XZ plane perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 34F are cross-sectional views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 32A, 33A, 34A, and 35A illustrate reference cross-section A-A' illustrated in FIG. 1. FIGS. 6B, 7B, 8B, 9B, 10B, 11B, 12B, 12D, 12F, 12G, 13B, 14B, 15B, 16B, 17B, 18B, 19B, 20B, 21B, 22B, 23B, 24B, 25B, 26B, 27B, 28B, 29B, 30B, 31B, 32B, 33B, 34B, 34E, 34F, 35B, 35D, and 35E illustrate reference cross-section B-B' illustrated in FIG. 1. FIGS. 7C, 8C, 9C, 10C, 11C, 11D, 12C, 12E, 13C, 14C, 15C, 16C, 17C, 18C, 19C, 20C, 21C, 22C, 23C, 24C, 25C, 26C, 27C, 28C, 29C, 30C, 31C, 32C, 33C, 34C, 34D, and 35C illustrate reference cross-section C-C' illustrated in FIG. 1.

Figure 2:
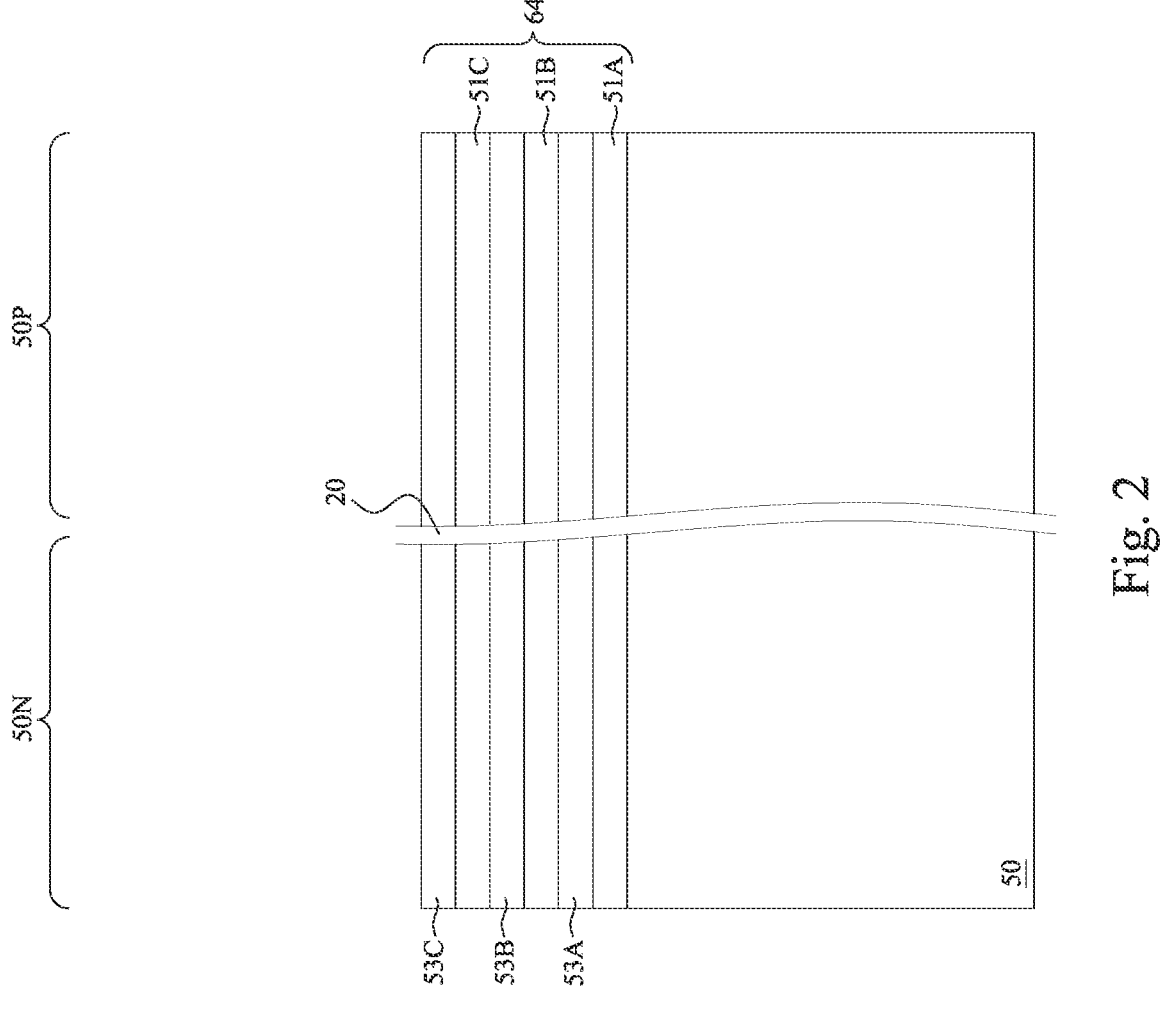
FIGS. 2, 3, 4, 5, 6A, 6B, 6C, 7A, 7B, 7C, 8A, 8B, 8C, 9A, 9B, 9C, 10A, 10B, 10C, 11A, 11B, 11C, 11D, 12A, 12B, 12C, 12D, 12E, 12F, 12G, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 32A, 32B, 32C, 33A, 33B, 33C, 34A, 34B, 34C, 34D, 34E, 34F, 35A, 35B, 35C, 35D, and 35E are cross-sectional views of intermediate stages in the manufacturing of nano-FETs, in accordance with some embodiments.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the substrate 50. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
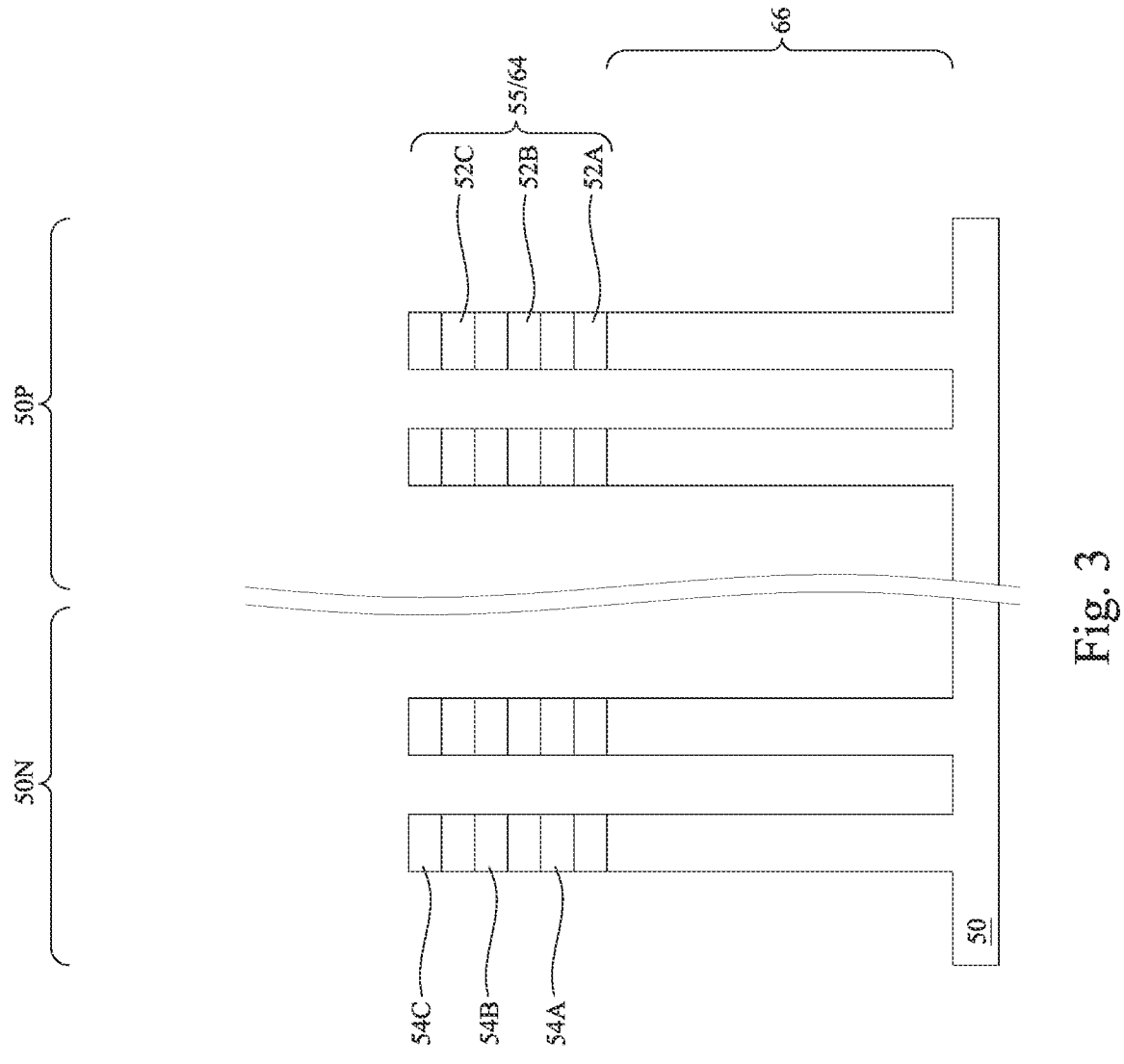

Referring now to FIG. 3, fins 66 are formed in the substrate 50 and nanostructures 55 are formed in the multi-layer stack 64, in accordance with some embodiments. In some embodiments, the nanostructures 55 and the fins 66 may be formed in the multi-layer stack 64 and the substrate 50, respectively, by etching trenches in the multi-layer stack 64 and the substrate 50. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a mask is formed over a substrate and patterned using a photolithography process. Spacers are formed alongside the patterned mask using a self-aligned process. The mask is then removed, and the remaining spacers may then be used to pattern the fins 66.

FIG. 3 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 4:
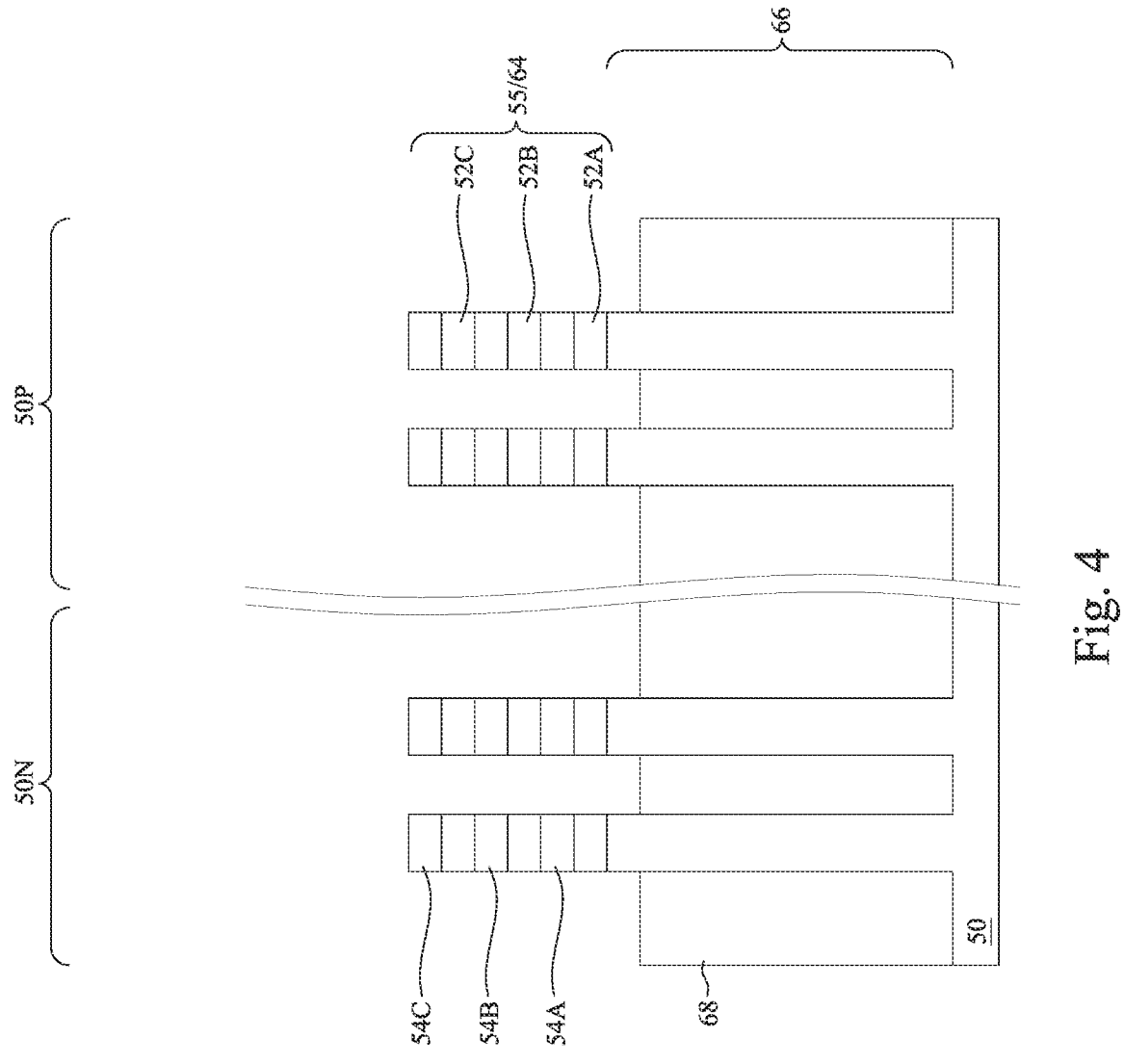

In FIG. 4, shallow trench isolation (STI) regions 68 are formed adjacent the fins 66. The STI regions 68 may be formed by depositing an insulation material over the substrate 50, the fins 66, and nanostructures 55, and between adjacent fins 66. The insulation material may be a dielectric material such as an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the substrate 50, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
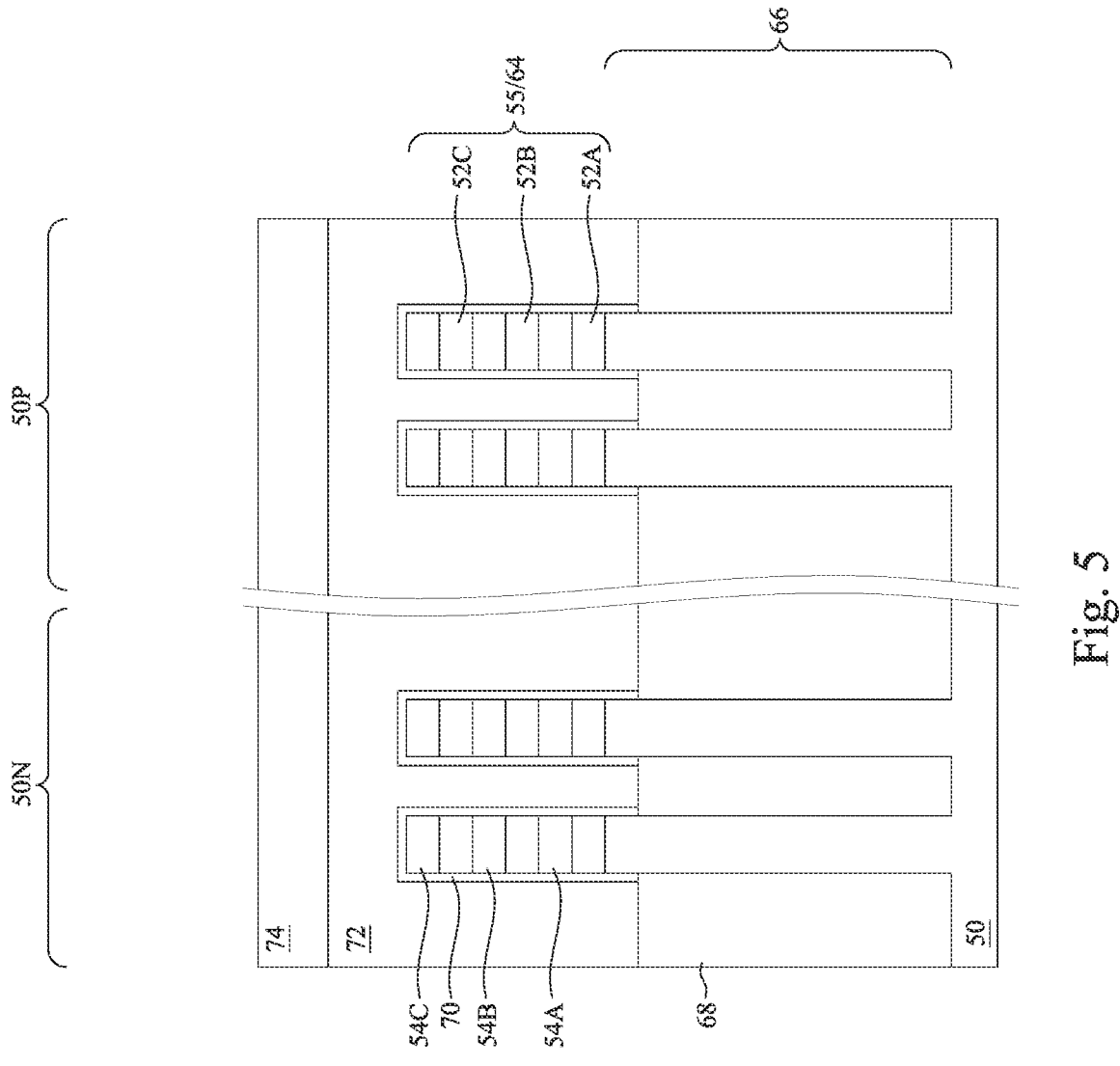

In FIG. 5, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 6B:
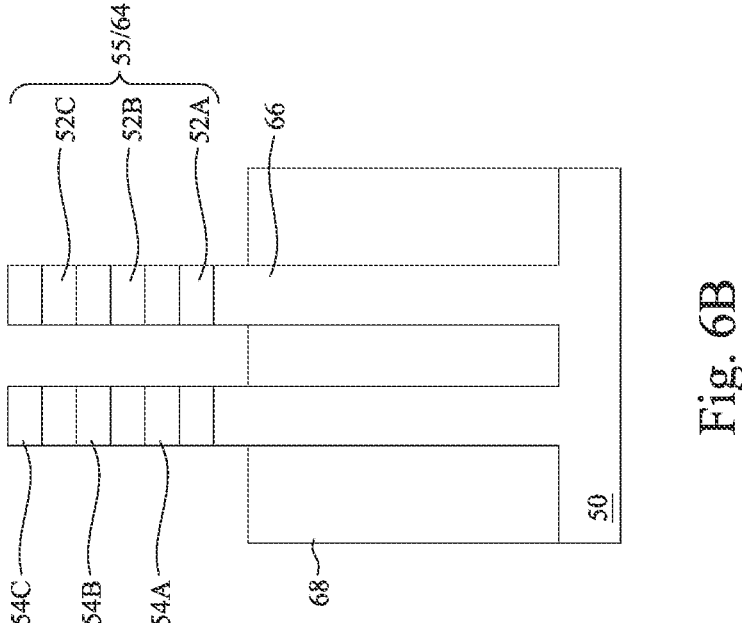
Figure 6A:
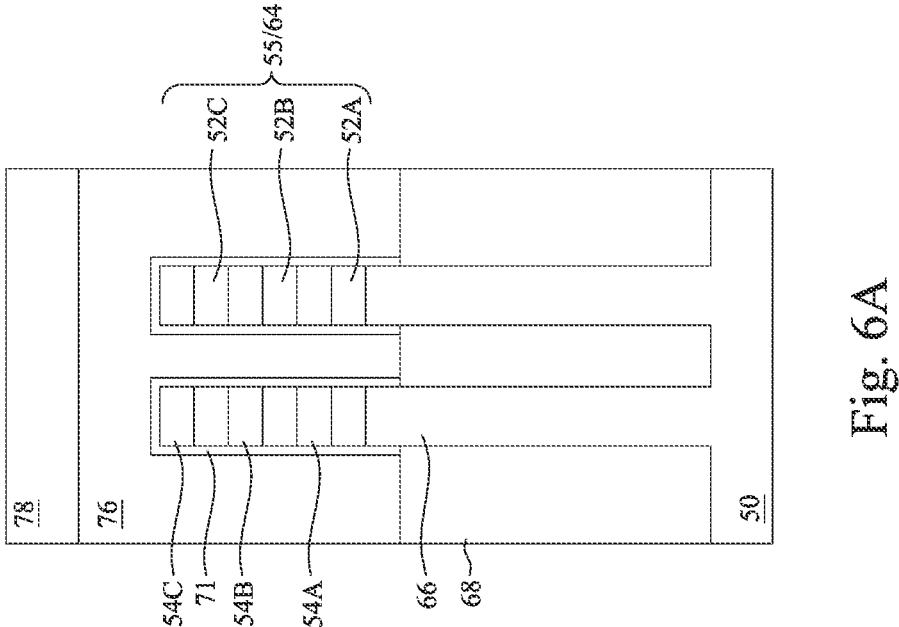
Figure 6C:
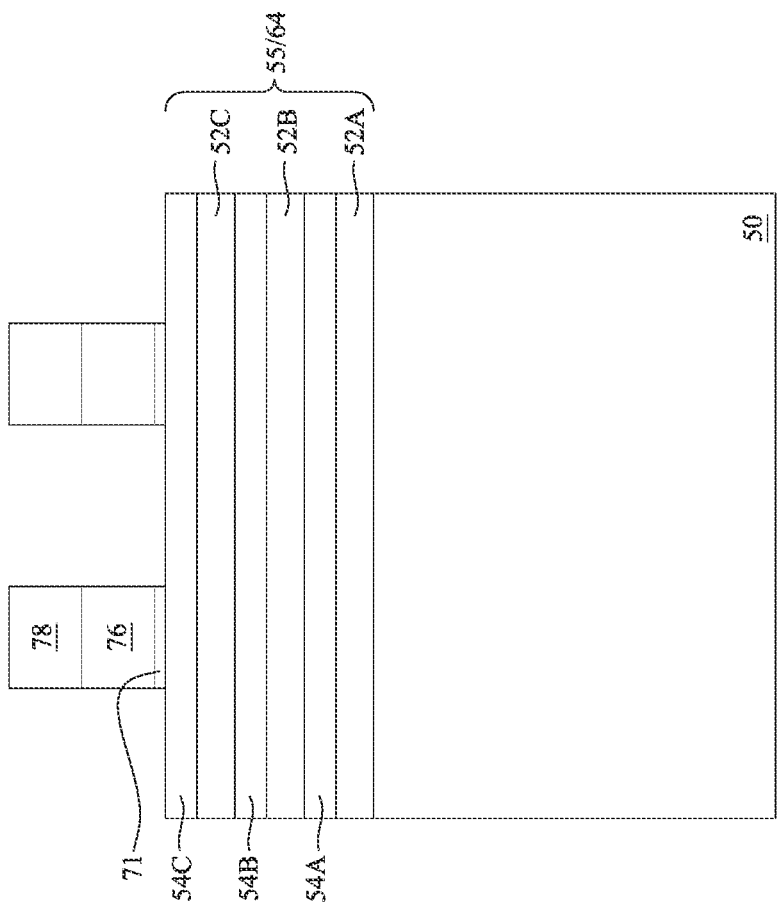

FIGS. 6A through 18C illustrate various additional steps in the manufacturing of embodiment devices. FIGS. 6A through 18C illustrate features in either the n-type region 50N or the p-type region 50P. In FIGS. 6A through 6C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 7B:
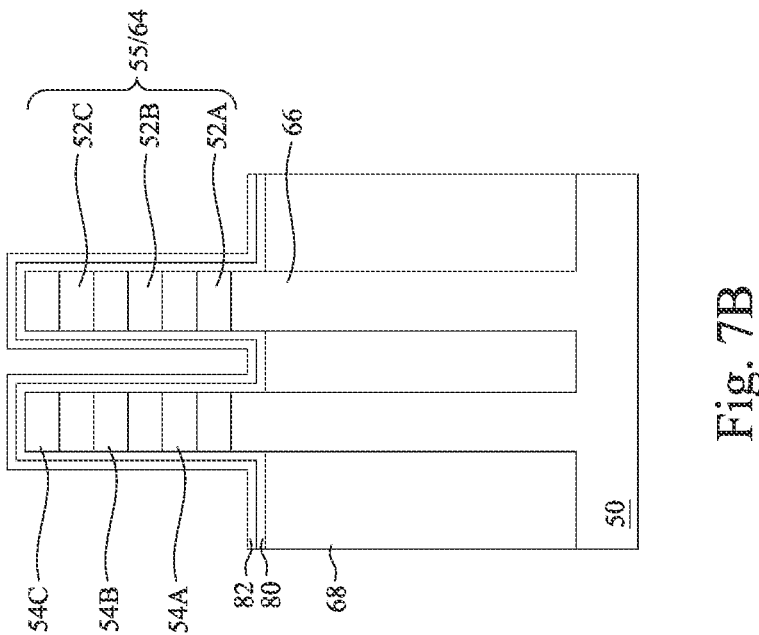
Figure 7A:
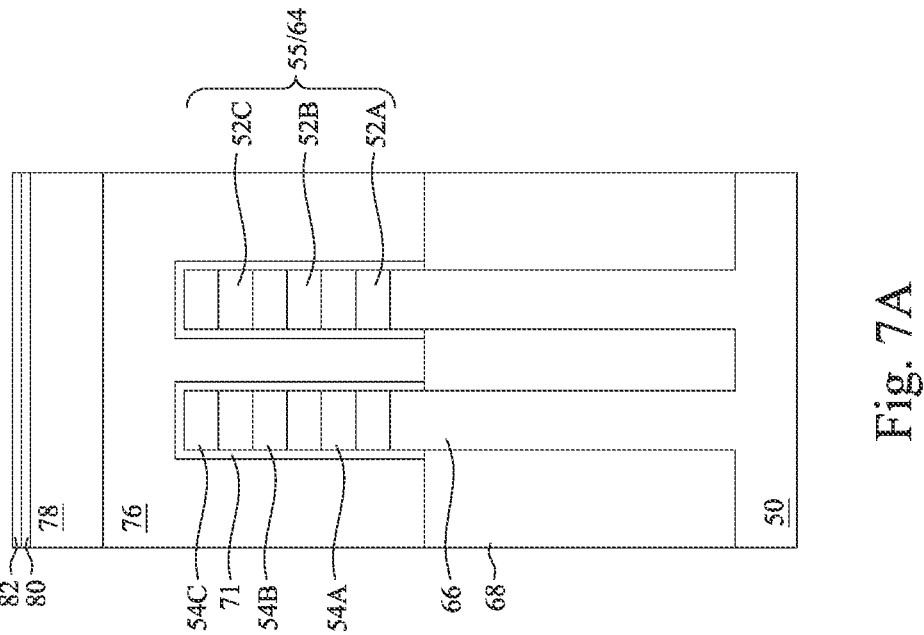
Figure 7C:
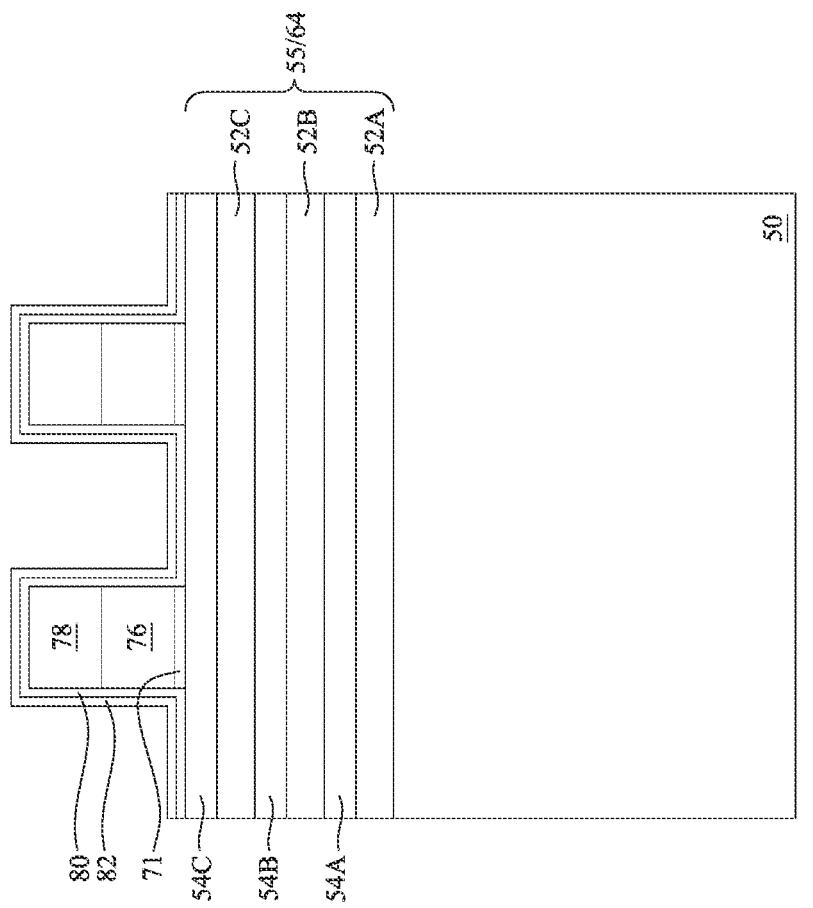

In FIGS. 7A through 7C, a first spacer layer 80 and a second spacer layer 82 are formed over the structures illustrated in FIGS. 6A through 6C. The first spacer layer 80 and the second spacer layer 82 will be subsequently patterned to act as spacers for forming self-aligned source/drain regions. In FIGS. 7A through 7C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
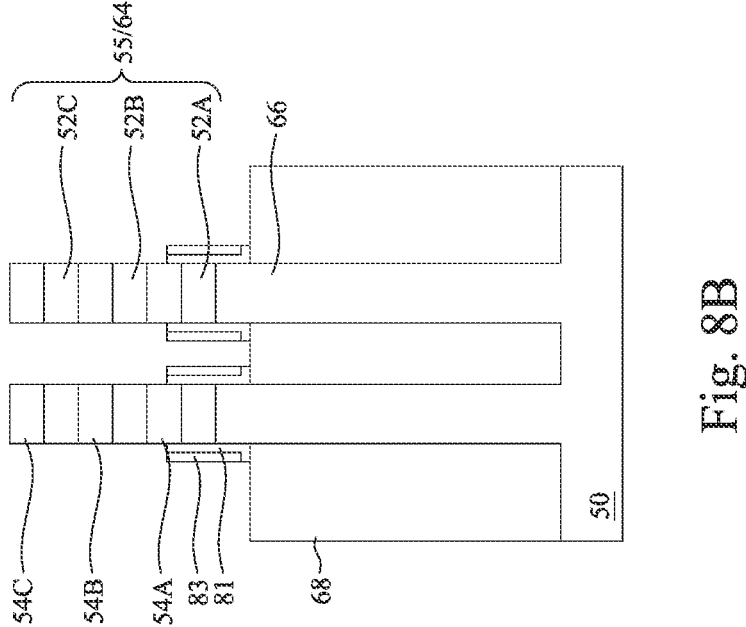
Figure 8A:
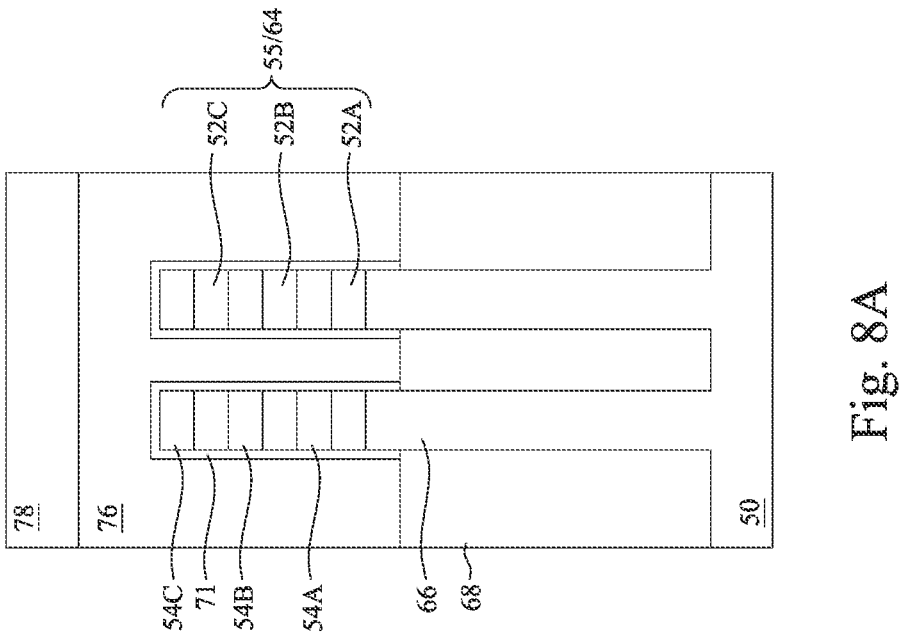
Figure 8C:
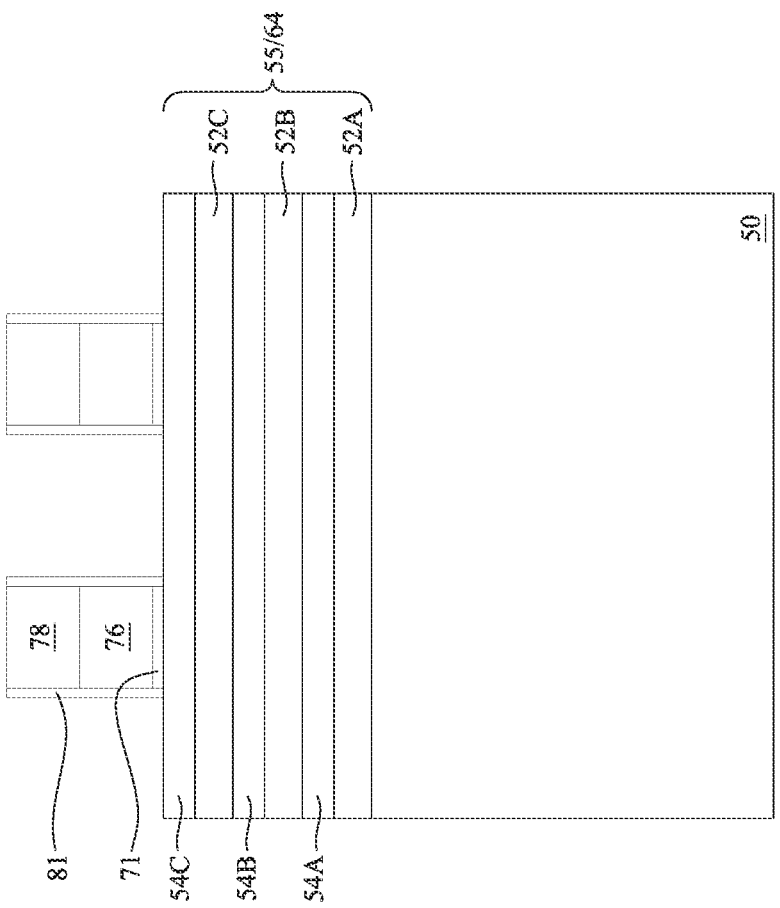

In FIGS. 8A through 8C, the first spacer layer 80 and the second spacer layer 82 are etched to form first spacers 81 and second spacers 83. As will be discussed in greater detail below, the first spacers 81 and the second spacers 83 act to self-aligned subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 8B. Thereafter, the second spacers 83 acts as a mask while etching exposed portions of the first spacer layer 80, thereby forming first spacers 81 as illustrated in FIGS. 8B and 8C.

As illustrated in FIG. 8B, the first spacers 81 and the second spacers 83 are disposed on sidewalls of the fins 66 and/or nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
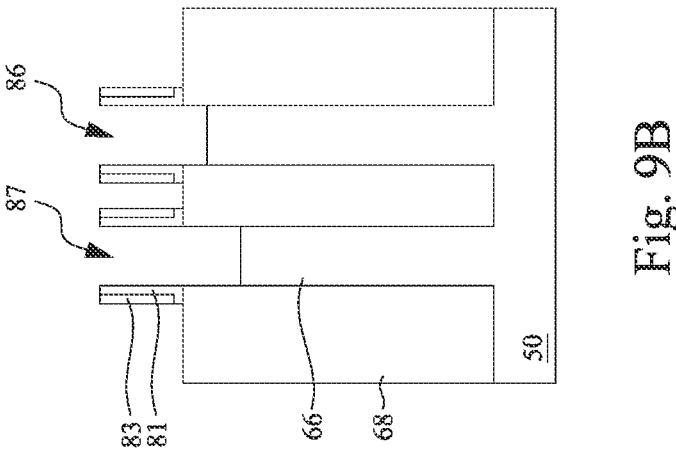
Figure 9A:
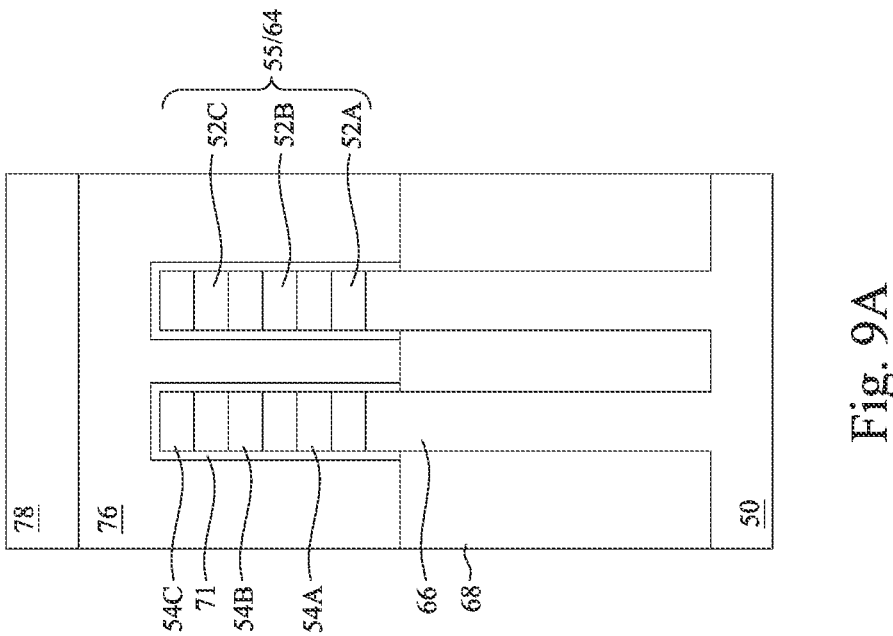
Figure 9C:
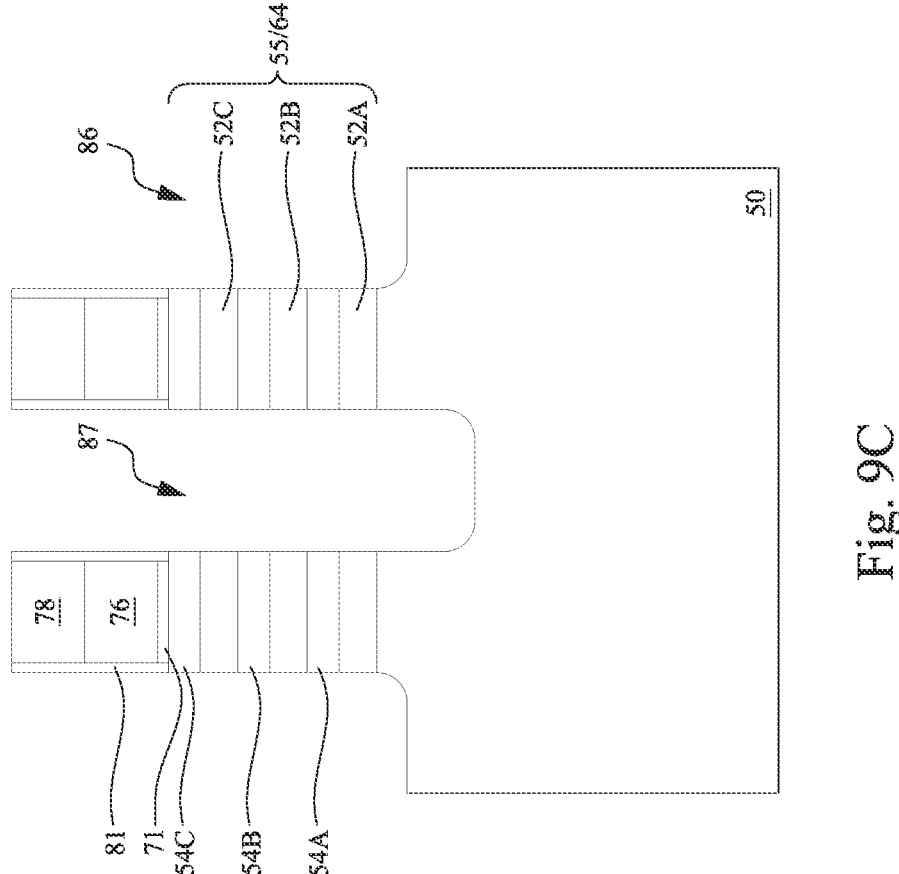

In FIGS. 9A through 9C, first recesses 86 and second recesses 87 are formed in the fins 66, the nanostructures 55, and the substrate 50, in accordance with some embodiments. Epitaxial source/drain regions will be subsequently formed in the first recesses 86 and in the second recesses 87. The first recesses 86 and the second recesses 87 may extend through the first nanostructures 52 and the second nanostructures 54, and into the substrate 50. As illustrated in FIG. 9B, the fins 66 may be etched such that bottom surfaces of the first recesses 86 are disposed below the top surfaces of the STI regions 68. In other embodiments, top surfaces of the STI regions 68 may be level with or higher than bottom surfaces of the first recesses 86. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the substrate 50 using anisotropic etching processes, such as RIE, NBE, or the like. The first spacers 81, the second spacers 83, and the masks 78 mask portions of the fins 66, the nanostructures 55, and the substrate 50 during the etching processes used to form the first recesses 86 and the second recesses 87. A single etch process or multiple etch processes may be used to etch each layer of the nanostructures 55 and/or the fins 66. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 10B:
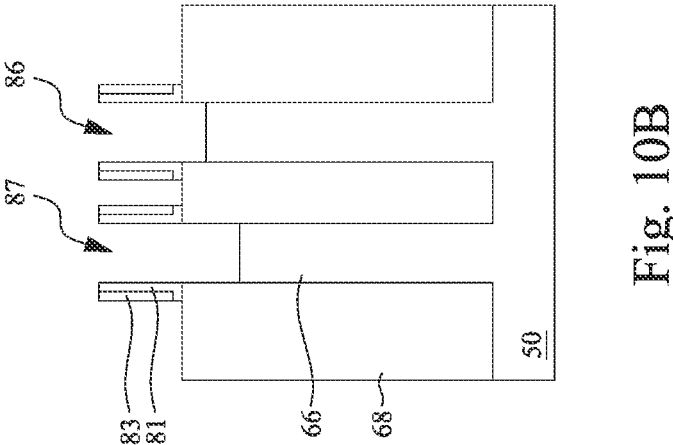
Figure 10A:
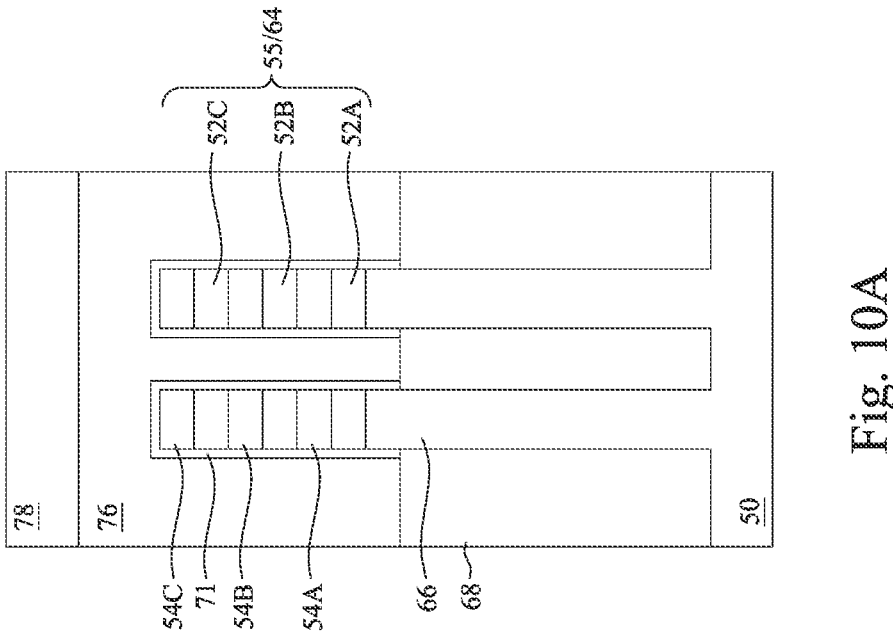
Figure 10C:
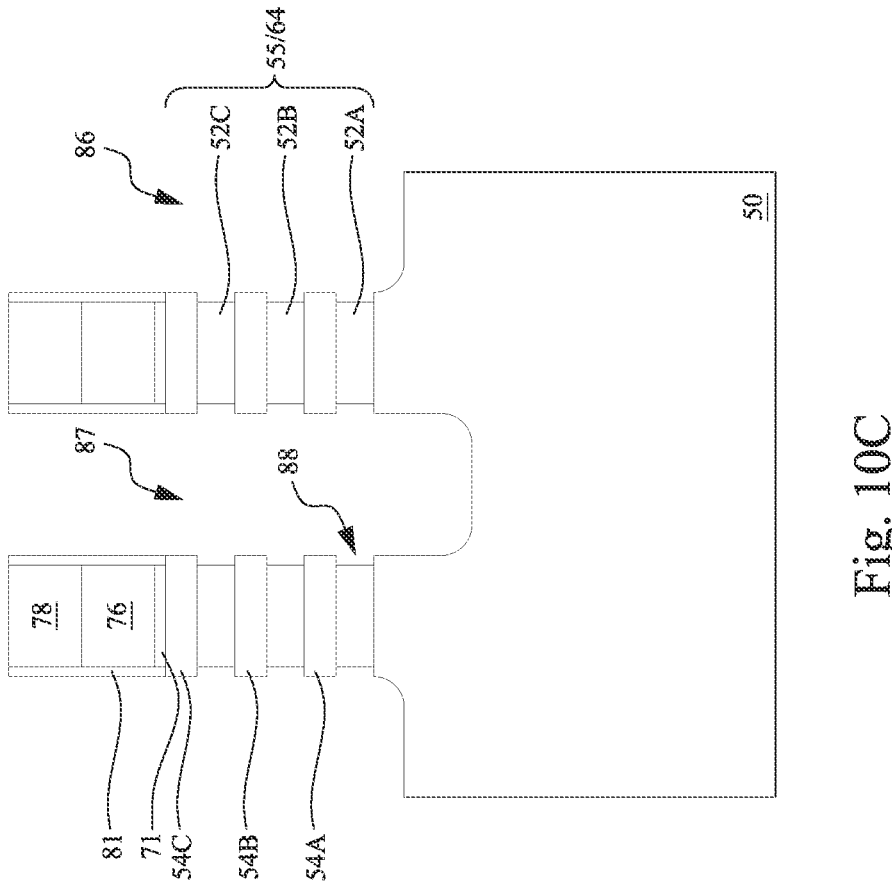

In FIGS. 10A through 10C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide ($NH_4OH$), or the like may be used to etch sidewalls of the first nanostructures 52.

In FIGS. 11A through 11D, inner spacers 90 are formed in the sidewall recess 88. The inner spacers 90 may be formed by depositing an inner spacer layer (not separately illustrated) over the structures illustrated in FIGS. 10A through 10C. The inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride (SiN) or silicon oxynitride ($SiO_xN_y$), although any suitable material, such as low-dielectric constant (low-k) materials having a k-value less than about 3.5, may be utilized. For example, the inner spacer layer may comprise SiN, $SiO_xN_y$, SiOCN, ZrN, TaCN, SiCN, SiO, SiOC, AlO, AlON, ZrO, HfO, TiO, ZrAlO, ZnO, TaO, LaO, YO, the like, or a combination thereof. The inner spacer layer may then be anisotropically etched to form the inner spacers 90. Although outer sidewalls of the inner spacers 90 are illustrated as being flush with sidewalls of the second nanostructures 54, the outer sidewalls of the inner spacers 90 may extend beyond or be recessed from sidewalls of the second nanostructures 54. In some embodiments, the inner spacers 90 have widths in a range of about 1 nm to about 10 nm, which may be advantageous for insulating subsequently formed source/drain regions and/or subsequently formed backside vias (see below, FIGS. 29A-29C) from the subsequently formed gate structure. Inner spacers 90 with a thickness less than about 1 nm may be disadvantageous as they may allow shorts between the subsequently gate structure and the source/drain regions and/or the backside vias. Inner spacers 90 with a thickness greater than about 10 nm may be disadvantageous because they may decrease the widths of the gate structure and/or the source/drain regions, decreasing device performance.

Figure 11B:
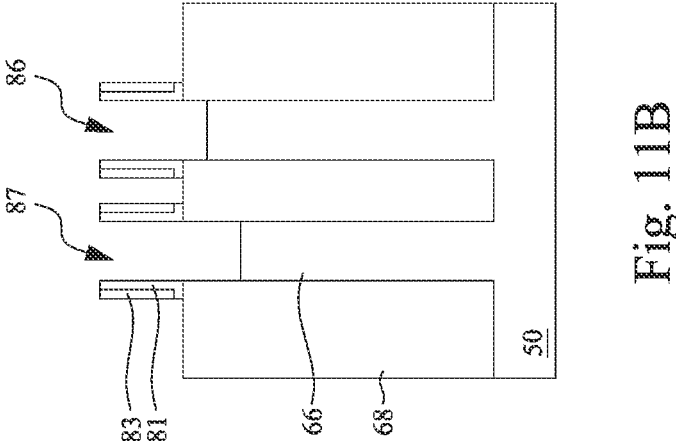
Figure 11A:
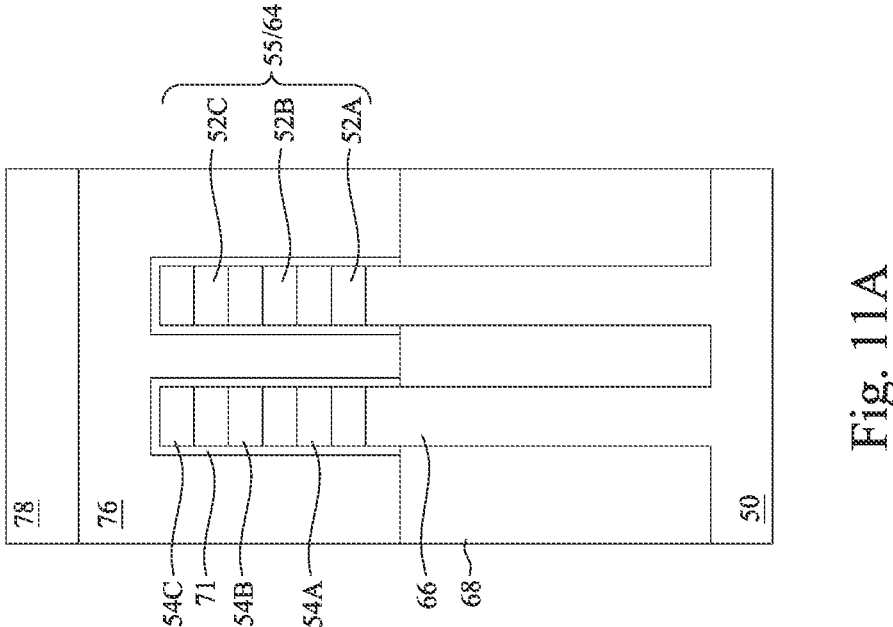
Figure 11C:
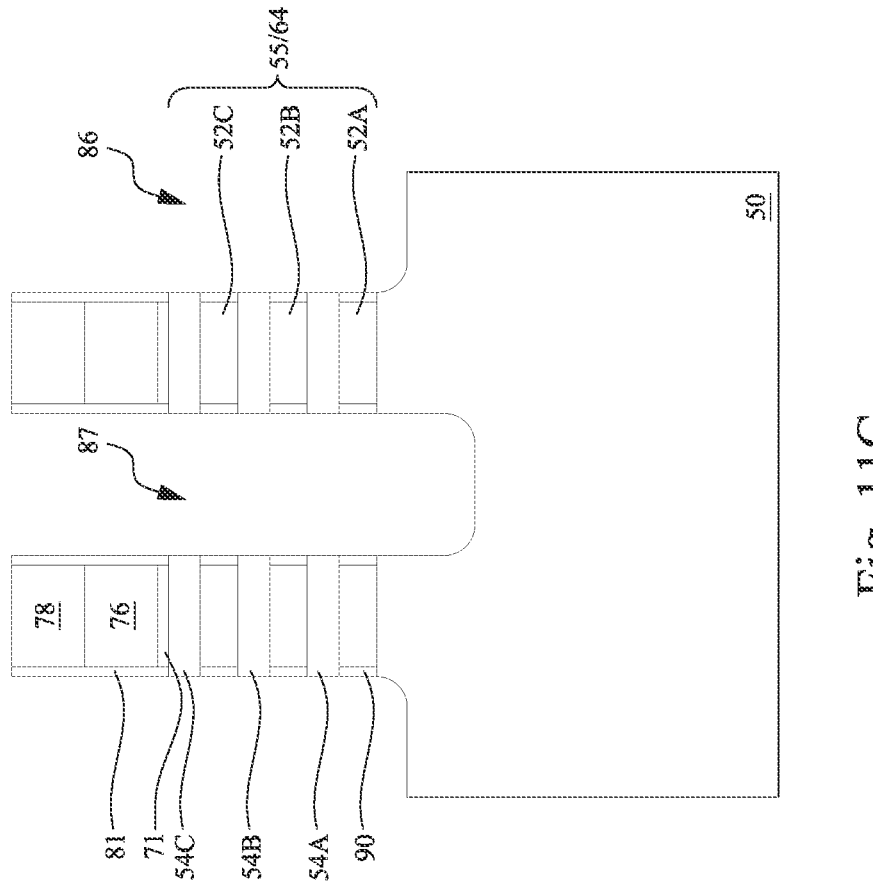
Figure 11D:
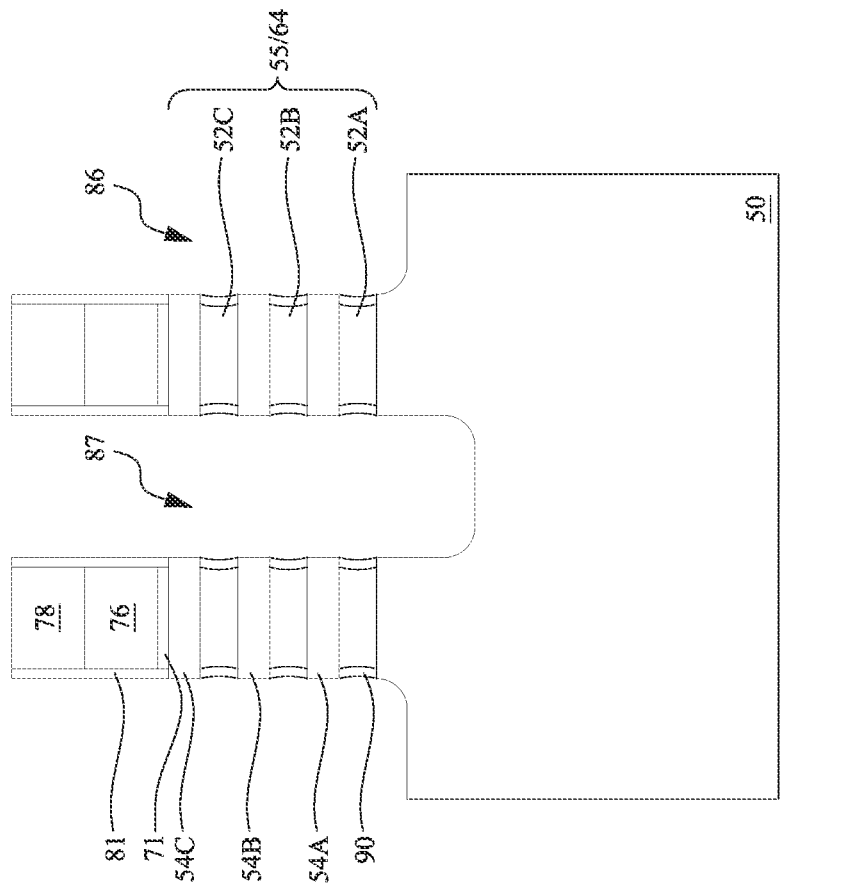

Moreover, although the outer sidewalls of the inner spacers 90 are illustrated as being straight in FIG. 11C, the outer sidewalls of the inner spacers 90 may be concave or convex. As an example, FIG. 11D illustrates an embodiment in which sidewalls of the first nanostructures 52 are concave, outer sidewalls of the inner spacers 90 are concave, and the inner spacers 90 are recessed from sidewalls of the second nanostructures 54. The inner spacer layer may be etched by an anisotropic etching process, such as RIE, NBE, or the like. The inner spacers 90 may be used to prevent damage to subsequently formed source/drain regions (such as the epitaxial source/drain regions 92, discussed below with respect to FIGS. 12A through 12E) by subsequent etching processes, such as etching processes used to form gate structures.

Figure 12B:
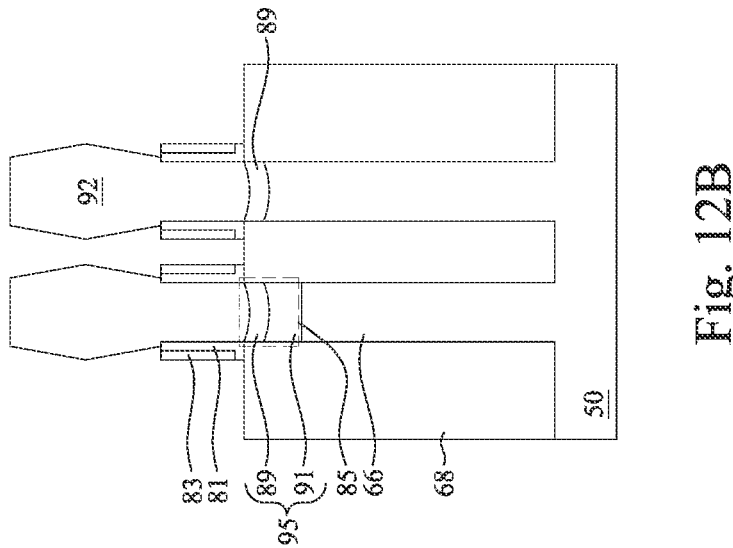
Figure 12A:
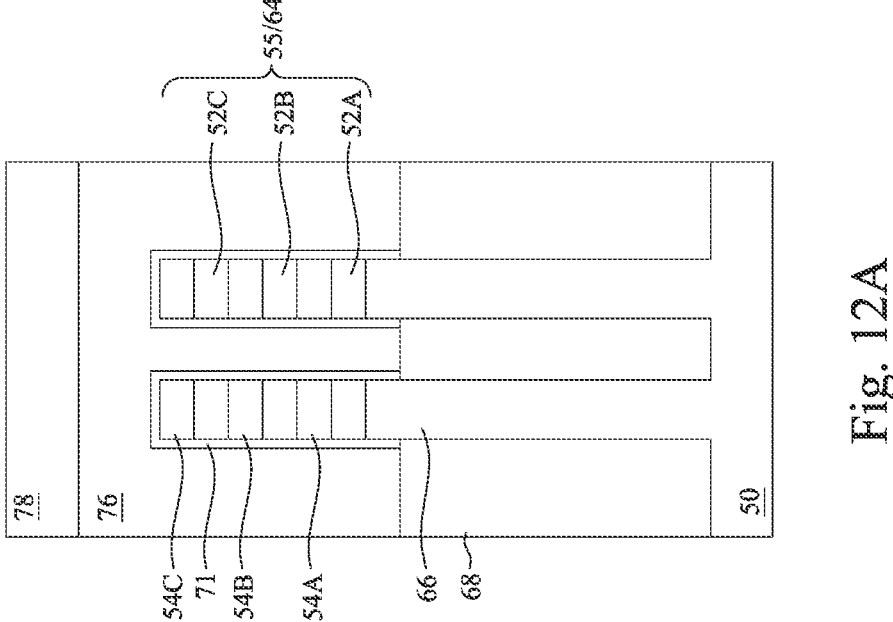
Figure 12C:
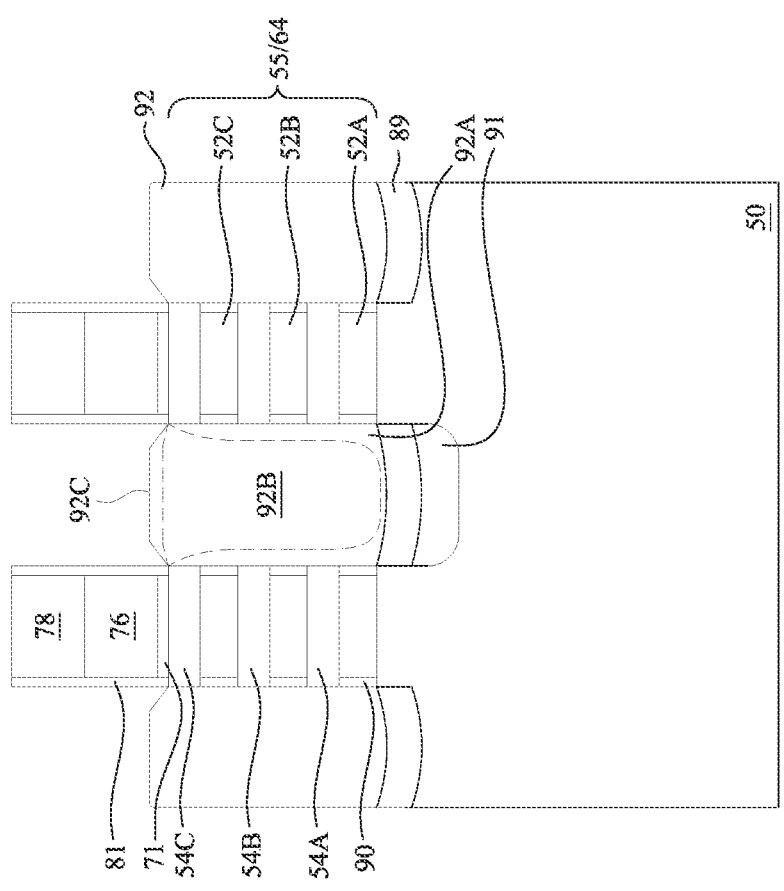
Figure 12D:
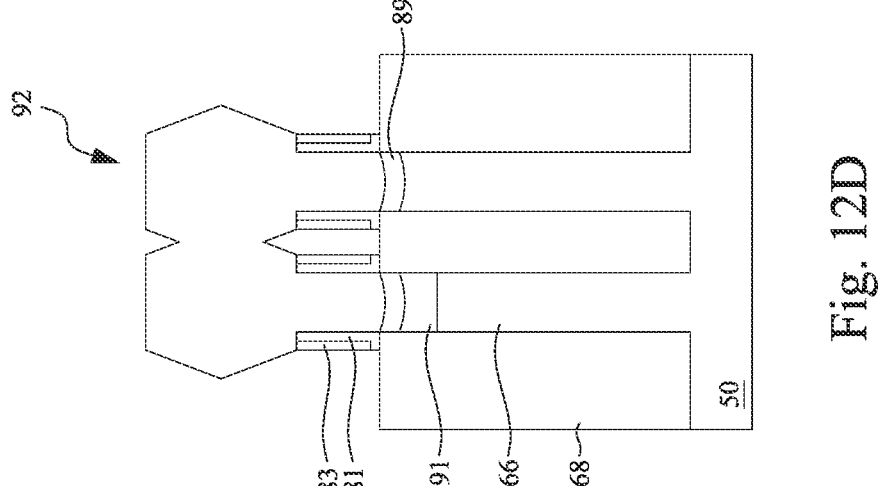

In FIGS. 12A through 12D, first epitaxial materials 91 are formed in the second recesses 87, second epitaxial materials 89 are formed in the first recesses 86 and are formed over the first epitaxial materials 91 in the second recesses 87, and epitaxial source/drain regions 92 are formed in the first recesses 86 and the second recesses 87 over the second epitaxial materials 89. The first epitaxial materials 91 and second epitaxial materials 89 formed in the second recesses 87 may also be referred to as dummy semiconductor regions 95. In some embodiments, the dummy semiconductor regions 95 (e.g., comprising the first and second epitaxial materials 89 and 91) may be sacrificial materials, which are subsequently removed to form backside vias (such as the backside vias 130, discussed below with respect to FIGS. 30A through 30C). As illustrated in FIGS. 12B through 12D, top surfaces of the first epitaxial materials 91 may be level with bottom surfaces of the first recesses 86. However, in some embodiments, top surfaces of the first epitaxial materials 91 may be disposed below or above bottom surfaces of the first recesses 86.

The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the substrate 50, and dielectric layers (such as the STI regions 68). As such, the first epitaxial materials 91 may be removed and replaced with the backside vias without significantly removing the epitaxial source/drain regions 92 and the dielectric layers. In some embodiments, the first recesses 86 may be masked while the first epitaxial materials 91 are grown in the second recesses 87 so that the first epitaxial materials 91 are not formed in the first recesses 86. This may be useful for subsequently filling the first recesses with second epitaxial materials 89 (see below), which may be different from the first epitaxial materials 91. After the first epitaxial materials 91 are formed, the masks in the first recesses 87 may be then be removed.

The second epitaxial materials 89 are then formed in the first recesses 86 and in the second recesses 87 over the first epitaxial materials 91. As illustrated in FIGS. 12B through 12C, top surfaces of the second epitaxial materials 89 may be level with top surfaces of the STI regions 68. However, in some embodiments, top surfaces of the second epitaxial materials 89 may be disposed below or above top surfaces of the STI regions 68. The second epitaxial materials 89 may be epitaxially grown in the first recesses 86 and in the second recesses 87 using a process such as chemical vapor deposition (CVD), atomic layer deposition (ALD), vapor phase epitaxy (VPE), molecular beam epitaxy (MBE), or the like. The second epitaxial materials 89 may include any acceptable material, such as silicon germanium or the like. In some embodiments, the second epitaxial materials 89 may be substantially the same material as the first epitaxial materials 91. In other embodiments, the second epitaxial materials 89 may be different than the first epitaxial materials 91. For example, the second epitaxial materials 89 and the first epitaxial materials 91 may each comprise silicon germanium; however, a germanium concentration of the second epitaxial materials 89 may be different than a germanium concentration of the first epitaxial materials 91. The first epitaxial materials 91 being different from the second epitaxial materials 89 may be useful for acting as dummy material for the subsequent formation of fifth recesses 128 (see below, FIGS. 24A-C). The second epitaxial materials 89 may be formed of materials having high etch selectivity to materials of the epitaxial source/drain regions 92, the substrate 50, and dielectric layers (such as the STI regions 68). As such, second epitaxial materials 89 may be removed and replaced with the backside vias without significantly removing the epitaxial source/drain regions 92 and the dielectric layers.

The epitaxial source/drain regions 92 are then formed over the second epitaxial materials 89 in the first recesses 86 and in the second recesses 87. In some embodiments, the epitaxial source/drain regions 92 may exert stress on the second nanostructures 54, thereby improving performance. As illustrated in FIG. 12C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 64 and may have facets.

The epitaxial source/drain regions 92, the first nanostructures 52, the second nanostructures 54, and/or the substrate 50 may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, adjacent epitaxial source/drain regions 92 remain separated after the epitaxy process is completed as illustrated by FIG. 12B. In other embodiments, these facets cause adjacent epitaxial source/drain regions 92 of a same nano-FET to merge as illustrated by FIG. 12D. In the embodiments illustrated in FIGS. 12B and 12D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 68.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 12E:
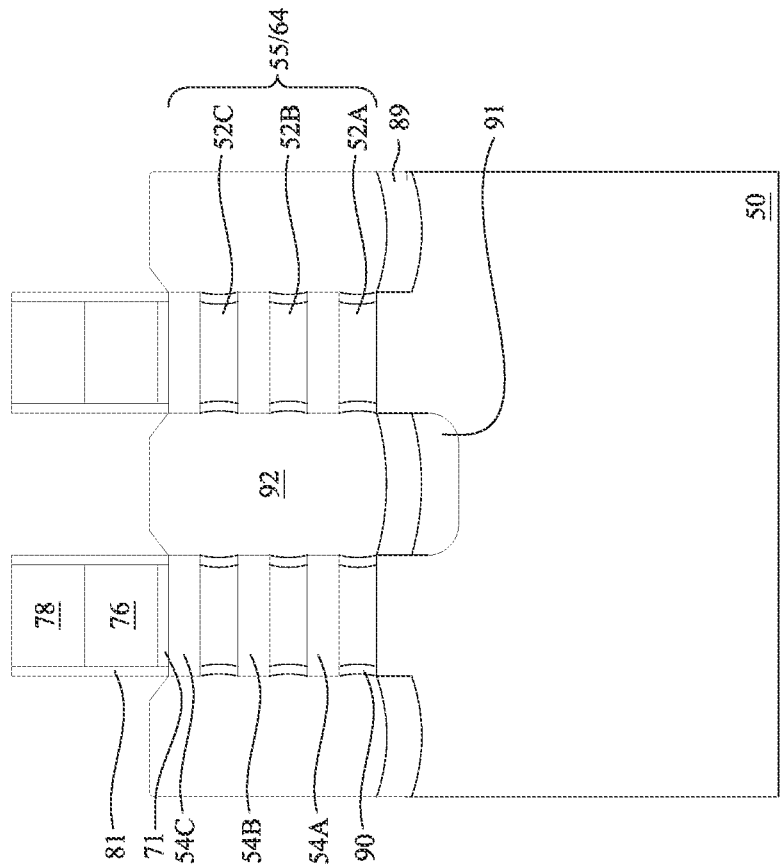

FIG. 12E illustrates an embodiment in which sidewalls of the first nanostructures 52 are concave, outer sidewalls of the inner spacers 90 are concave, and the inner spacers 90 are recessed from sidewalls of the second nanostructures 54. As illustrated in FIG. 12E, the epitaxial source/drain regions 92 may be formed in contact with the inner spacers 90 and may extend past sidewalls of the second nanostructures 54.

Figure 12G:
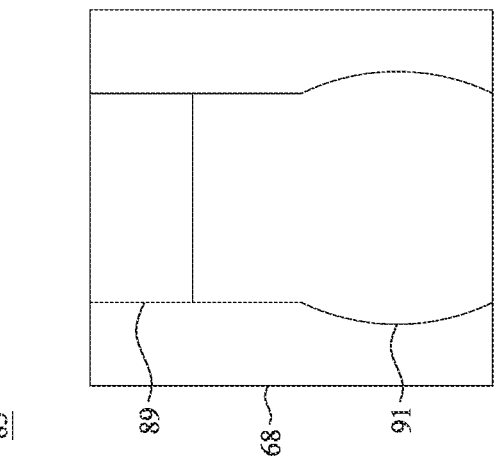
Figure 12F:
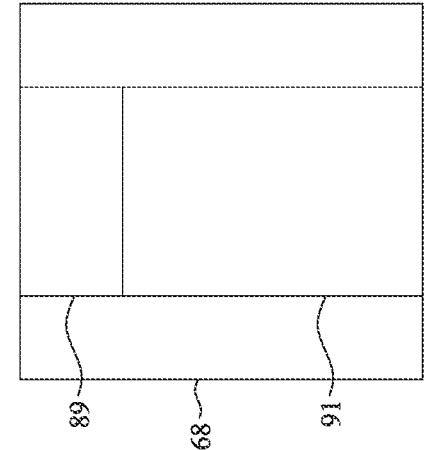

FIGS. 12F and 12G illustrate detailed views of region 85 as shown in FIG. 12B. In some embodiments in accordance with FIGS. 12B and 12F, the widths of the first epitaxial materials 91 and the second epitaxial materials 89 are substantially the same and the first epitaxial materials 91 have substantially straight sidewalls. In other embodiments in accordance with FIG. 12G, the first epitaxial materials 91 have rounded sidewalls. The first epitaxial materials 91 may have a maximum width measured between opposite rounded sidewalls that is greater than a width measured between opposite sidewalls of the second epitaxial materials 89. The rounded sidewalls of the first epitaxial materials 91 may result from e.g. over-etching of the second recesses 87 into the material of the STI regions 68. Subsequent figures are illustrated and discussed based on the embodiments of FIG. 12F for ease of illustration, but it should be understood that subsequent processing may also be applied to the embodiments of FIG. 12G.

Figure 13B:
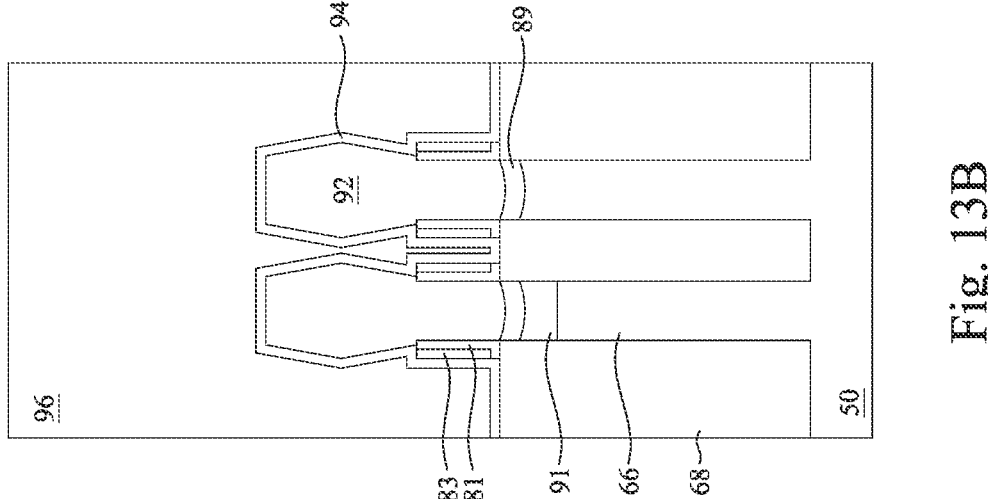
Figure 13A:
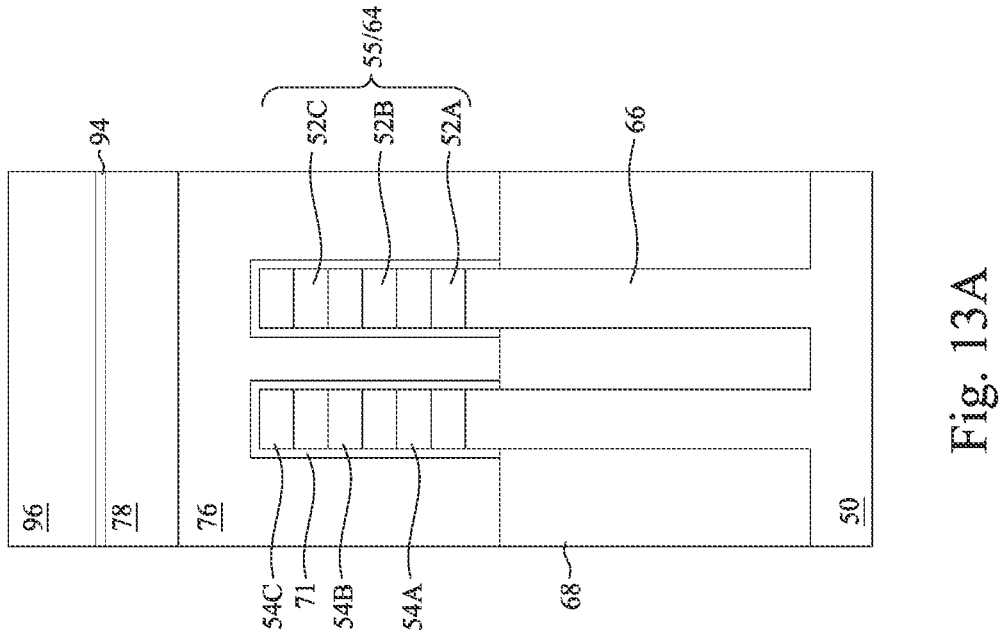
Figure 13C:
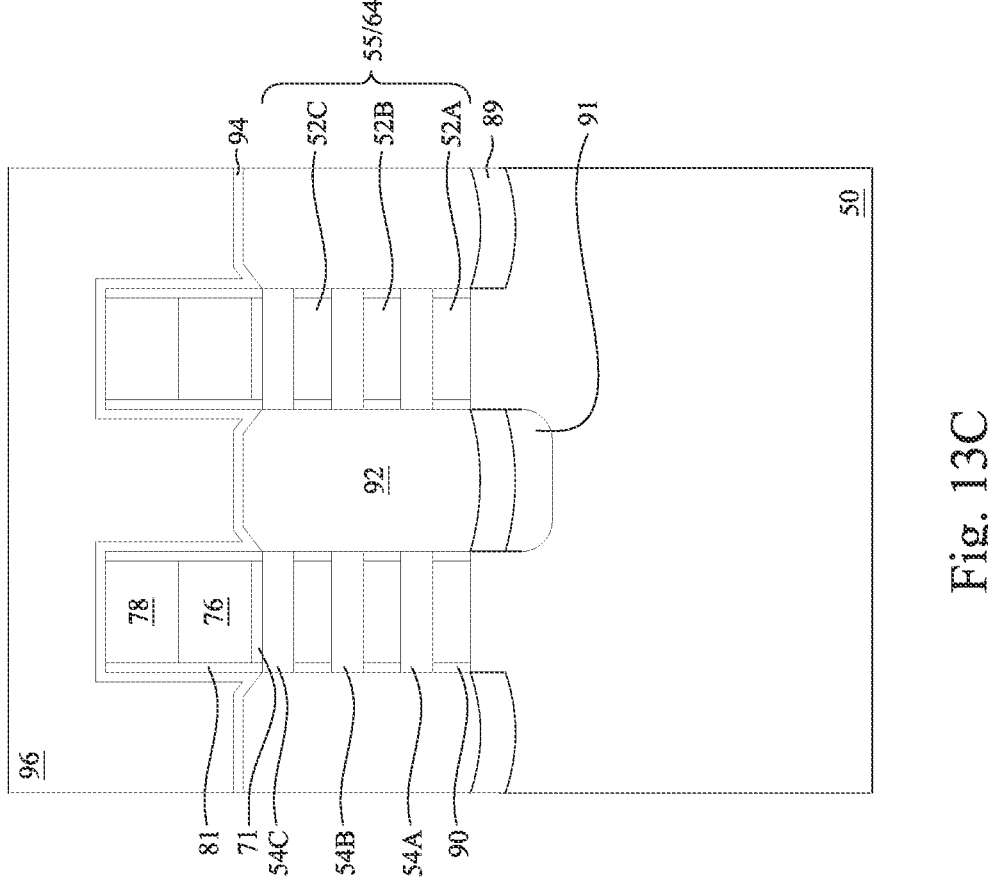

In FIGS. 13A through 13C, a first interlayer dielectric (ILD) 96 is deposited over the structure illustrated in FIGS. 12A through 12C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 14B:
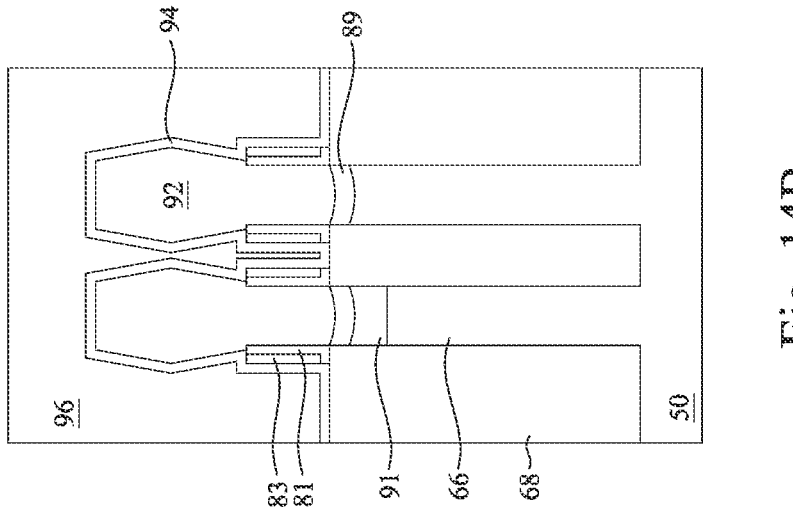
Figure 14A:
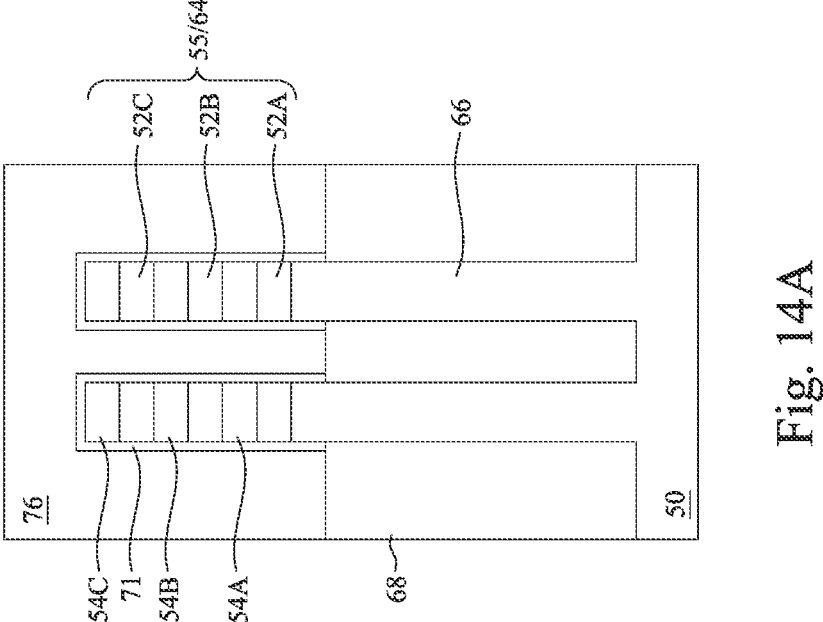
Figure 14C:
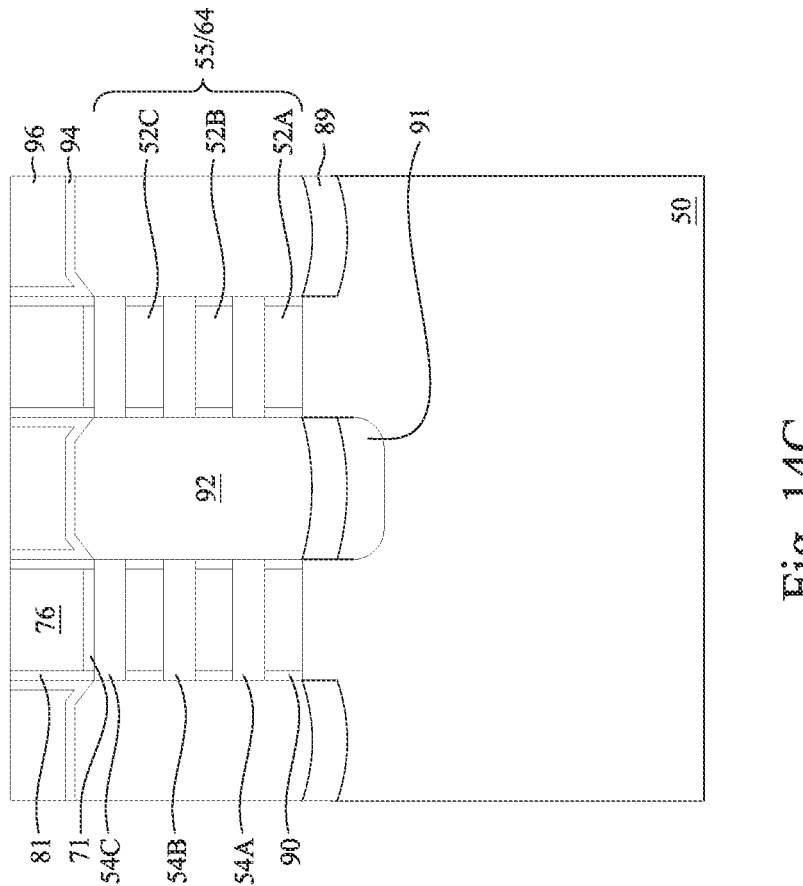

In FIGS. 14A through 14C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 15B:
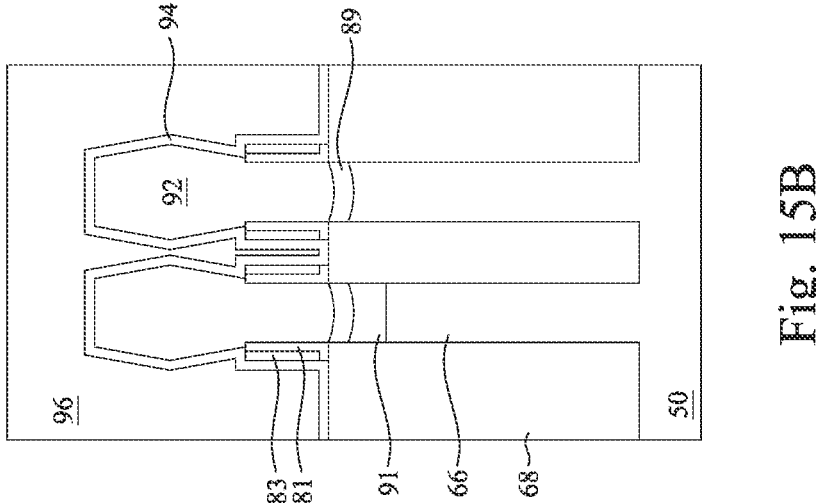
Figure 15A:
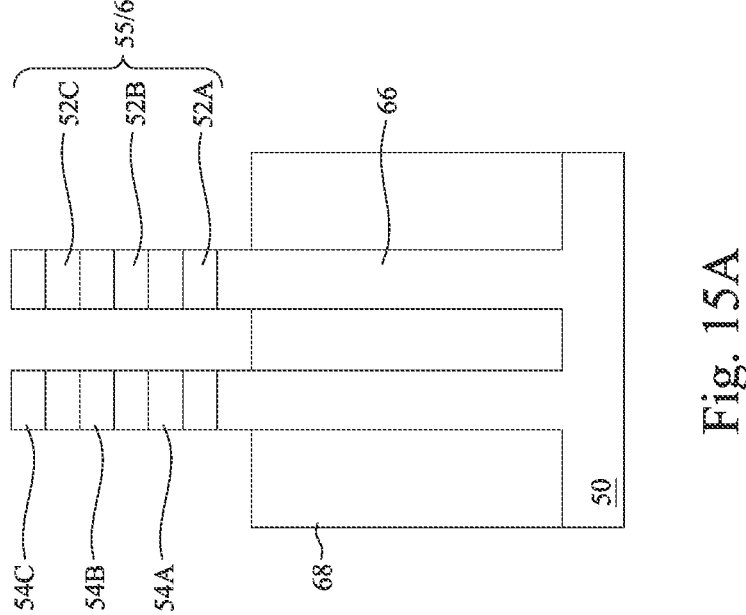
Figure 15C:
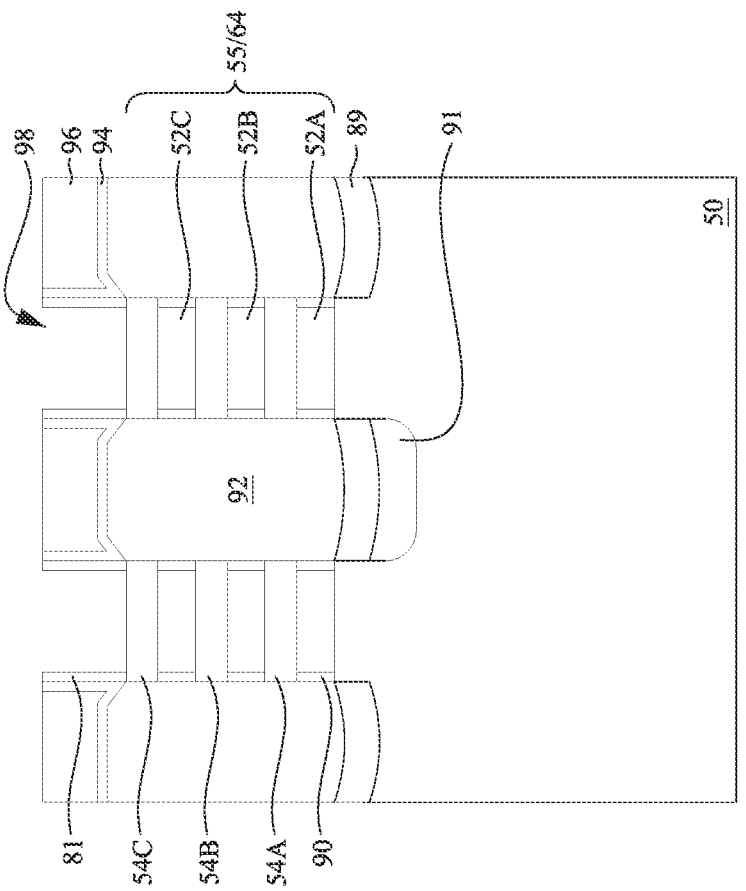

In FIGS. 15A through 15C, the dummy gates 76, and the masks 78 if present, are removed in one or more etching steps, so that third recesses 98 are formed. Portions of the dummy gate dielectrics 71 in the third recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 16B:
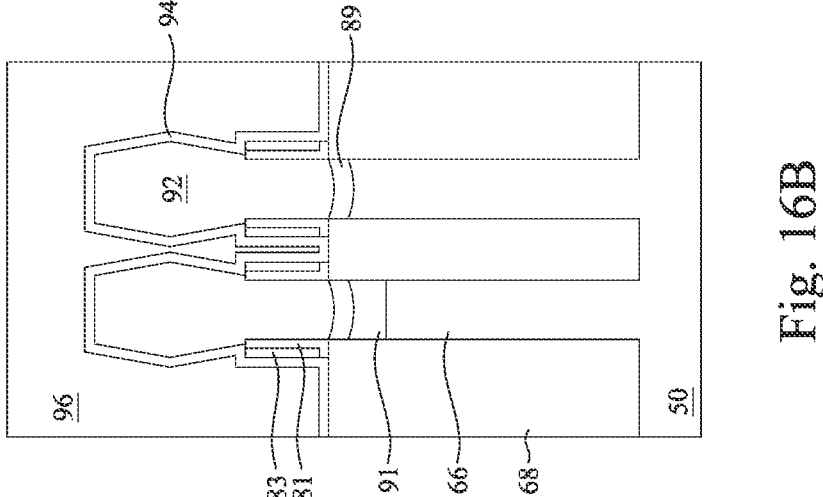
Figure 16A:
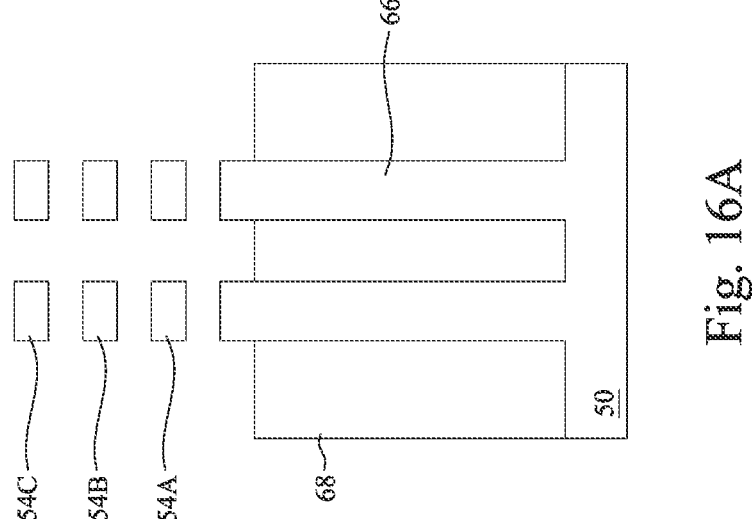
Figure 16C:
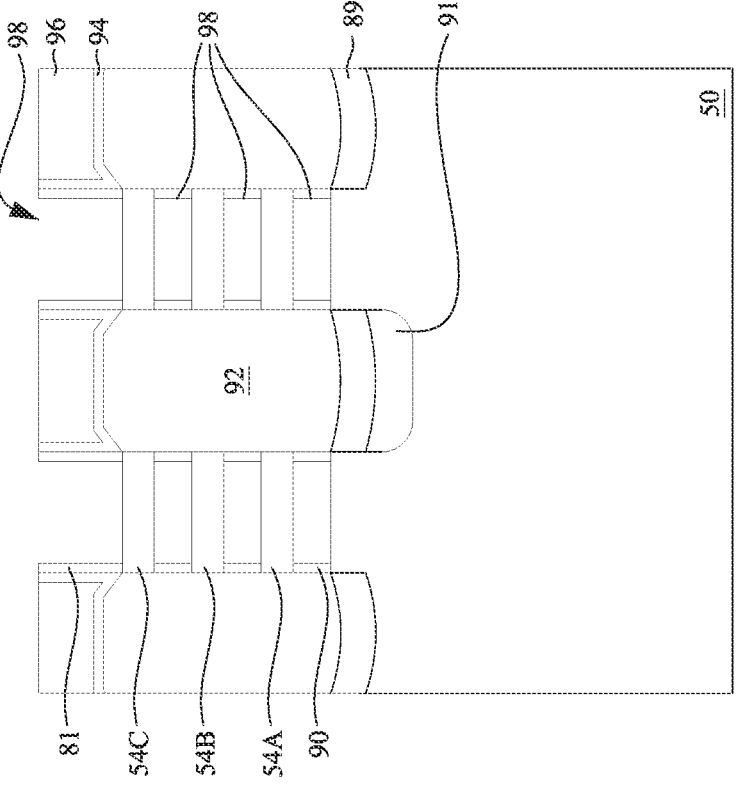

In FIGS. 16A through 16C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the substrate 50, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 17B:
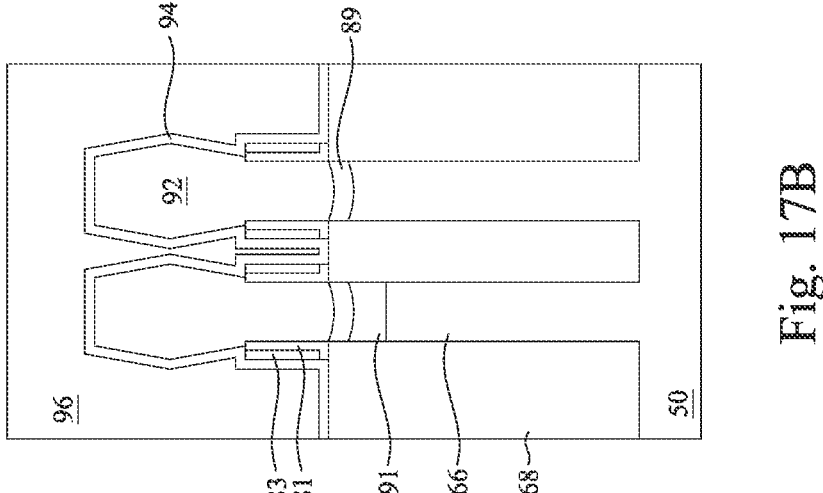
Figure 17A:
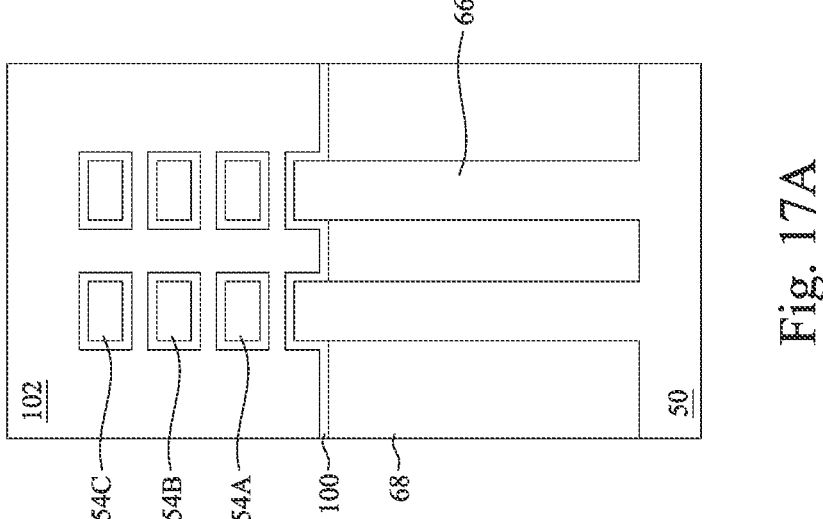
Figure 17C:
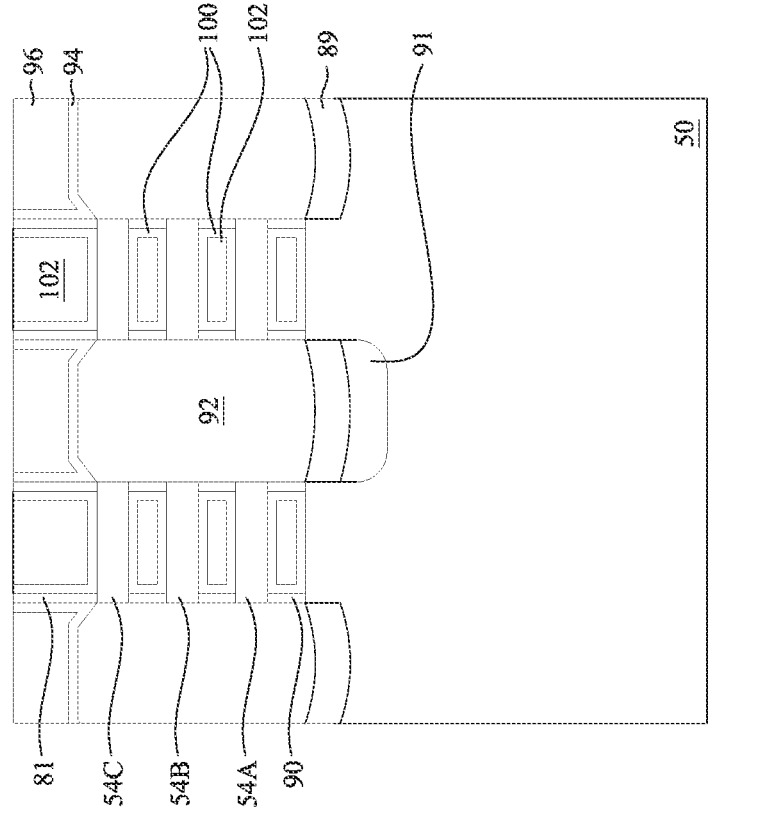

In FIGS. 17A through 17C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the substrate 50 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 17A and 17C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the substrate 50, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 18B:
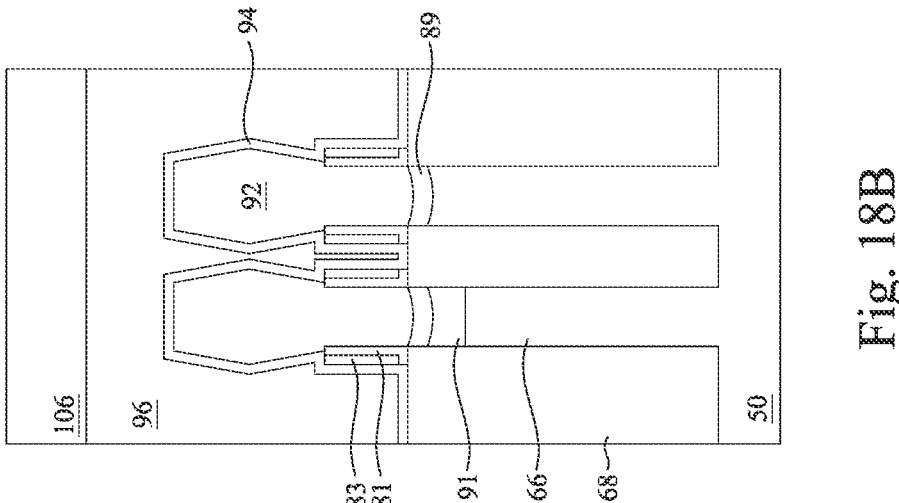
Figure 18A:
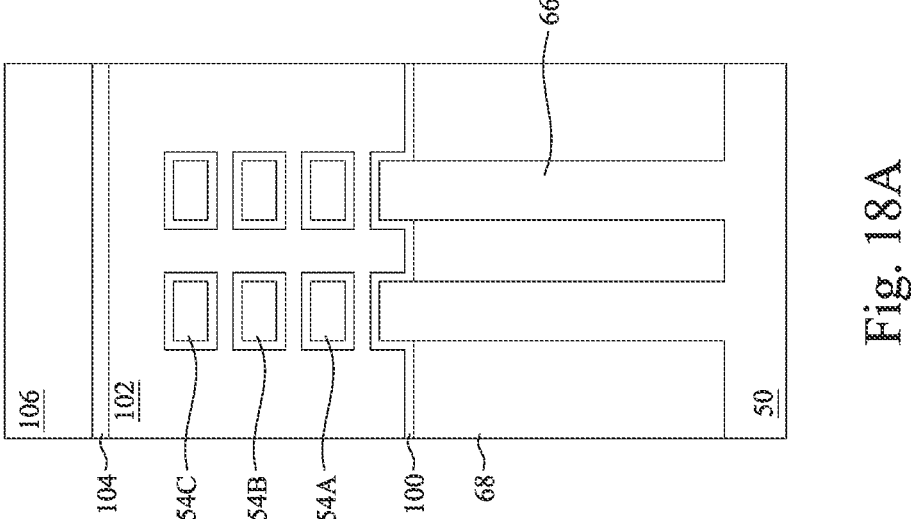
Figure 18C:
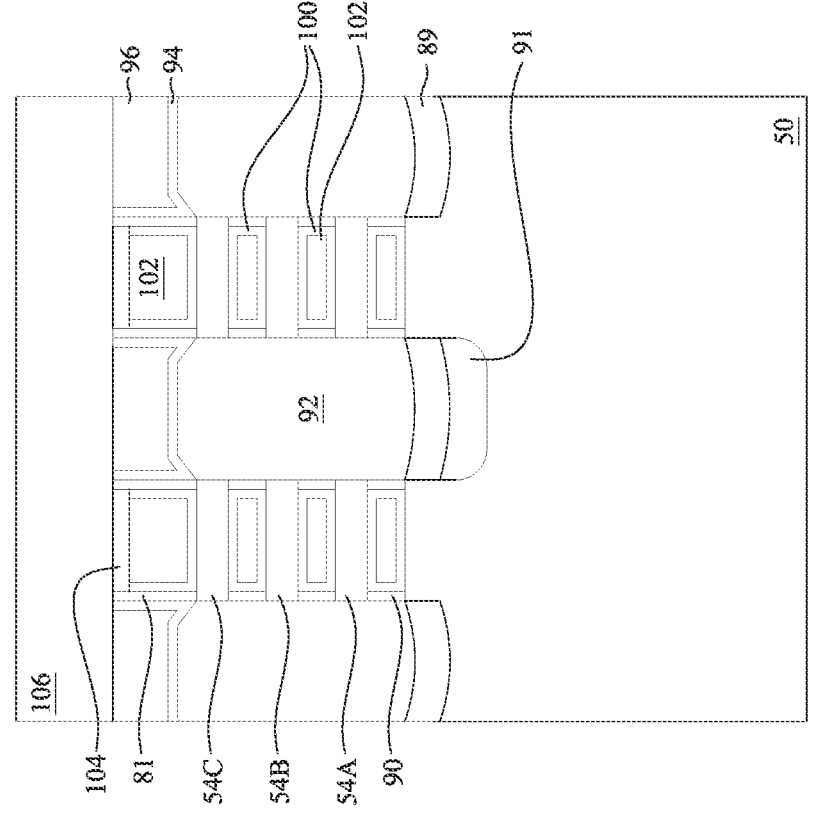

In FIGS. 18A through 18C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS.

20A through 20C) penetrate through the gate masks 104 to contact the top surfaces of the recessed gate electrodes 102.

As further illustrated by FIGS. 18A through 18C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 19B:
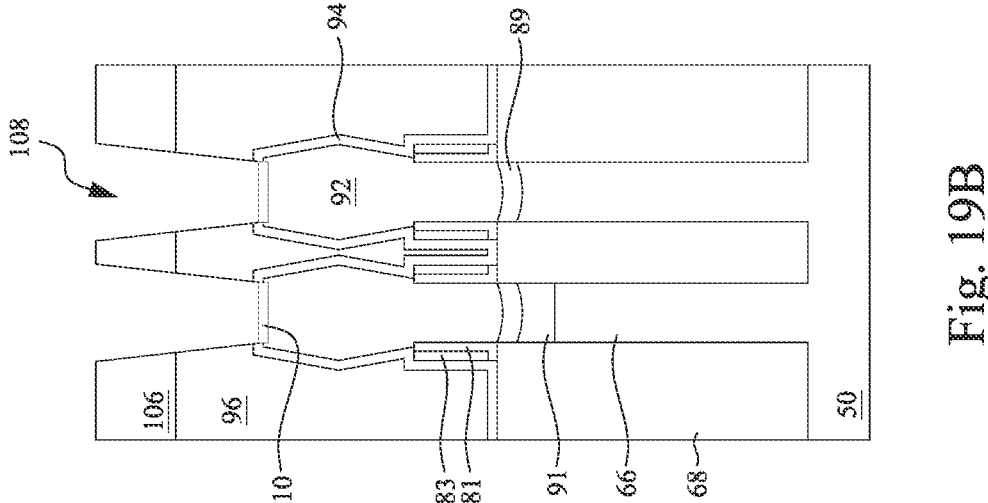
Figure 19A:
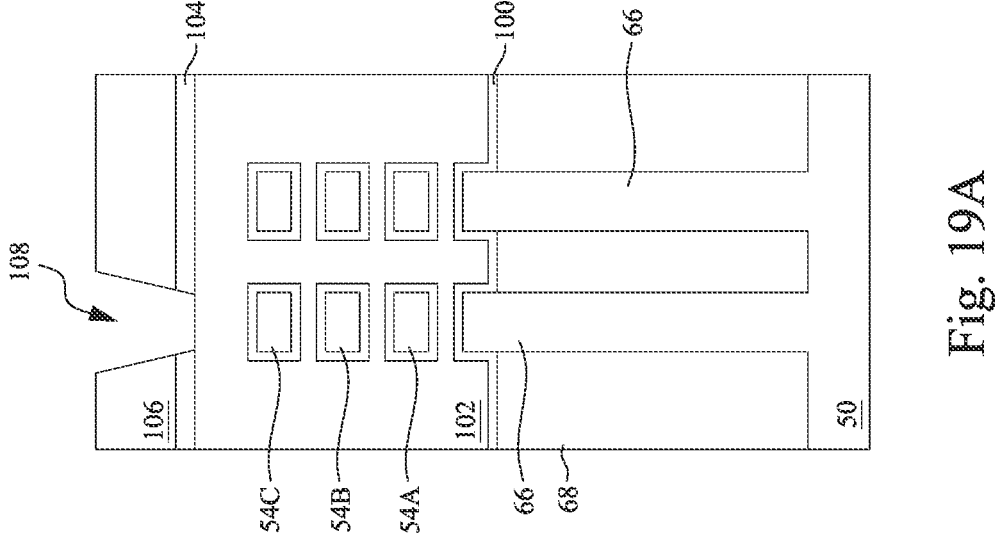
Figure 19C:
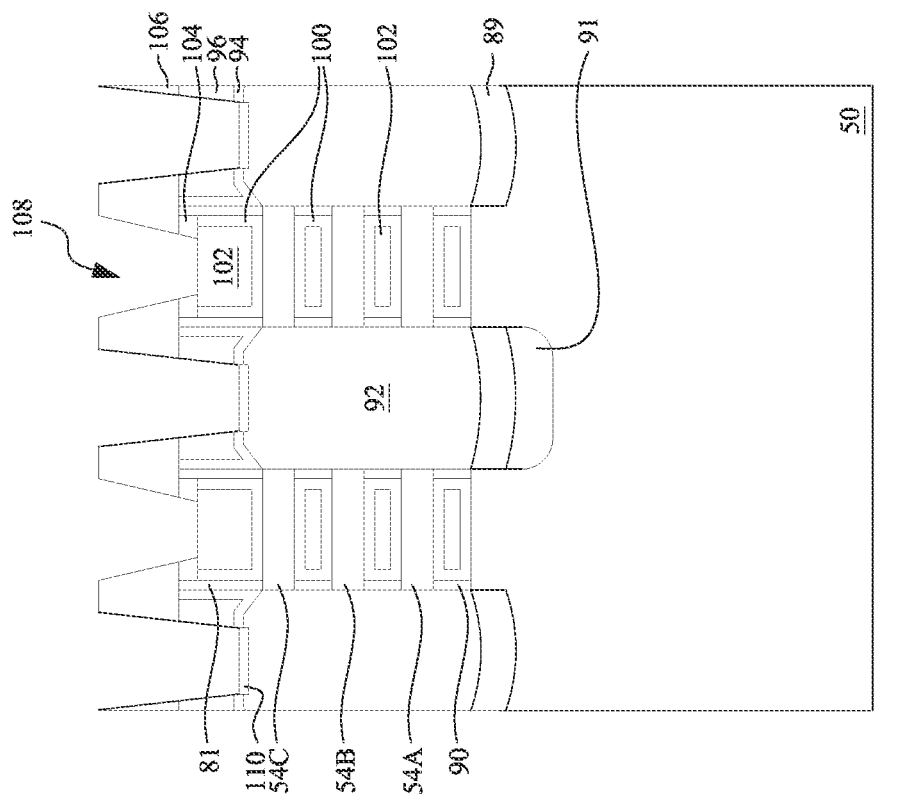

In FIGS. 19A through 19C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the substrate 50), or lower than (e.g., closer to the substrate 50) the epitaxial source/drain regions 92 and/or the gate structures. Although FIG. 19C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110, also referred to as first silicides 110, are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In some embodiments, the first silicide regions 110 comprise TiSi and have a thickness in a range between about 2 nm and about 10 nm.

Figure 20B:
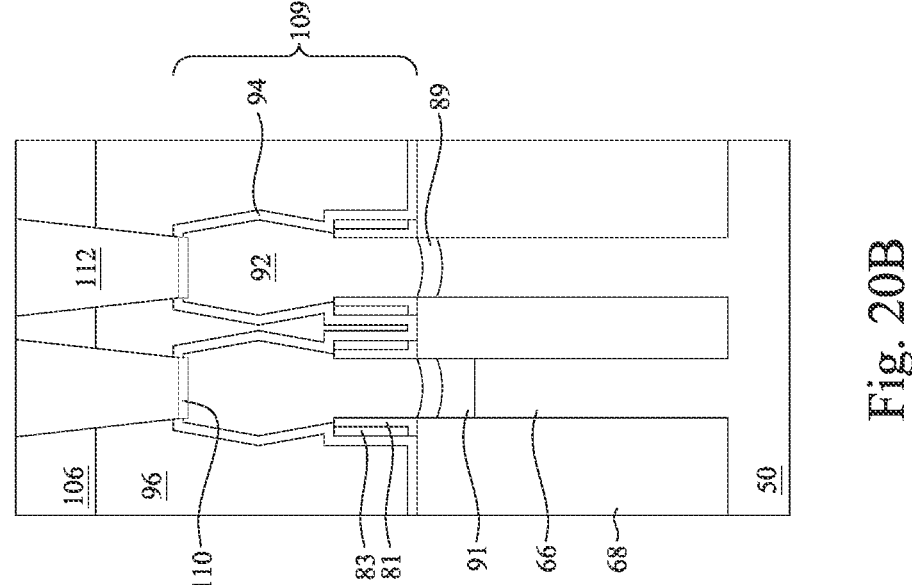
Figure 20A:
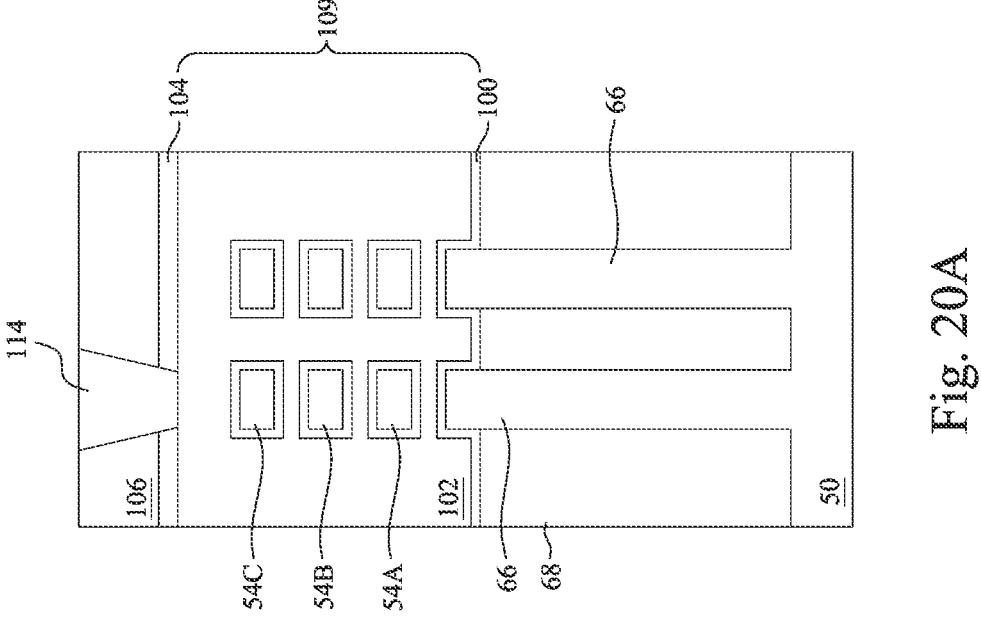
Figure 20C:
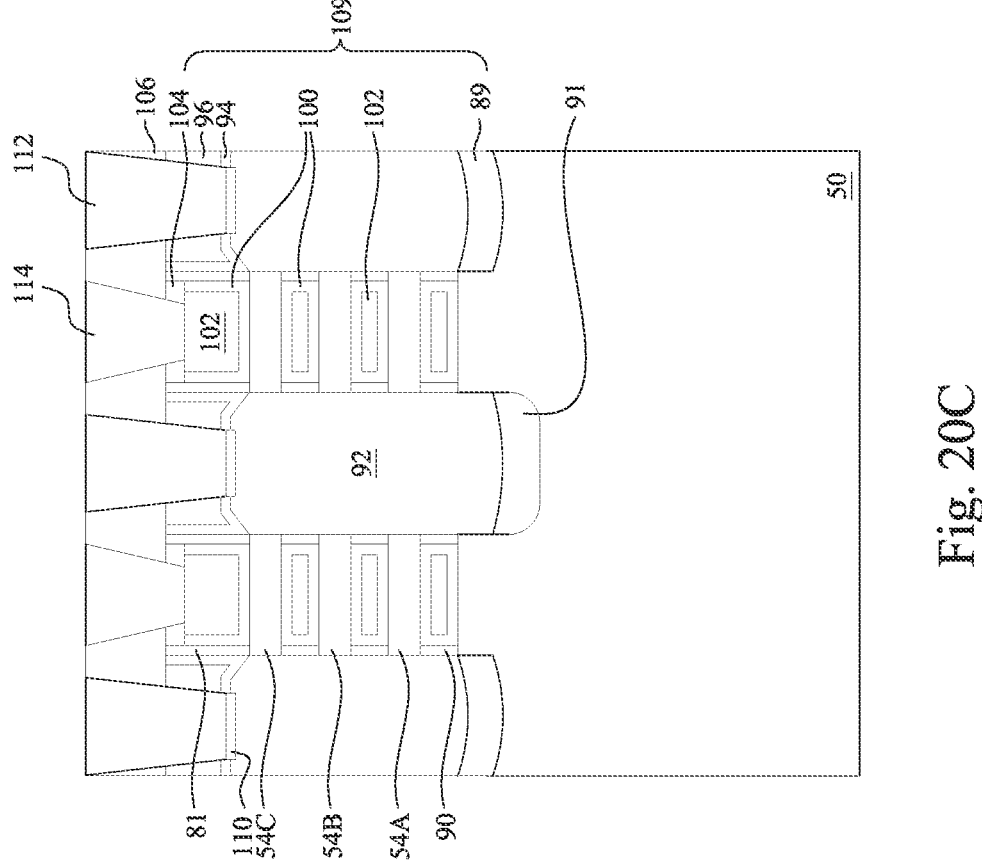

In FIGS. 20A through 20C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 21A through 21C) being formed over a front-side thereof and a second interconnect structure (such as the backside interconnect structure 136, discussed below with respect to FIGS. 28A through 28C) being formed over a backside thereof. Although the device layer is described as having nano-FETs, other embodiments may include a device layer having different types of transistors (e.g., planar FETs, finFETs, thin film transistors (TFTs), or the like).

Although FIGS. 20A through 20C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 21A through 21C).

FIGS. 21A through 29C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 21A, 22A, 23A, 24A, 25A, 26A, 27A, 28A, and 29A illustrate reference cross-section A-A' illustrated in FIG. 1. FIGS. 21B, 22B, 23B, 24B, 25B, 26B, 27B, 28B, and 29B illustrate reference cross-section B-B' illustrated in FIG. 1. FIGS. 21C, 22C, 23C, 24C, 25C, 26C, 27C, 28C, and 29C illustrate reference cross-section C-C' illustrated in FIG. 1. The process steps described in FIGS. 21A through 29C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figure 21B:
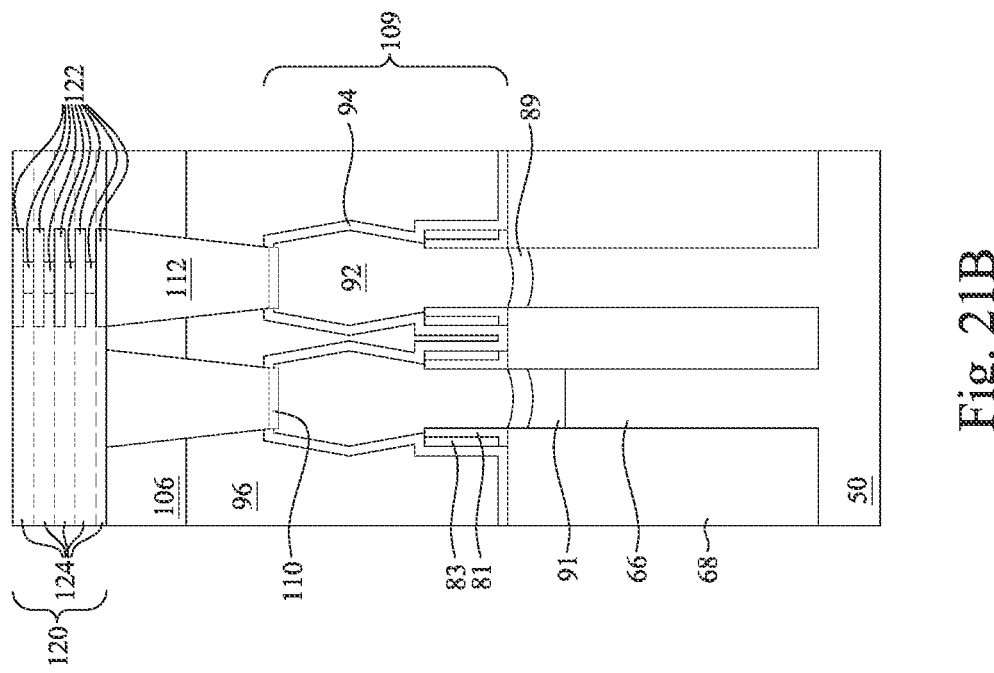
Figure 21A:
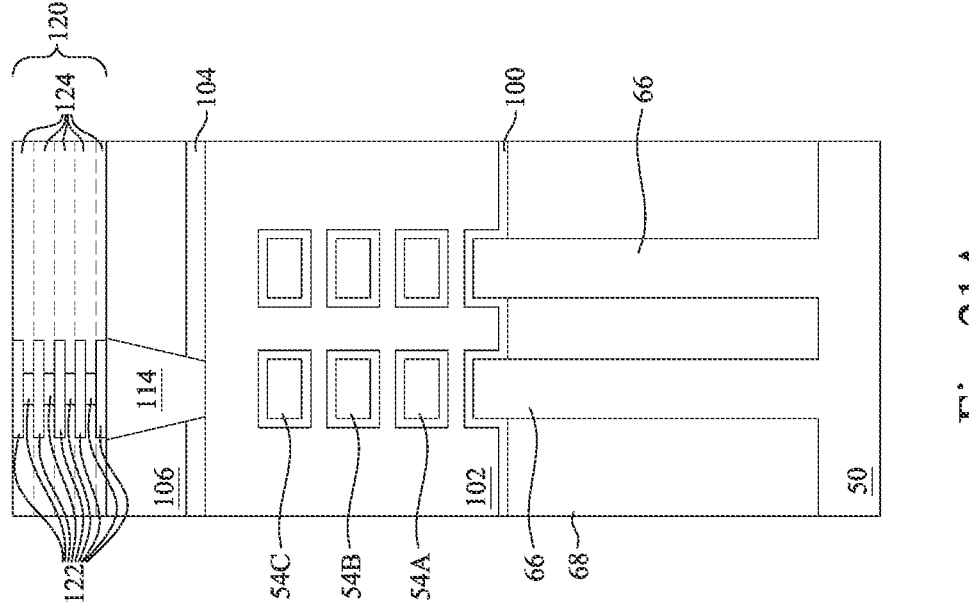
Figure 21C:
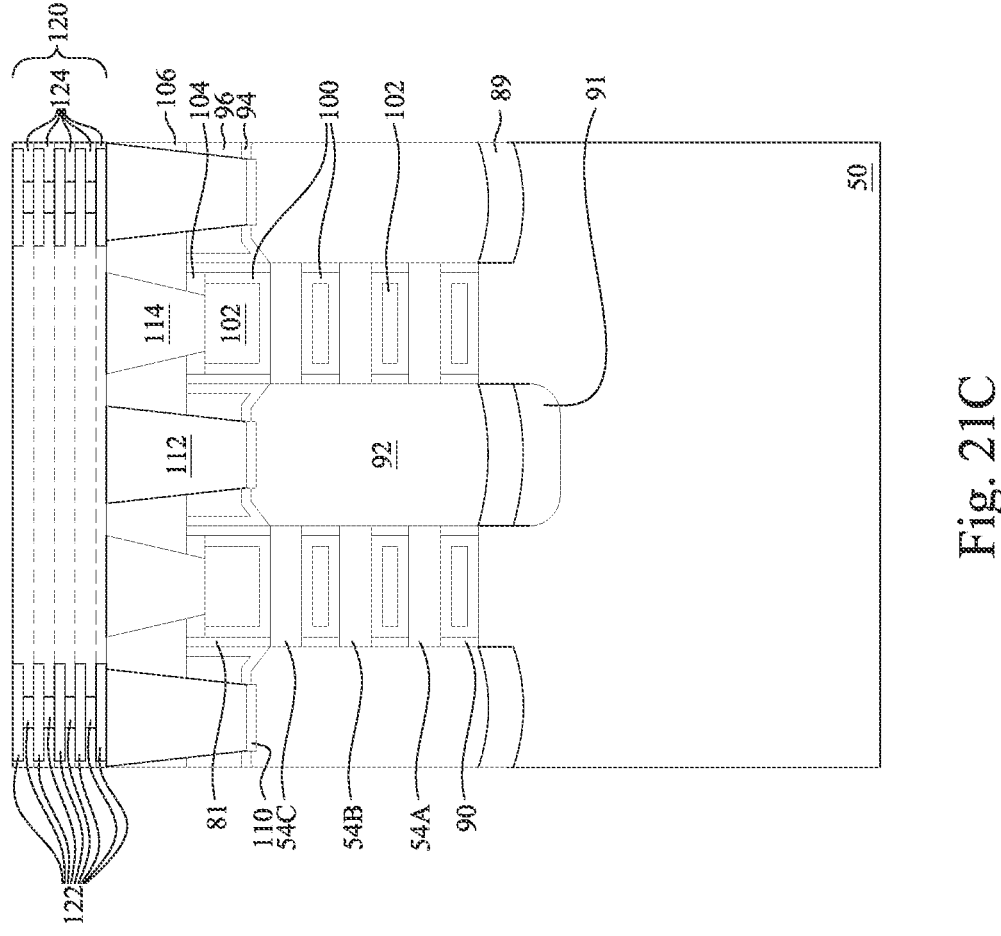

In FIGS. 21A through 21C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 21A through 21C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 22B:
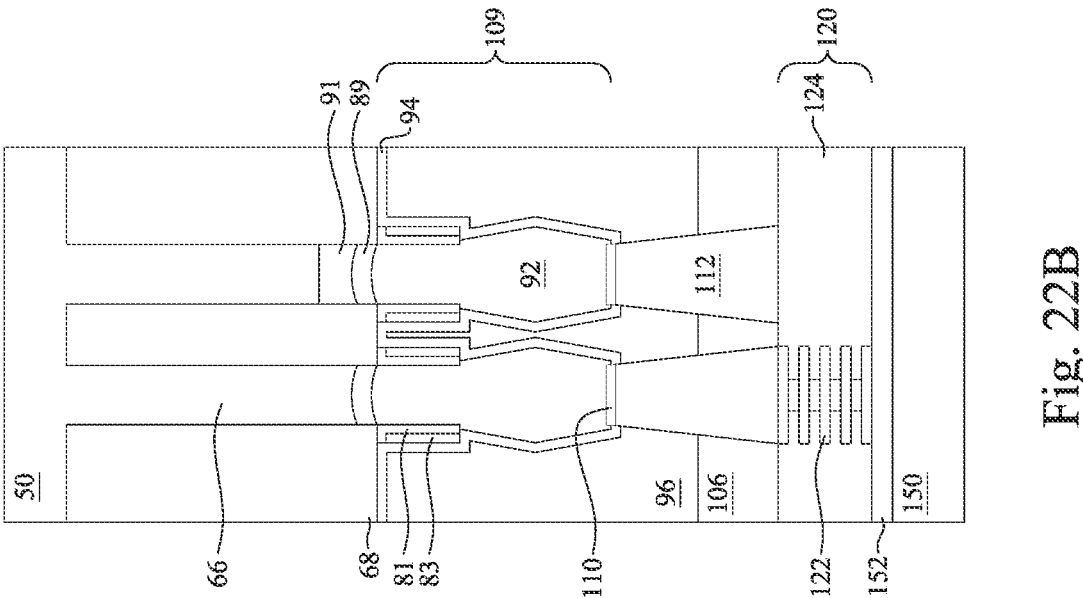
Figure 22A:
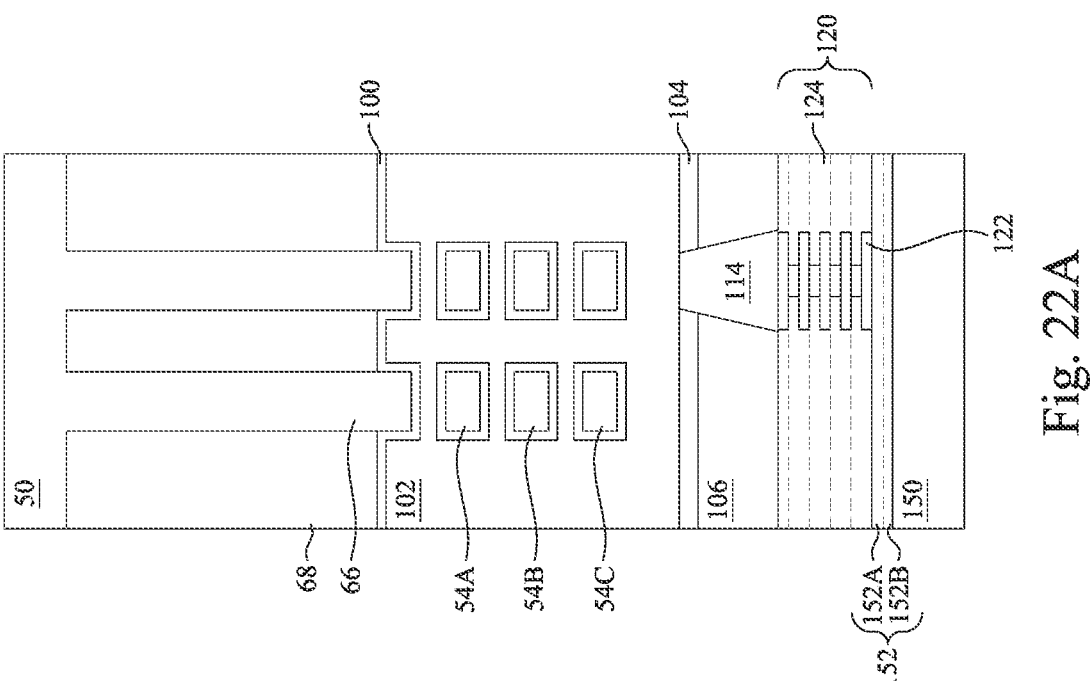
Figure 22C:
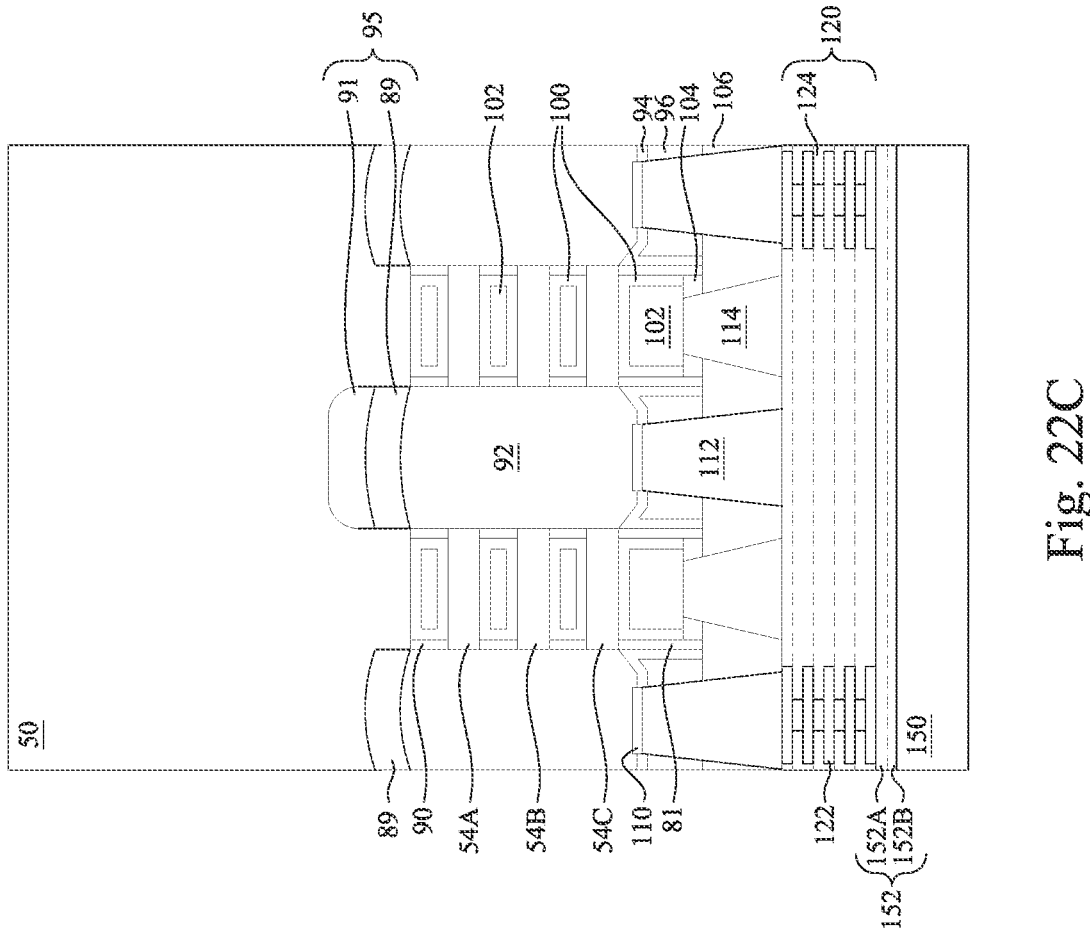

In FIGS. 22A through 22C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C. to about 500° C., for example.

Further in FIGS. 22A through 22C, after the carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 23B:
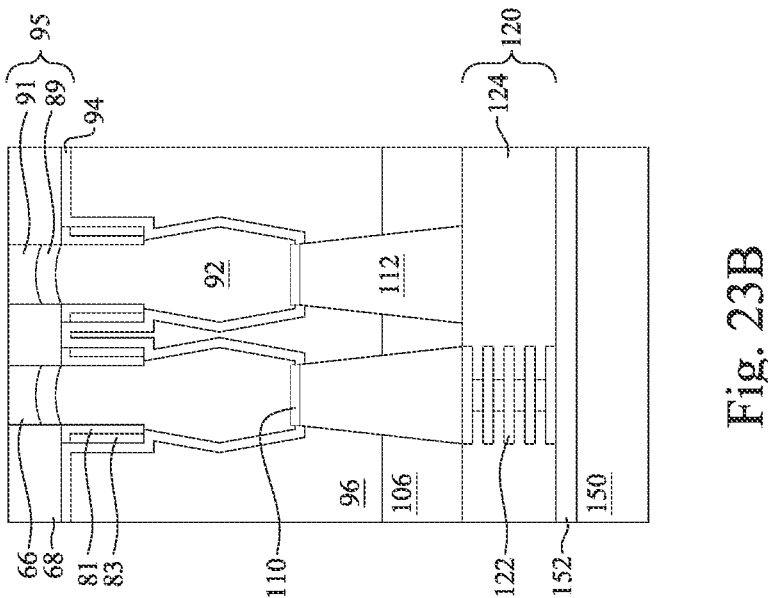
Figure 23A:
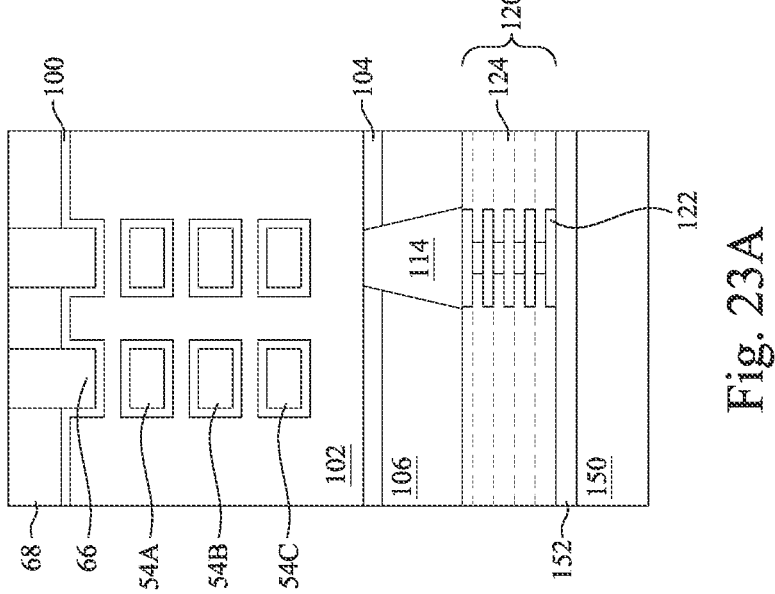
Figure 23C:
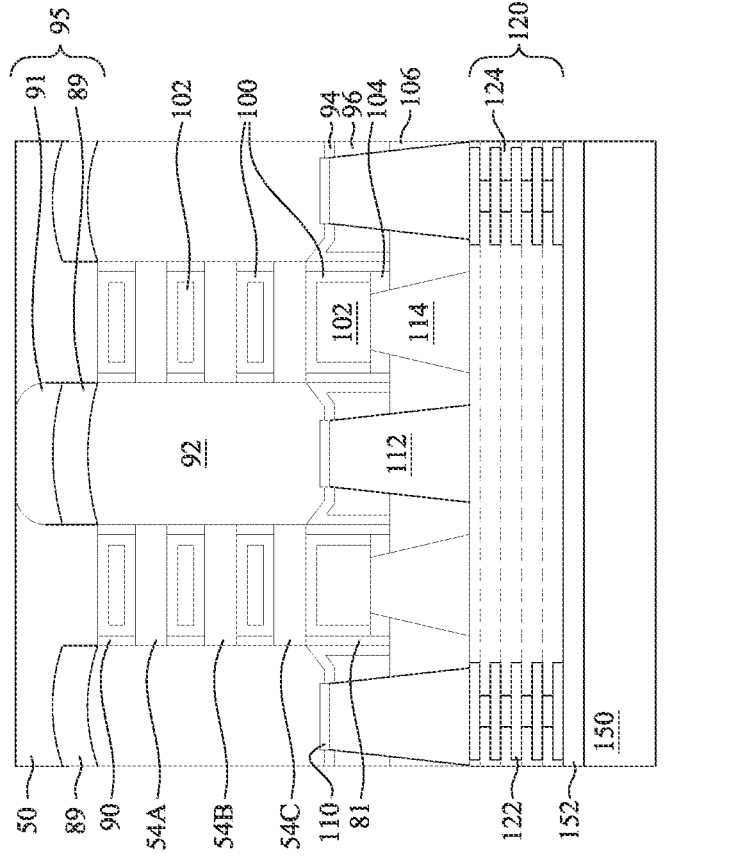

In FIGS. 23A through 23C, a thinning process may be applied to the backside of the substrate 50. The thinning process may comprise a planarization process (e.g., a mechanical grinding, a CMP, or the like), an etch-back process, a combination thereof, or the like. The thinning process may expose surfaces of the first epitaxial materials 91 opposite the front-side interconnect structure 120. Further, a portion of the substrate 50 may remain over the gate structures (e.g., the gate electrodes 102 and the gate dielectric layers 100) and the nanostructures 55 after the thinning process. As illustrated in FIGS. 23A through 23C, backside surfaces of the substrate 50, the first epitaxial materials 91, the STI regions 68, and the fins 66 may be level with one another following the thinning process.

Figure 24B:
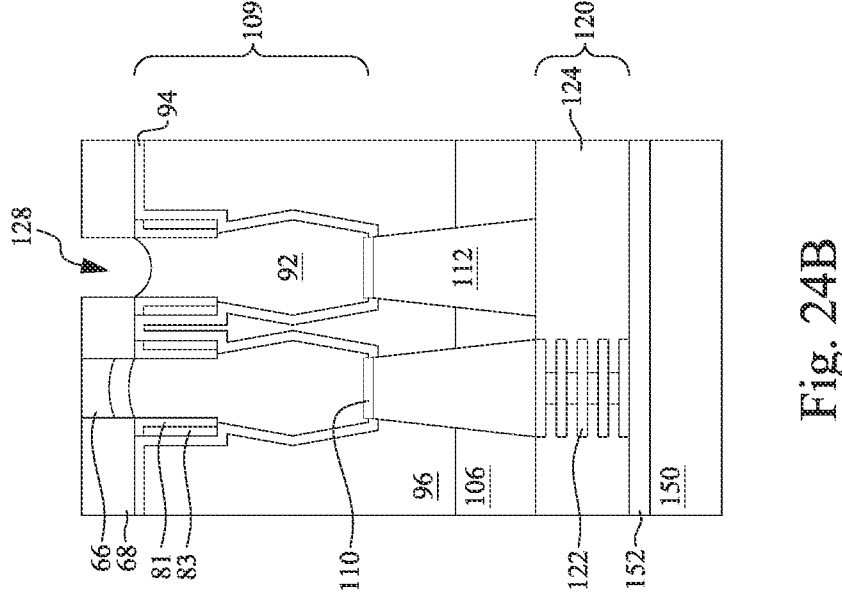
Figure 24A:
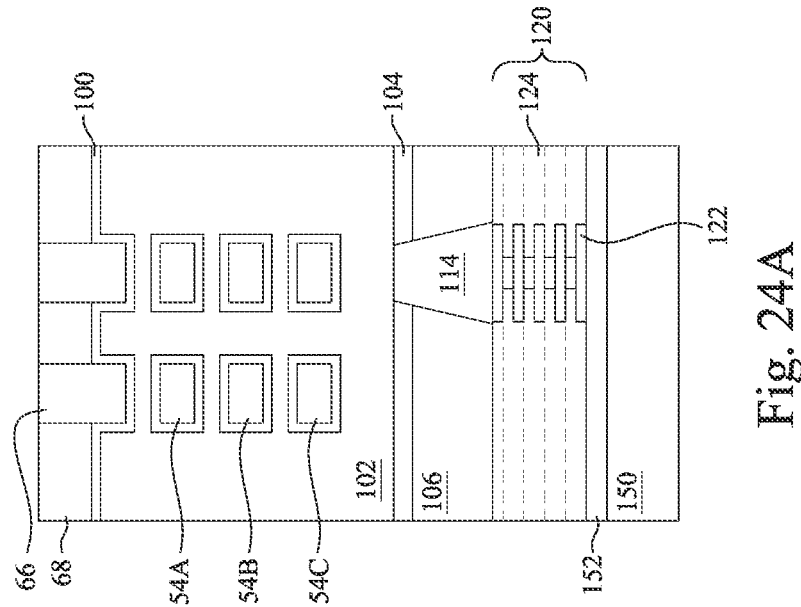
Figure 24C:
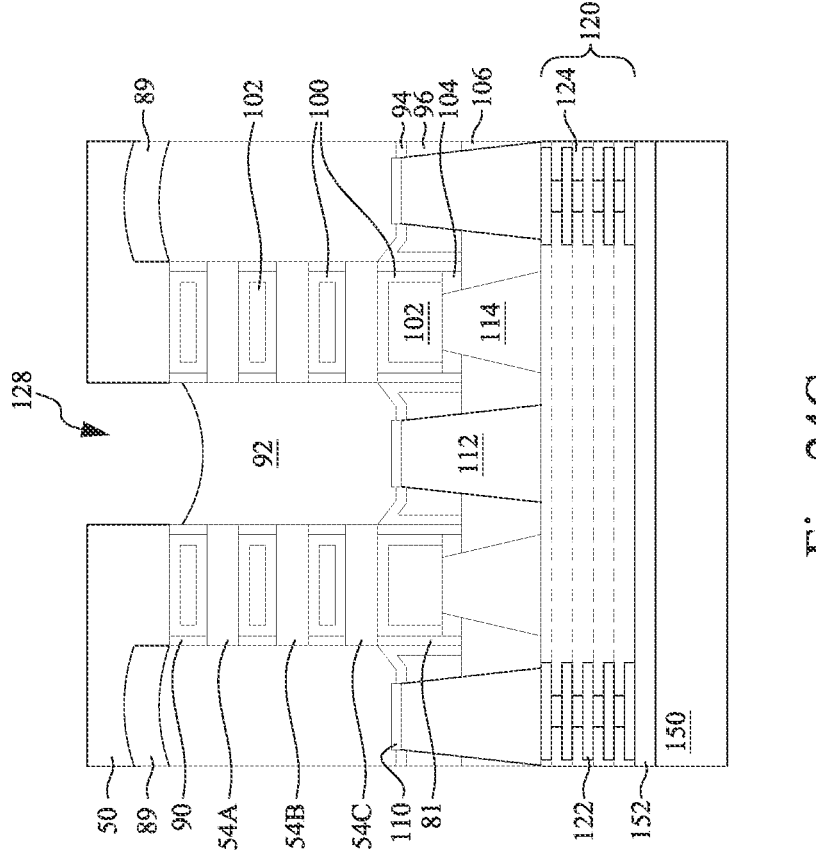

In FIGS. 24A through 24C, the first epitaxial materials 91 and first portions of the second epitaxial materials 89 located between the first epitaxial materials 91 and the source/drain regions 92 are removed to form fifth recesses 128. Backside vias may subsequently be formed in the fifth recesses 128 (see below, FIGS. 29A-29C) prior to removing remaining portions of the fins 66 and the substrate 50, which may be useful for achieving wider backside vias, thereby allowing for larger contact areas to obtain better contact resistance and improved device performance. The first epitaxial materials 91 and the first portions of the second epitaxial materials 89 may be removed by a suitable etching process, which may be an isotropic etching process, such as a wet etching process. In some embodiments, the etching process may remove portions of the epitaxial source/drain regions 92, producing convex bottoms of the fifth recesses 128. In other embodiments, the etching process may have a high etch selectivity to materials of the first epitaxial materials 91 and the first portions of the second epitaxial materials 89 such that the first epitaxial materials 91 and the first portions of the second epitaxial materials 89 may be removed without significantly removing materials of the STI regions 68 or the epitaxial source/drain regions 92. The fifth recesses 128 may expose sidewalls of the STI regions 68, backside surfaces of the epitaxial source/drain regions 92, sidewalls of the first spacers 81, and sidewalls of the inner spacers 90.

Figure 25B:
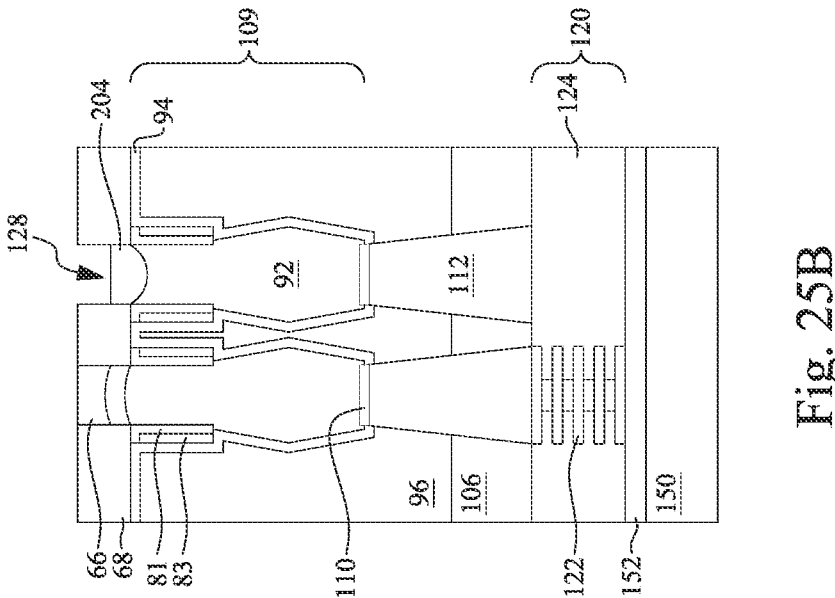
Figure 25A:
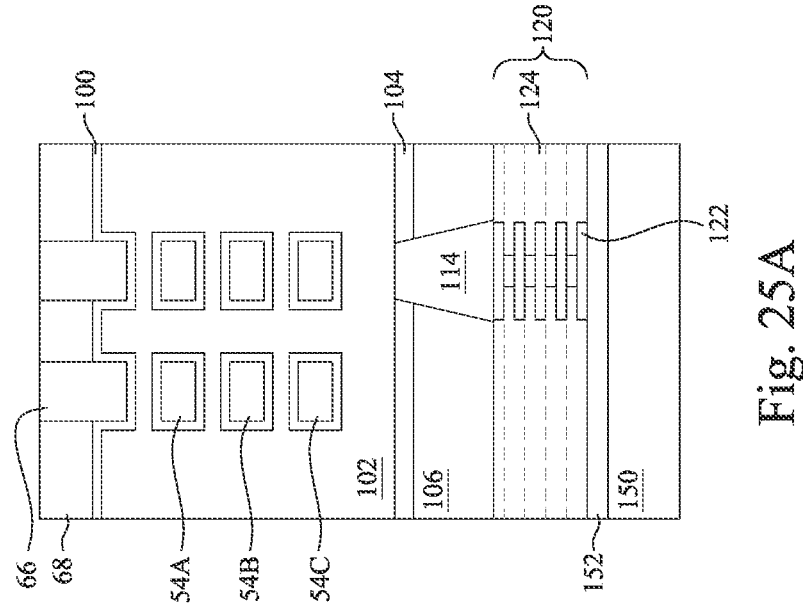
Figure 25C:
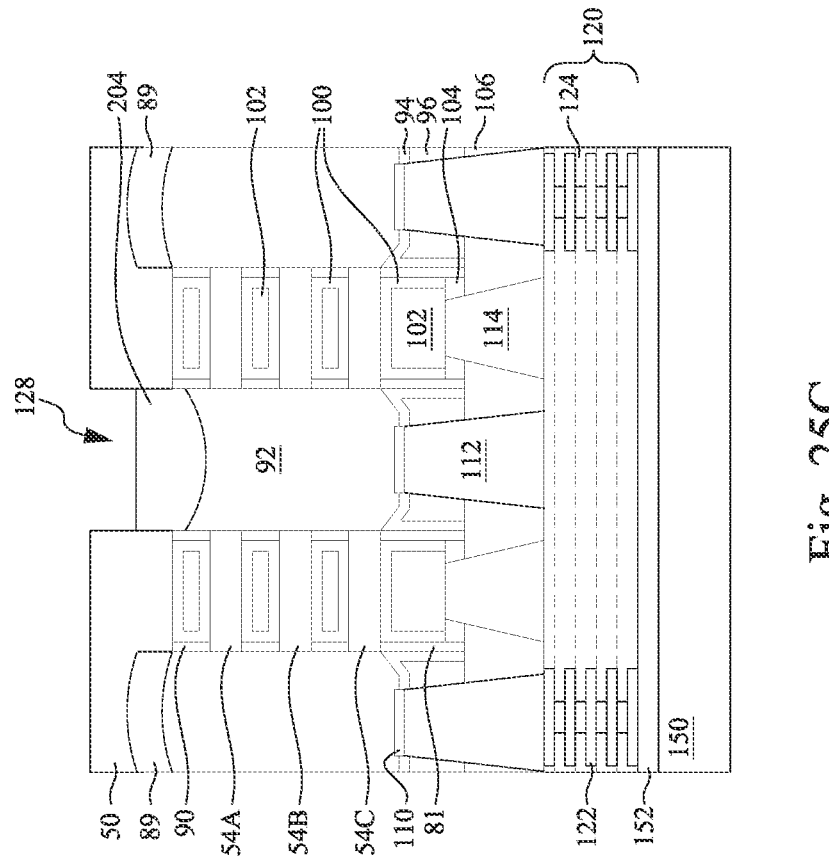

In FIGS. 25A through 25C, a mask 204 is formed in the fifth recesses 128. In some embodiments, mask 204 may be formed of, for example, a dielectric, an organic material, a bottom anti-reflective coating (BARC) material, or the like, and may be deposited by, for example, spin coating, PECVD, CVD, or the like. After deposition, an etch back process may be performed to remove the material from outside of the fifth recesses 128 and partially expose sidewalls of the fifth recesses 128, thereby forming the mask 204. The etch back process may recess the mask 204 below top surfaces of the substrate 50 and further below top surfaces of the STI regions 68 such that upper sidewalls of the fifth recesses 128 are exposed. The mask 204 may be formed to a thickness ranging from about 20 nm to about 40 nm. The mask 204 may be used in a subsequent process for widening the fifth recesses 128, described below with respect to FIG. 26A through 26C, and may be deposited to a desired thickness in order to control the shape of the fifth recesses 128 following the widening process. The mask 204 may further protect underlying source/drain regions 92 during the subsequent etching processes.

Figure 26B:
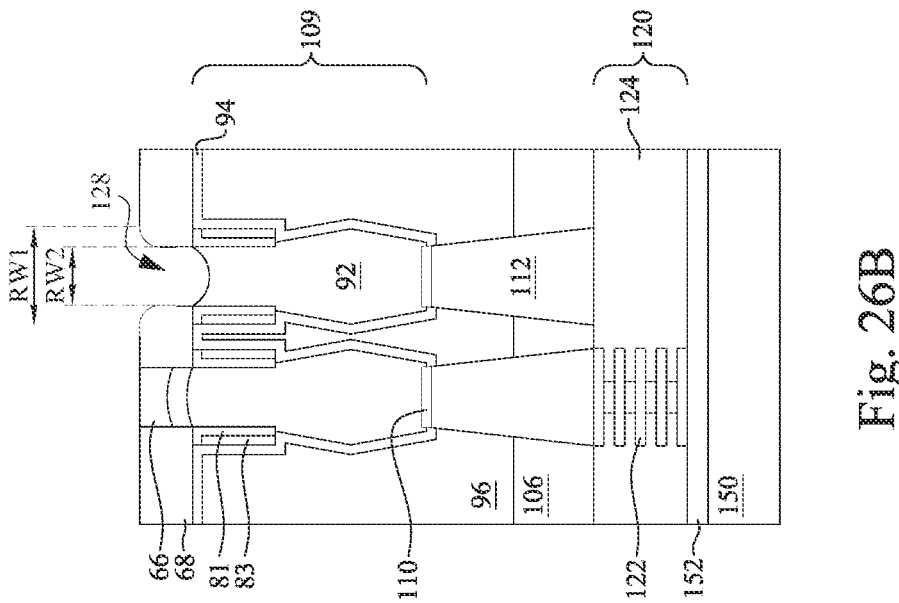
Figure 26A:
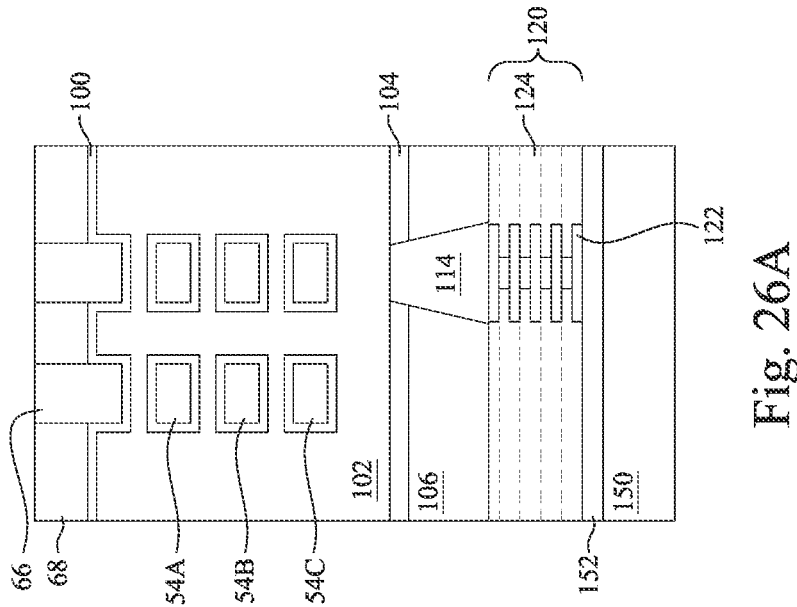
Figure 26C:
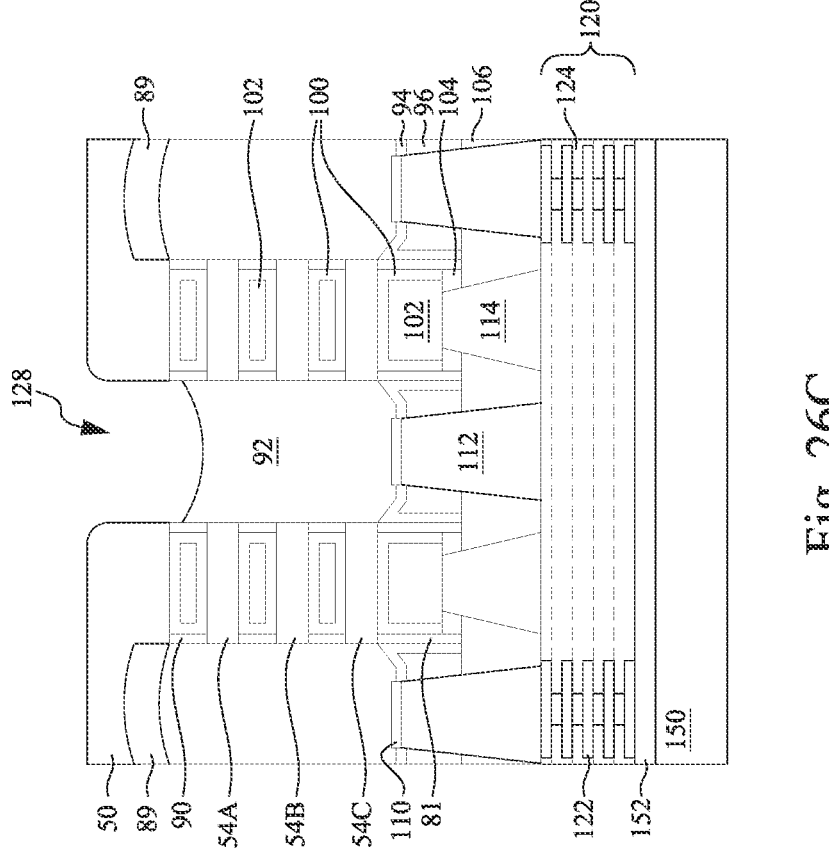

In FIGS. 26A through 26C, the fifth recesses 128 are widened and the mask 204 is removed. Widening the fifth recesses 128 may further round sidewalls of the fifth recesses 128. The fifth recesses 128 may be widened by a suitable etching process, such as a dry etching process, or the like. The dry etch may use an etching gas suitable for etching silicon, such as e.g. $O_2$, $Cl_2$, HCl, HBr, the like, or a combination thereof. The etching process may etch sidewalls of the substrate 50 and the STI regions 68 that are exposed by the fifth recesses 128 (e.g., not covered by the mask 204). As illustrated in FIGS. 26B and 26C, following the etching process, the fifth recesses 128 may have tapered profiles, which become narrower toward the front side of the device. A ratio of a maximum width RW1 of the fifth recesses 128 to a minimum width RW2 of the fifth recesses 128 may be from about 1.1 to about 1.8. Widening the fifth recesses 128 may allow larger backside vias to be subsequently formed, which advantageously reduces contact resistance and reduces the likelihood of contacts to the backside vias from being misaligned. After the fifth recesses 128 are widened, the mask 204 may then be removed using a suitable process such as an etch selective to the BARC, an ashing process, or the like.

Figure 27B:
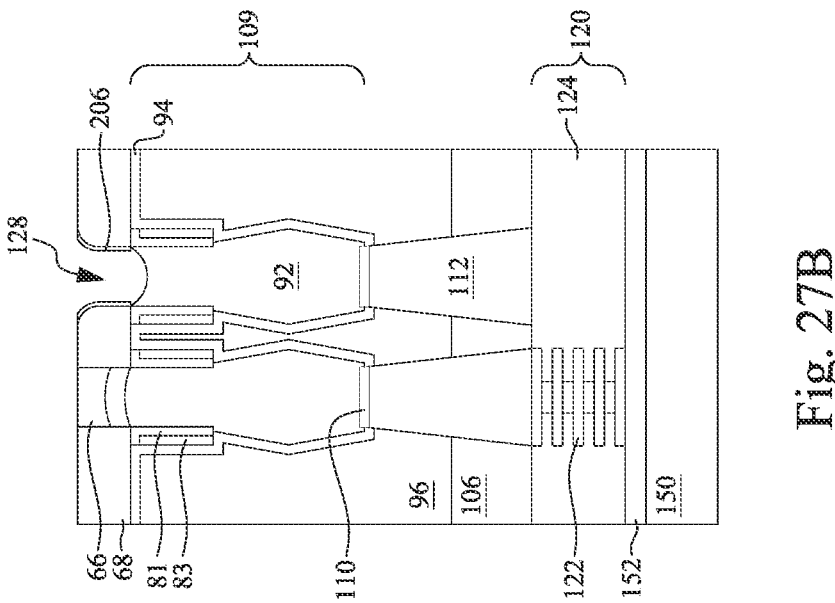
Figure 27A:
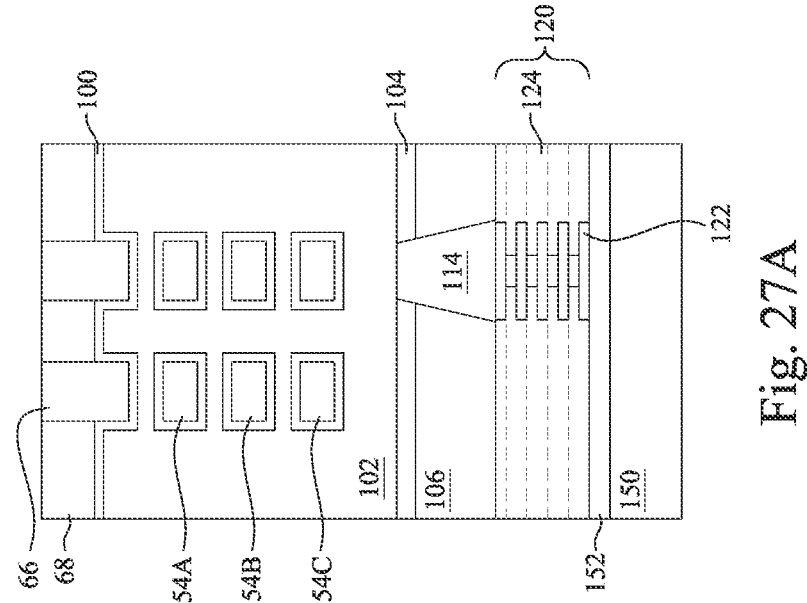
Figure 27C:
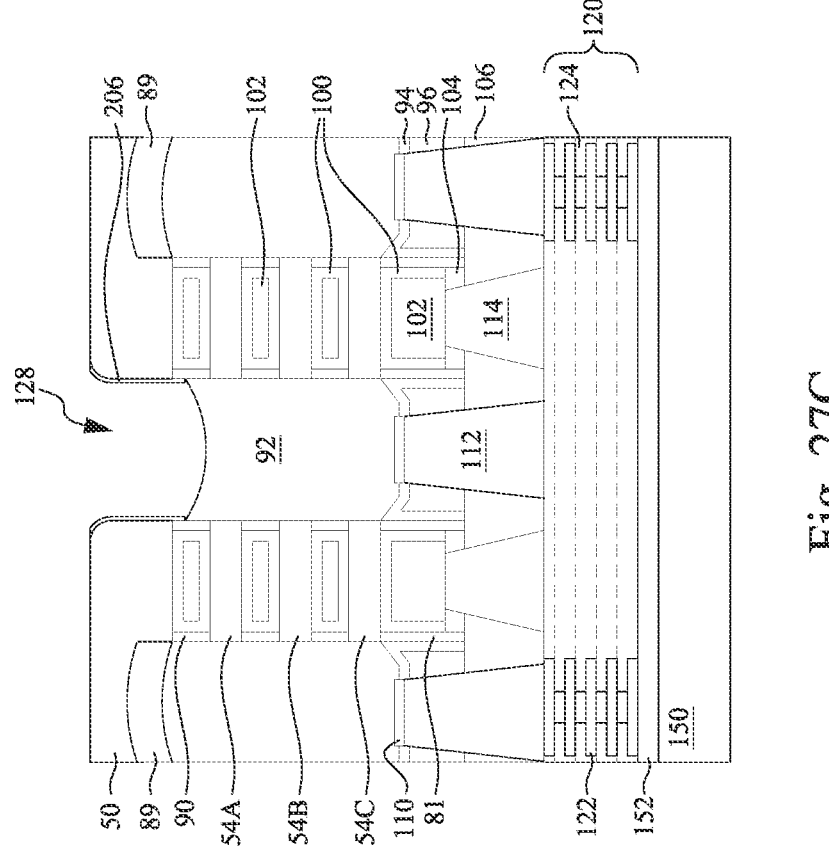

In FIGS. 27A through 27C, a first liner 206, also referred to as a first dielectric liner 206, is formed on sidewalls of the fifth recesses 128. The first liner 206 may be formed by depositing a first liner layer (not separately illustrated) over the structures illustrated in FIG. 26A through 26C. The first liner layer may be deposited by CVD, ALD, or the like. The first liner layer may be formed of silicon nitride (SiN), silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon oxycarbonitride (SiOCN), silicon (Si), zirconium nitride (ZrN), silicon carbonitride (SiCN), combinations or multiple layers thereof, or the like.

The first liner layer is then etched to form the first liner 206. The first liner layer may be etched using suitable etching processes, wet etch, a dry etch, combinations thereof, or the like. The etching process may be anisotropic in some embodiments. The etching process removes lateral portions of the first liner layer and leaves the first liner 206 on sidewalls of the fifth recesses 128. In some embodiments, the etching process may further remove the first liner 206 from upper portions of the fifth recesses 128 (see e.g., FIG. 34D). The first liner 206 may have a thickness in a range of about 1 nm to about 5 nm, which may be advantageous because it may reduce subsequent formation of second silicide regions 129 (see below, FIGS. 28A-C) on sidewalls of the substrate 50. The first liner 206 having a thickness less than about 1 nm may be disadvantageous because it may lead to increased formation of second silicide regions 129 on sidewalls of the substrate 50. The first liner 206 having a thickness greater than about 5 nm may be disadvantageous because it may lead to narrowed width of subsequently formed backside vias 130 (see below, FIGS. 29A-C), which may degrade device performance.

Figure 28B:
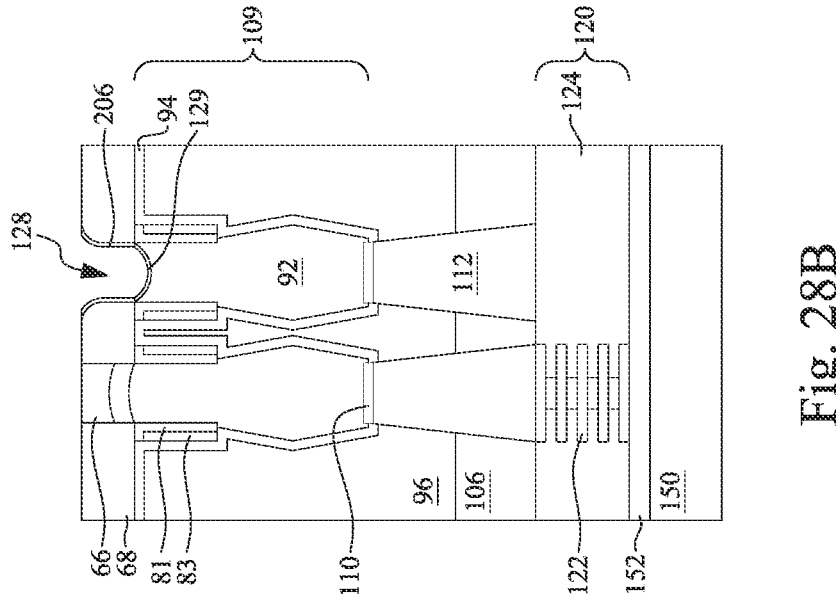
Figure 28A:
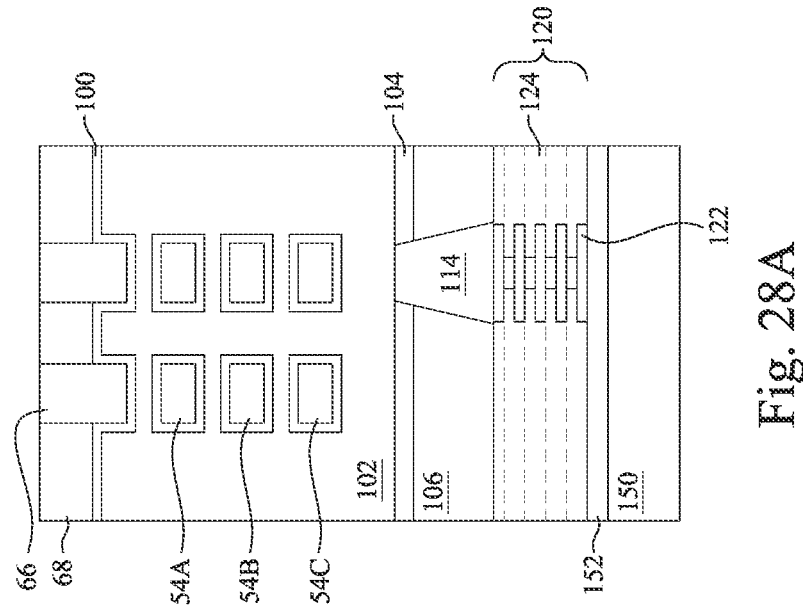
Figure 28C:
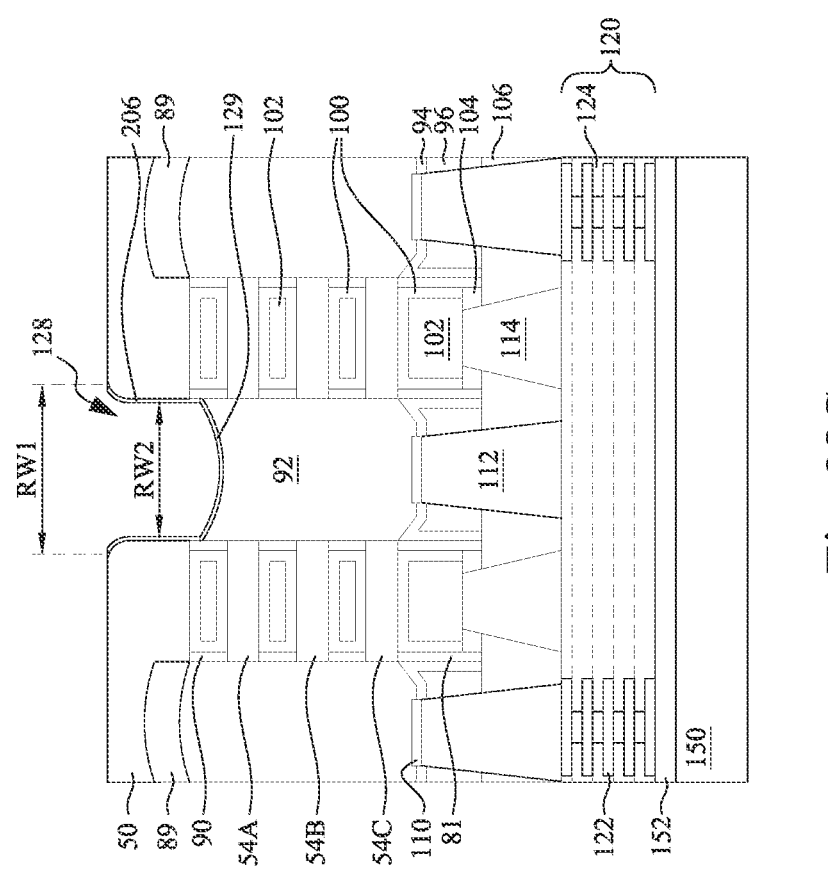

In FIGS. 28A through 28C, second silicide regions 129, also referred to as second silicides 129 are formed in the fifth recesses 128 on backsides of the epitaxial source/drain regions 92. Forming the second silicide regions 129 prior to removing the remaining portions of the fins 66 and the substrate 50 may be useful for improving the silicide formation by allowing a larger surface area of the second silicide regions 129. This may reduce contact resistance of the subsequently formed backside vias (see below, FIGS. 29A-29C). In some embodiments, the second silicide regions 129 are formed by first depositing a metal (not separately illustrated) capable of reacting with the semiconductor materials of the underlying backsides of the epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the backsides of the epitaxial source/drain regions 92, then performing a thermal anneal process to form the second silicide regions 129. The un-reacted portions of the deposited metal are then removed, e.g., by an etching process. Although the second silicide regions 129 are referred to as silicide regions, the second silicide regions 129 may also be germanide regions, or silicon germanide regions (e.g., regions comprising silicide and germanide). In some embodiments, the second silicide regions 129 in the n-type region 50N comprise TiSi, CrSi, TaSi, MoSi, ZrSi, HfSi, ScSi, Ysi, HoSi, TbSI, GdSi, LuSi, DySi, ErSi, YbSi, the like, or a combination thereof, and the second silicide regions 129 in the p-type region 50P comprise NiSi, CoSi, MnSi, WSi, FeSi, RhSi, PdSi, RuSi, PtSi, IrSi, OsSi, the like, or a combination thereof.

In some embodiments, the second silicide regions 129 have a thickness in a range between about 1 nm and about 10 nm, which may be advantageous for reducing contact resistance and improving device function. The second silicide regions 129 having a thickness less than about 1 nm may be disadvantageous because the silicide may be too thin and result in increased contact resistance due to ineffective silicide thickness. The second silicide regions 129 having a thickness greater than about 10 nm may be disadvantageous because it may lead to higher resistance that degrades device performance.

Figure 29B:
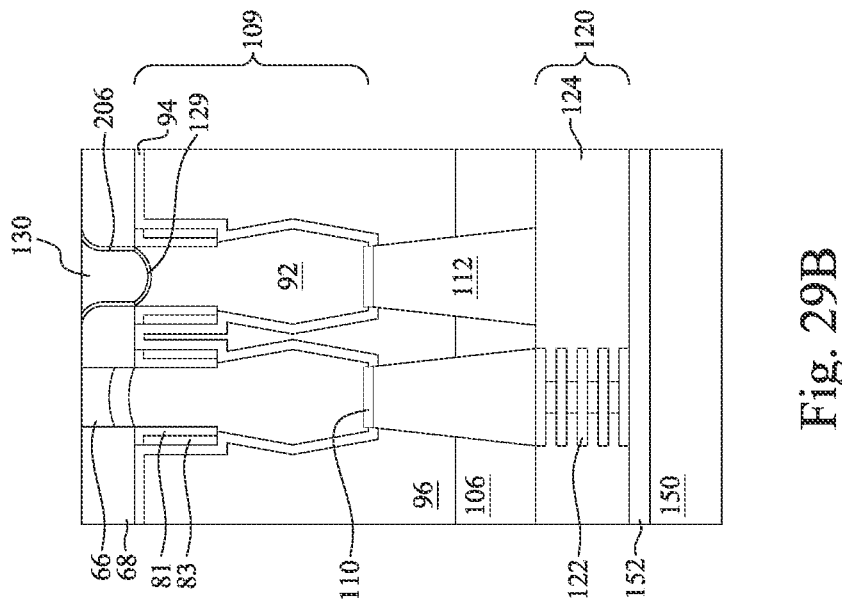
Figure 29A:
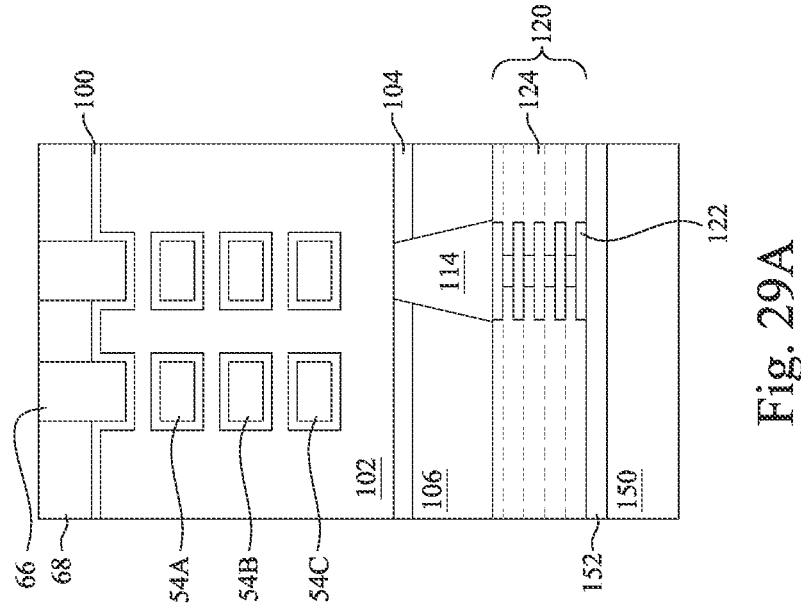
Figure 29C:
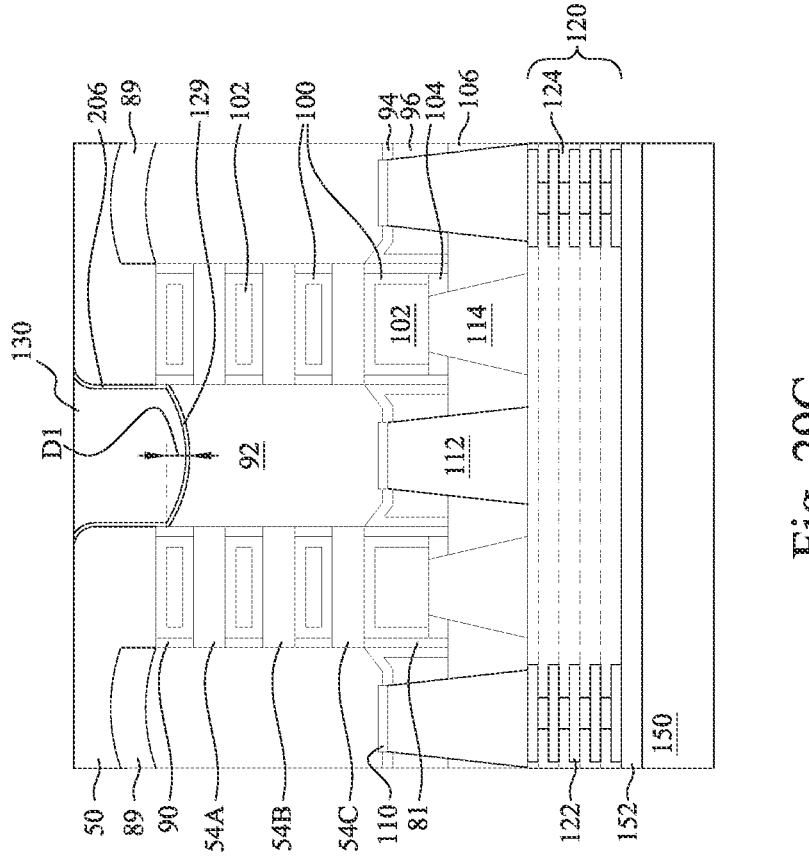

In FIGS. 29A through 29C, backside vias 130, also referred to as contacts or conductive contacts 130, are formed in the fifth recesses 128. Forming the backside vias 130 prior to removing remaining portions of the fins 66 and the substrate 50 may be useful for achieving greater widths of the backside vias 130. This may lead to larger contact areas with the underlying source/drain regions 92, which may reduce contact resistance and achieve better device performance. The backside vias 130 may include one or more layers, such as barrier layers, diffusion layers, and fill materials. The backside vias 130 may be electrically coupled to the epitaxial source/drain regions 92 through the second silicide regions 129. The backside vias 130 may include tungsten (W), ruthenium (Ru), cobalt (Co), copper (Cu), titanium (Ti), titanium nitride (TiN), tantalum (Ta), tantalum nitride (TaN), molybdenum (Mo), nickel (Ni), combinations thereof, or the like. A planarization process, such as a CMP, may be performed to remove excess material from surfaces of the substrate 50 and the STI regions 68.

In some embodiments, as illustrated in accordance with FIG. 29C, the backside vias 130 extend to a depth D1 measured from a level of a topmost surface of the gate electrode 102 to a bottom vertex of the backside vias 130, and the depth D1 may be in a range of about 0.5 nm to about 10 nm. In other embodiments, the bottom vertices of the backside vias 130 are level with the topmost surface of the gate electrode 102 (not illustrated).

Figure 30B:
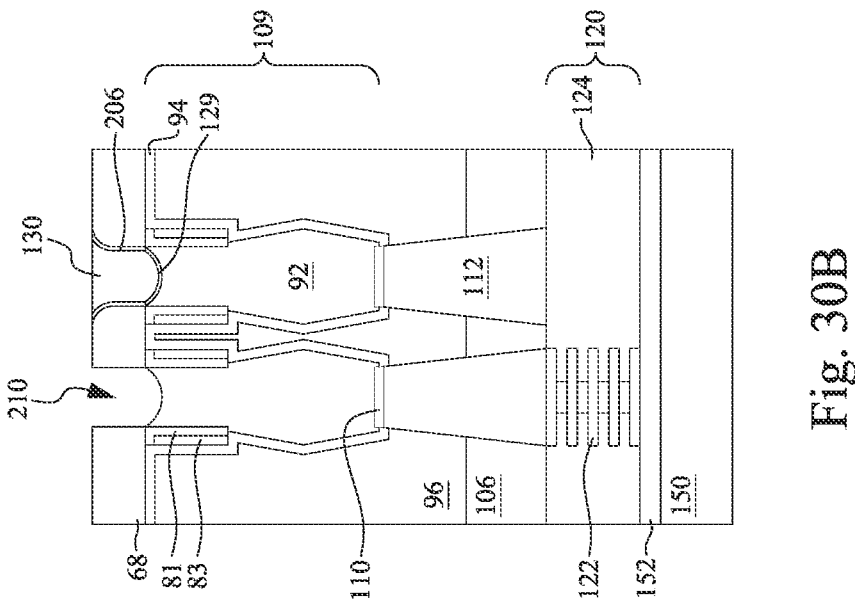
Figure 30A:
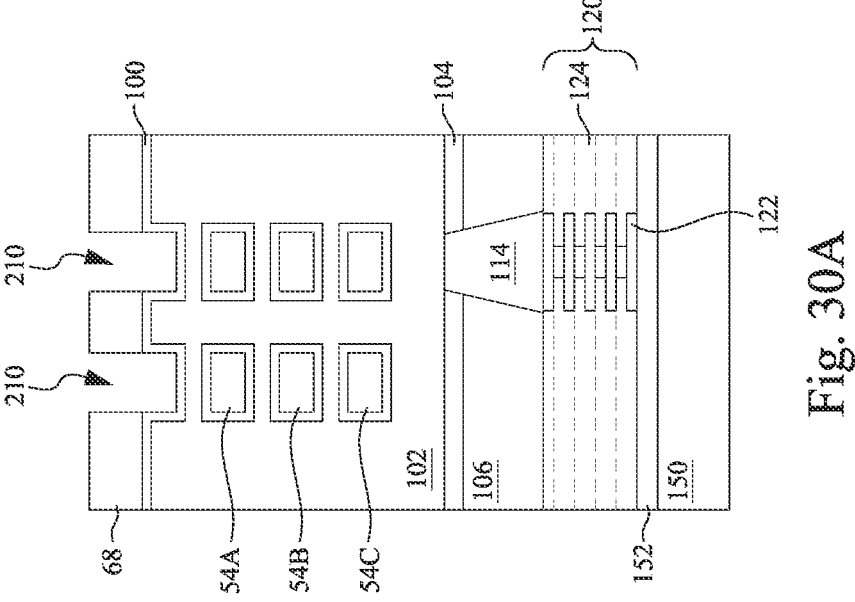
Figure 30C:
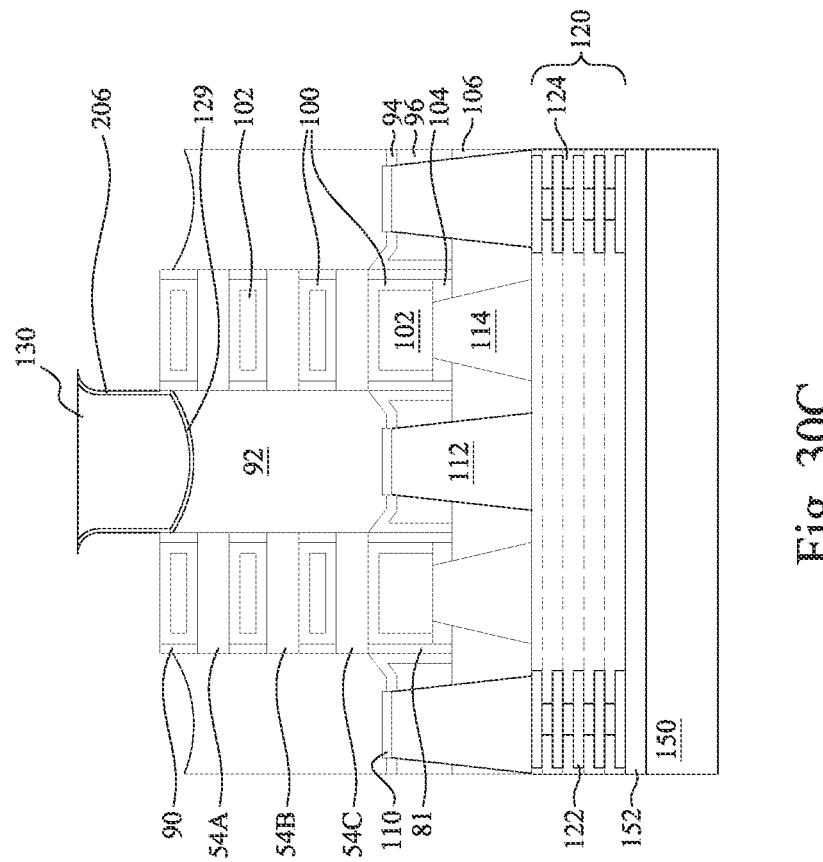

In FIGS. 30A through 30C, remaining portions of the fins 66 and the substrate 50 are removed. The fins 66 and the substrate 50 may be etched using a suitable etching process, such as an isotropic etching process (e.g., a wet etching process), an anisotropic etching process (e.g., a dry etching process), or the like. The etching process may be one that is selective to the material of the fins 66 and the substrate 50 (e.g., etches the material of the fins 66 and the substrate 50 at a faster rate than the material of the backside vias 130, the first liner 206, the STI regions 68, the gate dielectric layers 100, the inner spacers 90, and the epitaxial source/drain regions 92). After etching the fins 66 and the substrate 50, surfaces of the STI regions 68, the gate dielectric layers 100, the inner spacers 90, and the epitaxial source/drain regions 92 may be exposed. The removal of the remaining portions of the fins 66 may form sixth recesses 210 exposing backside surfaces of the gate dielectric layers 100 and the epitaxial source/drain regions 92. In some embodiments, the etching process may remove exposed backside portions of the epitaxial source/drain regions 92, producing concave backside surfaces of the epitaxial source/drain regions 92. The sixth recesses 210 may extend to a same depth or a different depth as the previously discussed fifth recesses 128 (see e.g., FIGS. 24A through 24C) and the corresponding backside vias 130 which are formed in the fifth recesses 128.

Figure 31B:
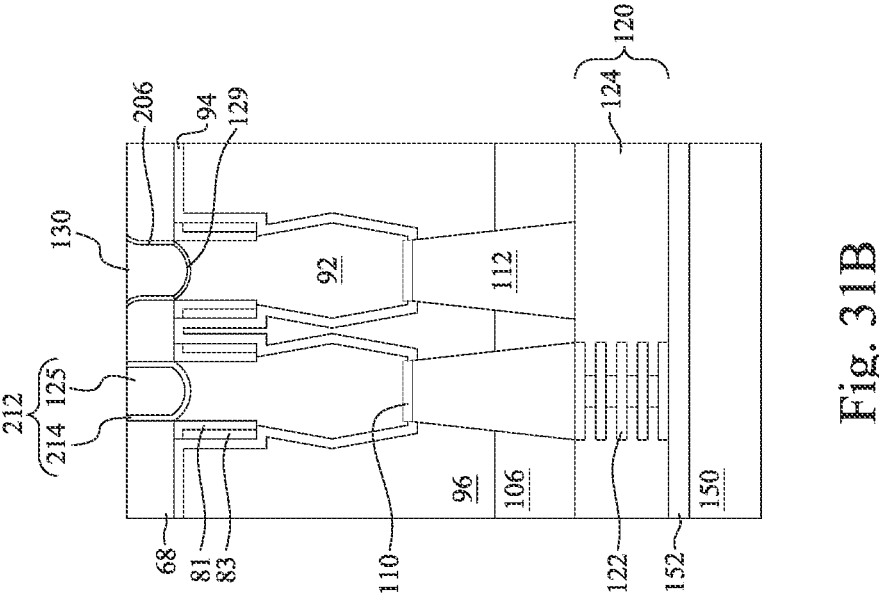
Figure 31A:
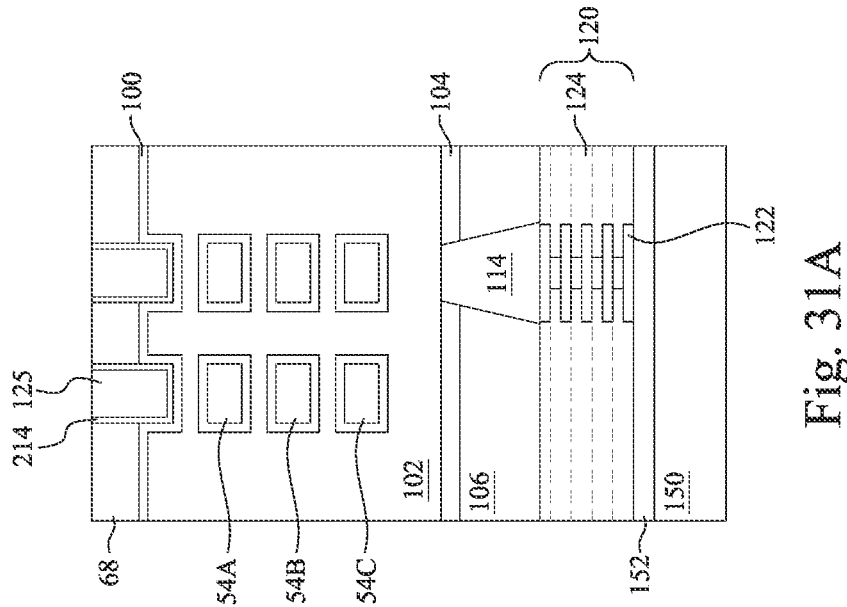
Figure 31C:
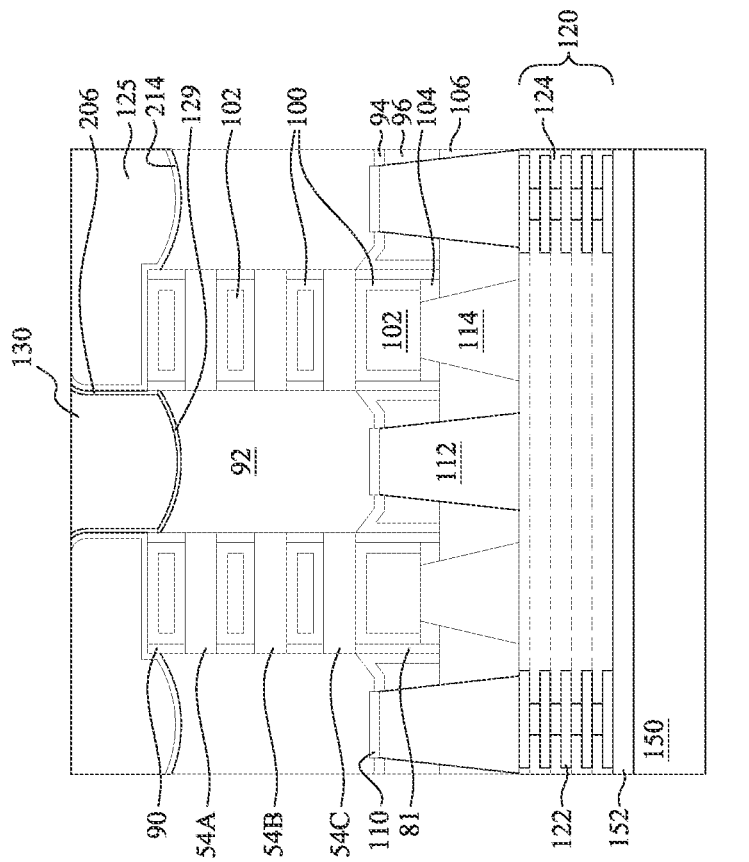

In FIGS. 31A through 31C, an insulating plug 212 is filled in the sixth recesses 210 and over exposed surfaces of the structures illustrated in FIGS. 30A through 30C. In some embodiments, the insulating plug 212 comprises a convex bottom profile physically contacting an epitaxial source/drain region 92. In some embodiments, the insulating plug 212 comprises a second liner 214, also referred to as a second dielectric liner 214, and a second dielectric layer 125. Forming the second liner 214 and the second dielectric layer 125 on the external sidewalls of the backside vias 130 may allow the backside vias 130 to be formed with greater widths, which may improve contact resistance and device performance. In some embodiments, the second liner 214 is formed over the first liner 206, the STI regions 68, the gate dielectric layers 100, the epitaxial source/drain regions 92, and the inner spacers 90. The second liner 214 may comprise a dielectric material such as silicon nitride (SiN), silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon oxycarbonitride (SiOCN), silicon (Si), zirconium nitride (ZrN), silicon carbonitride (SiCN), combinations or multiple layers thereof, or the like.

The second liner 214 may have a thickness in a range of about 1 nm to about 10 nm, which may be advantageous for protecting the underlying epitaxial source/drain regions 92 from a subsequent anneal process performed on the second dielectric layer 125 (see below). A second liner 214 with a thickness less than about 1 nm may be disadvantageous as it may not be thick enough to protect the underlying epitaxial source/drain regions 92 from the subsequent anneal process. A second liner 214 with a thickness greater than about 10 nm may be disadvantageous because its relatively high k-value may result in undesirably high parasitic capacitance.

The second dielectric layer 125 is formed over the second liner 214. In some embodiments, the second dielectric layer 125 is a flowable film formed by FCVD or the like. In some embodiments, the second dielectric layer 125 is formed of a dielectric material such as PSG, BSG, BPSG, USG, or the like, and may be deposited by any suitable method, such as CVD, PECVD, or the like. In some embodiments, the second dielectric layer 125 comprises silicon oxide (SiO), hafnium silicide (HfSi), silicon oxycarbide (SiOC), aluminum oxide (AlO), zirconium silicide (ZrSi), aluminum oxynitride (AlON), zirconium oxide (ZrO), hafnium oxide (HfO), titanium oxide (TiO), zirconium aluminum oxide (ZrAlO), zinc oxide (ZnO), tantalum oxide (TaO), lanthanum oxide (LaO), yttrium oxide (YO), tantalum carbonitride (TaCN), silicon nitride (SiN), silicon oxycarbonitride (SiOCN), silicon (Si), zirconium nitride (ZrN), silicon carbonitride (SiCN), combinations or multiple layers thereof, or the like. In some embodiments, the second dielectric layer 125 and the second liner 214 may include substantially the same material. In other embodiments, the second dielectric layer 125 may include a different material than the second liner 214. For example, the second dielectric layer 125 may have a lower k-value than the second liner 214.

In some embodiments, an anneal process is performed once the second dielectric layer 125 is formed to enhance oxidation of the second dielectric layer 125 and improve its dielectric properties. A CMP process or the like may be used to remove material of the second dielectric layer 125 and the second liner 214 such that top surfaces of the second dielectric layer 125 and the second liner 214 are level with top surfaces of the STI regions 68 and the backside vias 130.

Figure 32B:
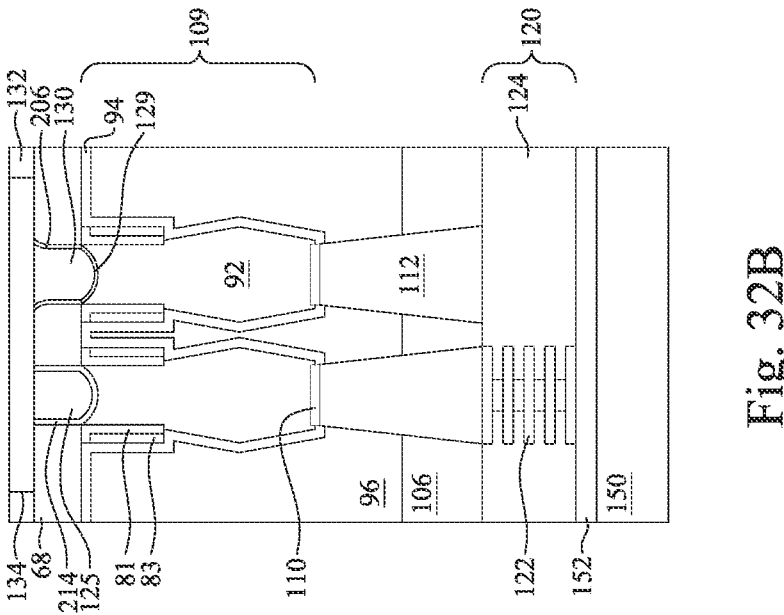
Figure 32A:
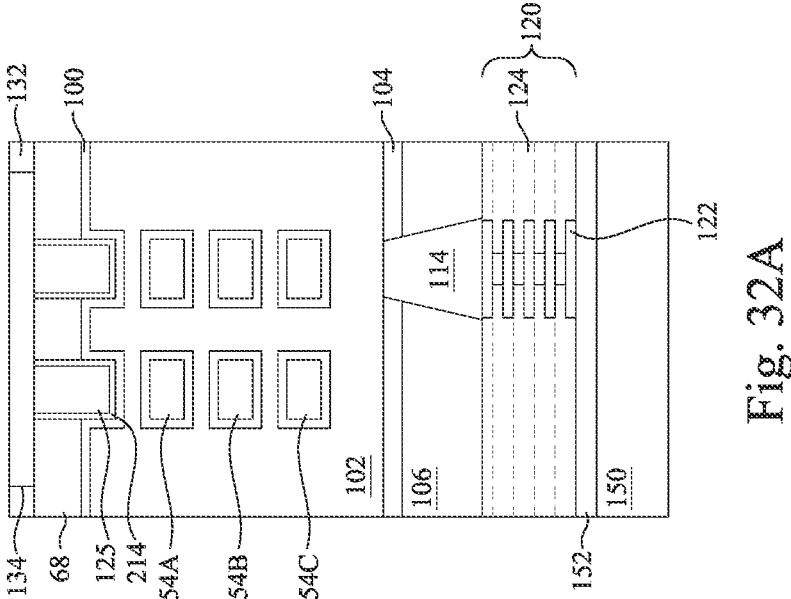
Figure 32C:
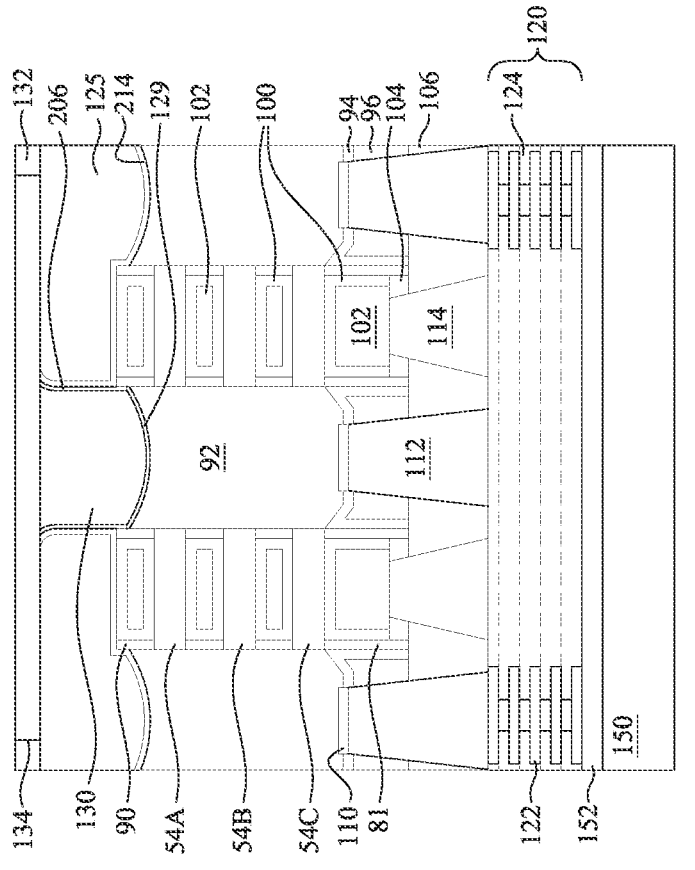
Figure 33B:
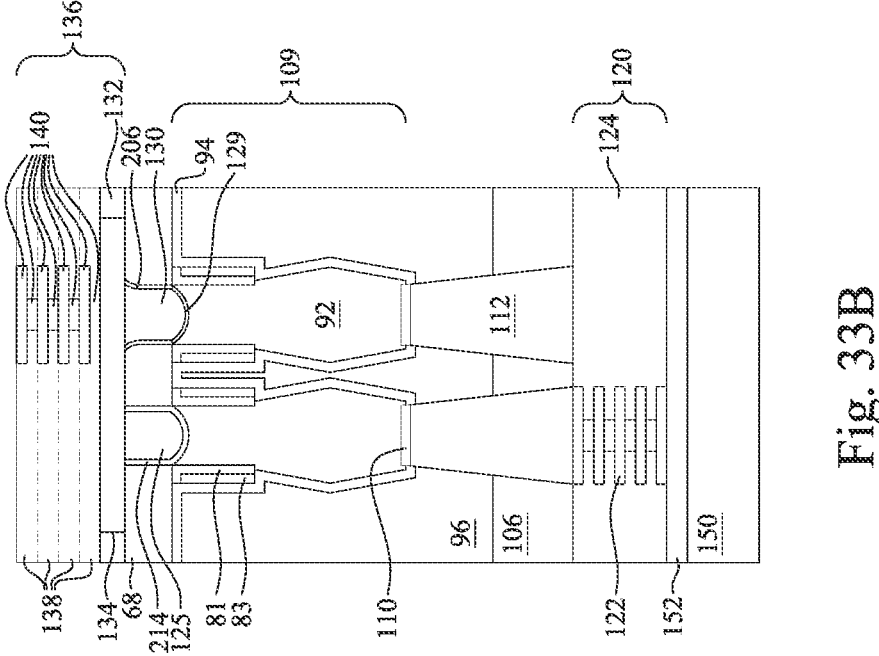
Figure 33A:
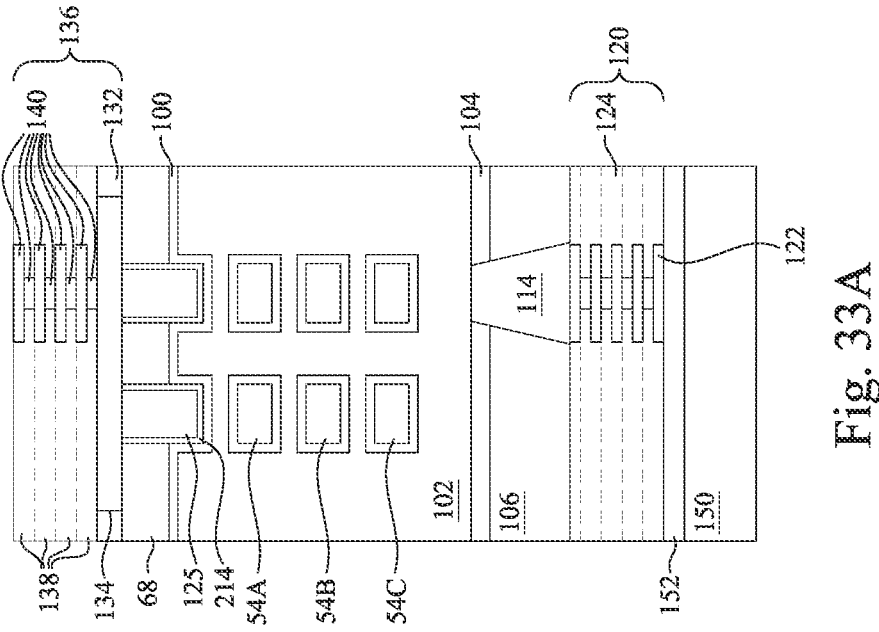
Figure 33C:
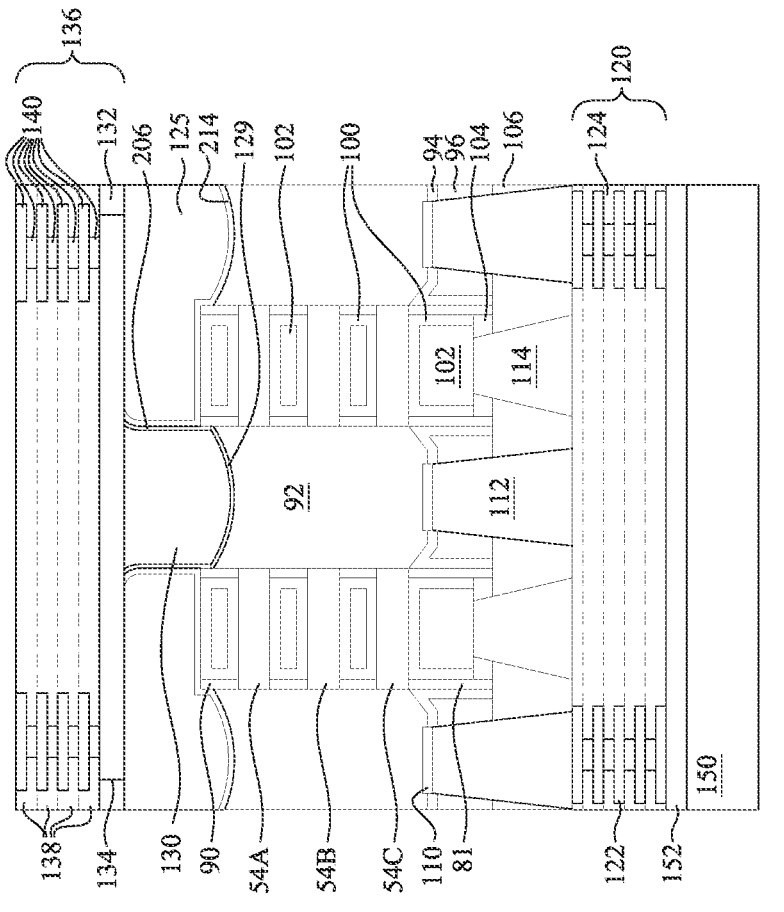

In FIGS. 32A through 32C, conductive lines 134 and a third dielectric layer 132 are formed over the second dielectric layer 125, the STI regions 68, and the backside vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are physically and electrically coupled to the epitaxial source/drain regions 92 through the backside vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

In FIGS. 33A through 34C, remaining portions of a backside interconnect structure 136 are formed over the third dielectric layer 132 and the conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the second dielectric layer 125, the third dielectric layer 132, the backside vias 130, and the conductive lines 134.

The remaining portions of the backside interconnect structure 136 may comprise materials and be formed using processes the same as or similar to those used for the front-side interconnect structure 120, discussed above with respect to FIGS. 21A through 21C. In particular, the backside interconnect structure 136 may comprise stacked layers of second conductive features 140 formed in fourth dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the conductive lines 134 (e.g., the power rail) to provide circuits (e.g., power circuits) on the backside of the nano-FETs.

Figure 34B:
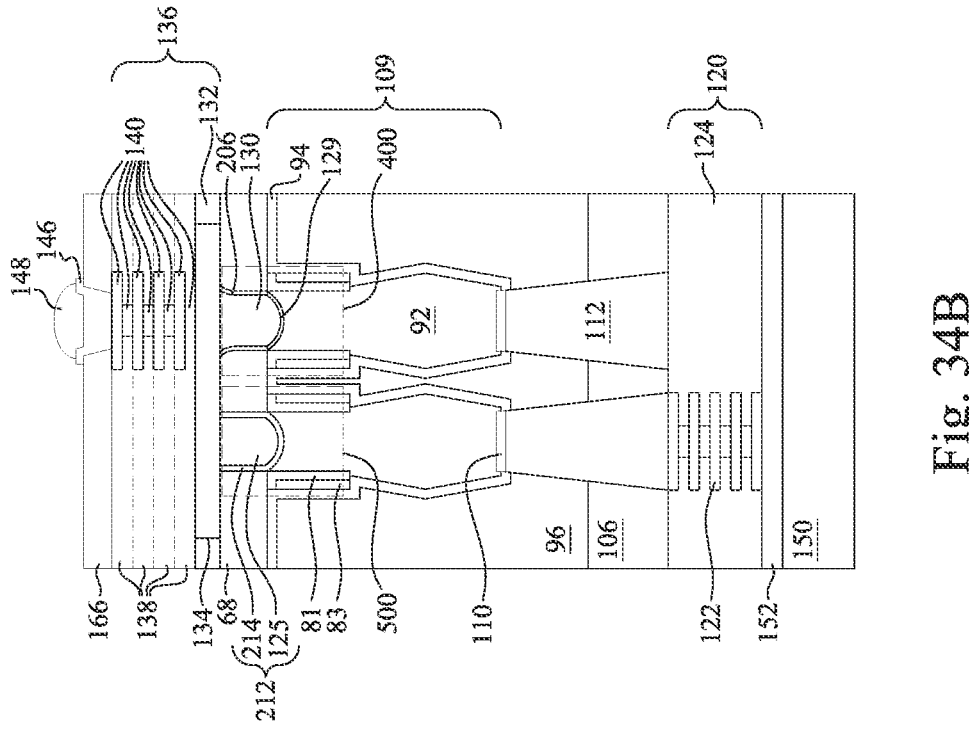
Figure 34A:
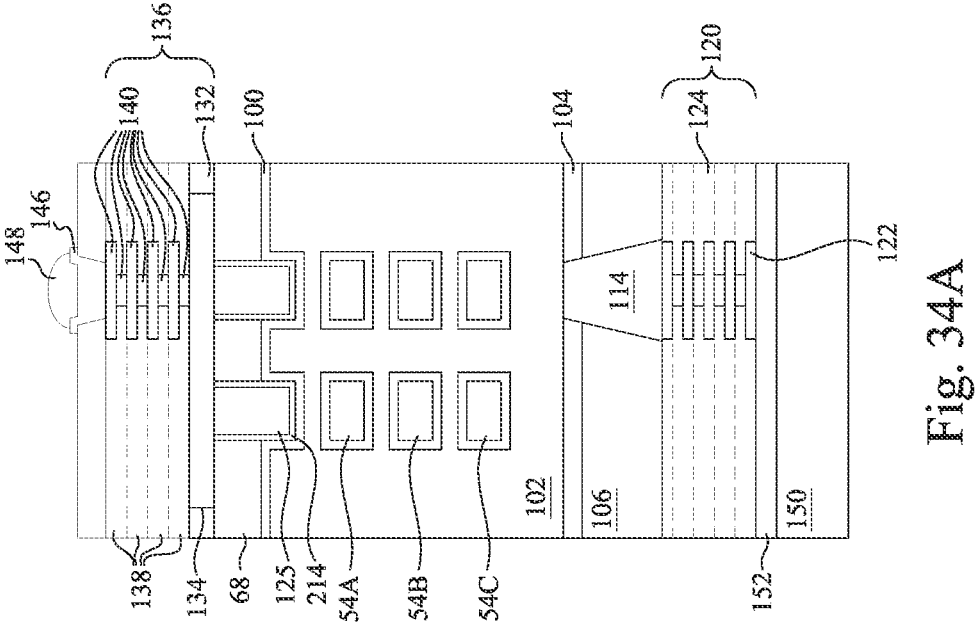
Figure 34C:
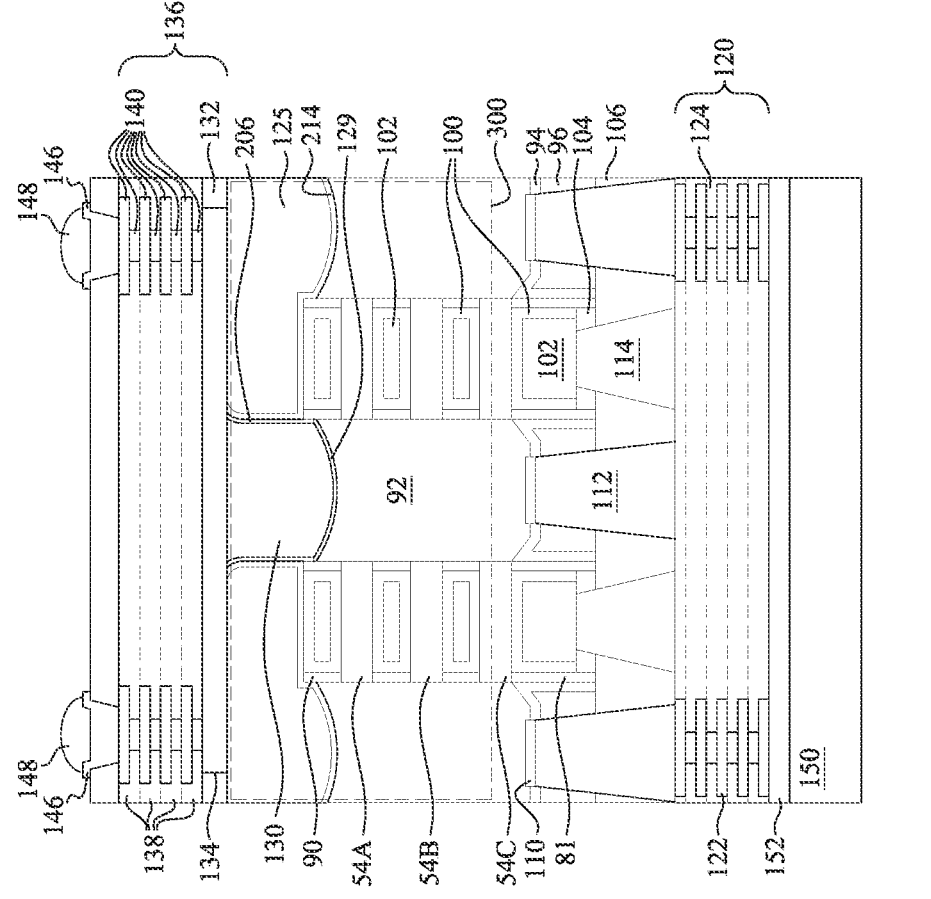

In FIGS. 34A through 34C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

Figure 34D:
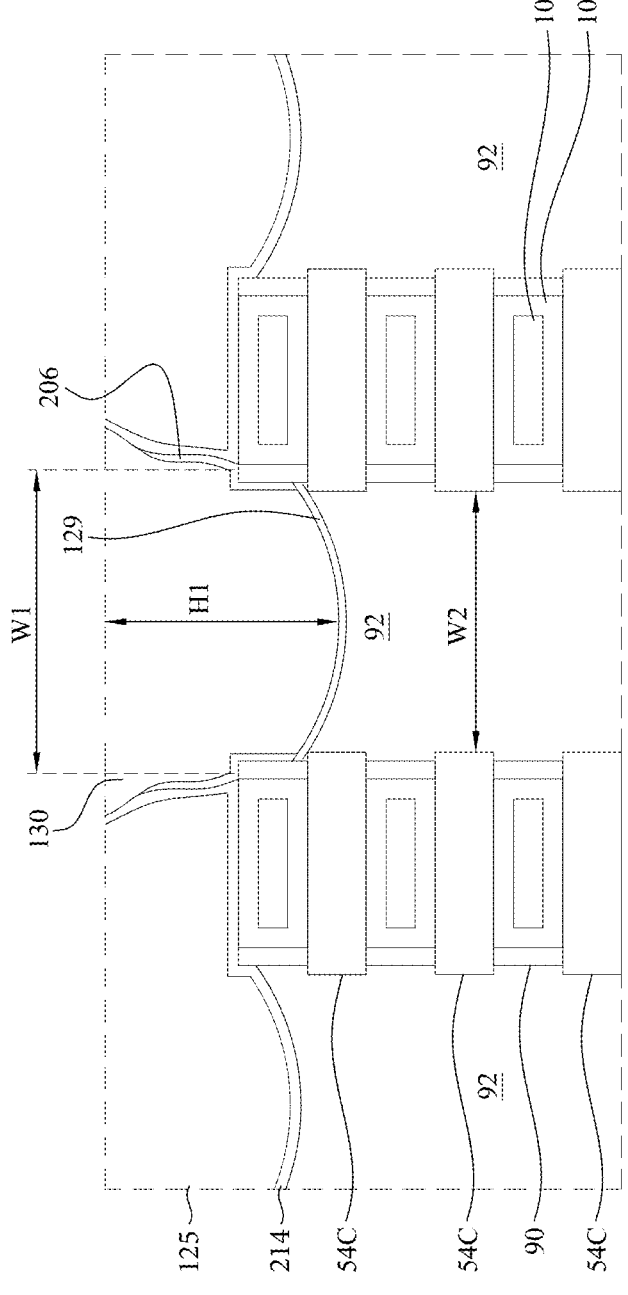
Figure 34F:
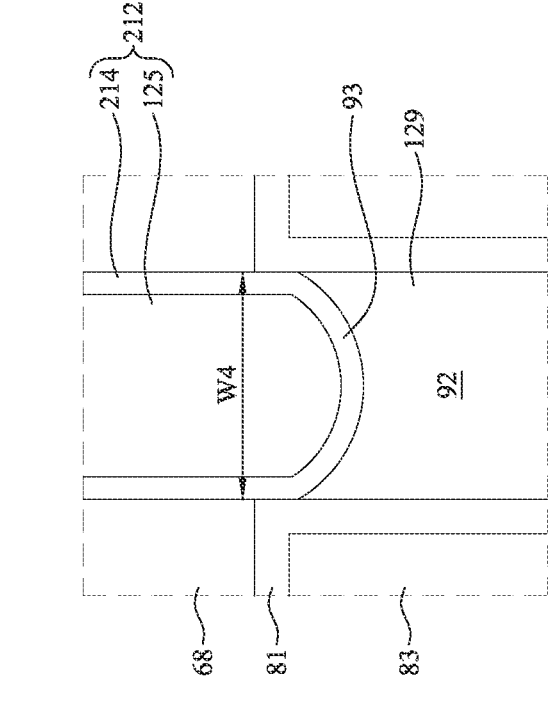
Figure 34E:
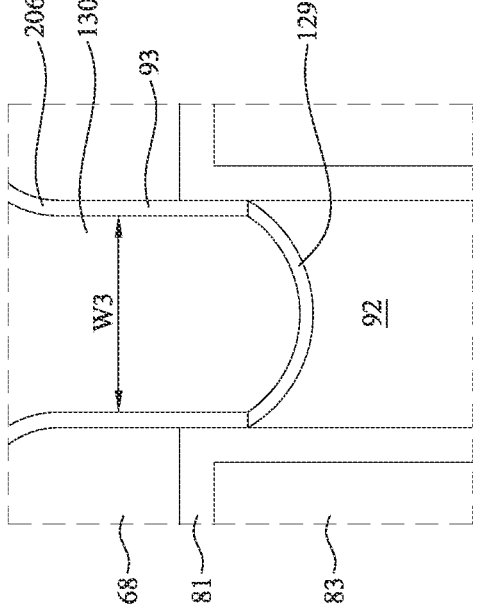

FIGS. 34D through 34F illustrate detailed views of regions in FIGS. 34B and 34C. FIG. 34D illustrates a detailed view of region 300 shown in FIG. 34C, in accordance with some embodiments. The backside vias 130 may have a minimum first width W1 measured between opposite sidewalls at a level of the second dielectric layer 125 above the inner spacers 90 along cross section C-C' of FIG. 1 in a range of about 25 nm to about 50 nm, which may be advantageous because it may enable lower contact resistance, which may improve device performance. The first width W1 being less than about 25 nm may be disadvantageous because it may lead to higher contact resistance which may degrade device performance. The first width W1 being greater than about 50 nm may be disadvantageous because it may increase the risk for leakage to adjacent backside vias 130. The backside vias 130 may have a minimum first height H1 measured from a top surface of the backside vias 130 to a bottom vertex of the backside vias 130 in a range of about 15 nm to about 50 nm, which may be advantageous for achieving a good connection between the device and subsequently formed conductive lines 134 (see below, FIGS. 32A-C). The first height H1 being less than about 15 nm may be disadvantageous because it may lead to a high risk of leakage between device and the subsequently formed conductive lines 134. The first height H1 being greater than about 50 nm may be disadvantageous because it may lead to high resistance for the backside vias 130.

The epitaxial source/drain regions 92 may have a minimum second width W2 measured between opposite sidewalls of the second nanostructures 54 along cross section C-C' of FIG. 1 in a range of about 15 nm to about 25 nm, which may be advantageous because it may lower source/drain resistance which may improve device performance. The second width W2 being less than about 15 nm may be disadvantageous because a narrower W2 may increase source/drain resistance and degrade device performance. The second width W2 being greater than about 25 nm may be disadvantageous because it may result in device performance degradation due to reducing gate length and spacer width. In some embodiments, the first width W1 is greater than the second width W2, which may be useful for decreasing contact resistance and improving device function.

FIGS. 34E and 34F illustrate detailed views of regions 400 and 500 shown in FIG. 34B, respectively, in accordance with some embodiments. The backside vias 130 may have a minimum third width W3 measured between opposite sidewalls of the first liner 206 along cross section B-B' of FIG. 1 in a range of about 5 nm to about 50 nm, which may be advantageous because it may lower resistance for backside vias 130, which may improve device performance. The third width W3 being less than about 5 nm may be disadvantageous because it may lead to higher resistance for backside vias 130, which may reduce device performance. The third width W3 being greater than about 50 nm may be disadvantageous because it may increase the risk for leaks to adjacent backside vias 130. The insulating plugs 212 may have a minimum fourth width W4 measured between opposite sidewalls of the STI regions 68 along cross section C-C' of FIG. 1 in a range of about 10 nm to about 30 nm. In some embodiments, the third width W3 of the backside vias 130 is greater than the fourth width W4 of the insulating plugs 212. In some embodiments, the first width W1 of the backside vias 130 is greater than the fourth width W4 of the insulating plugs 212.

Figure 35B:
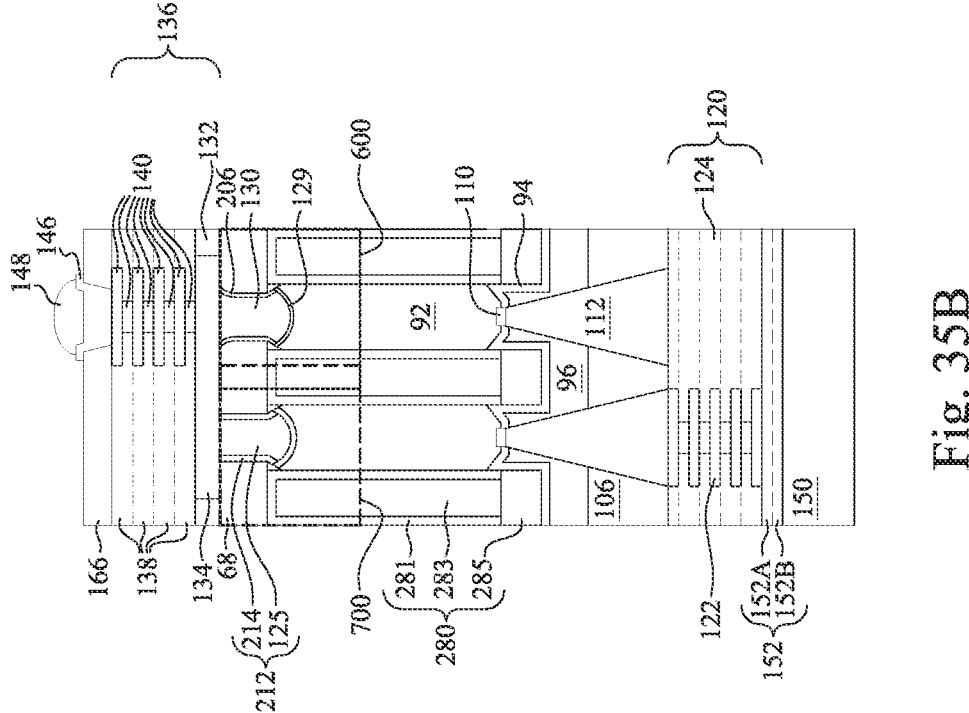
Figure 35A:
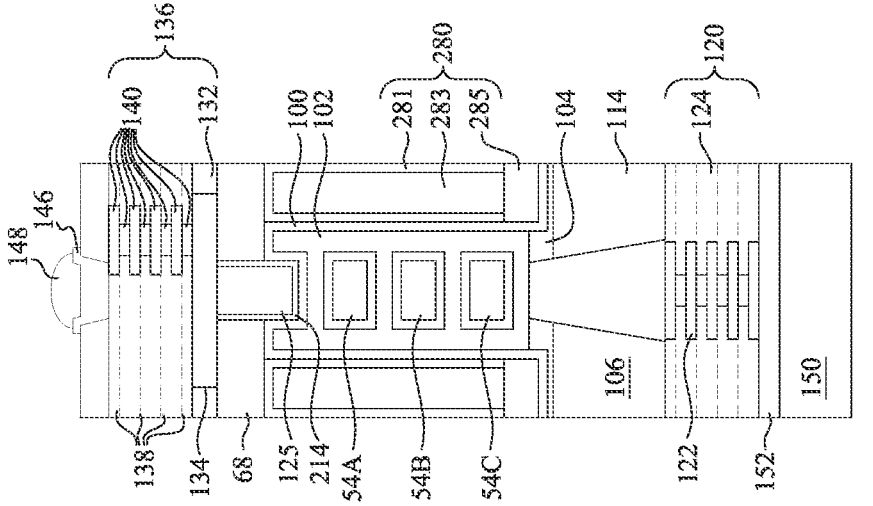
Figure 35C:
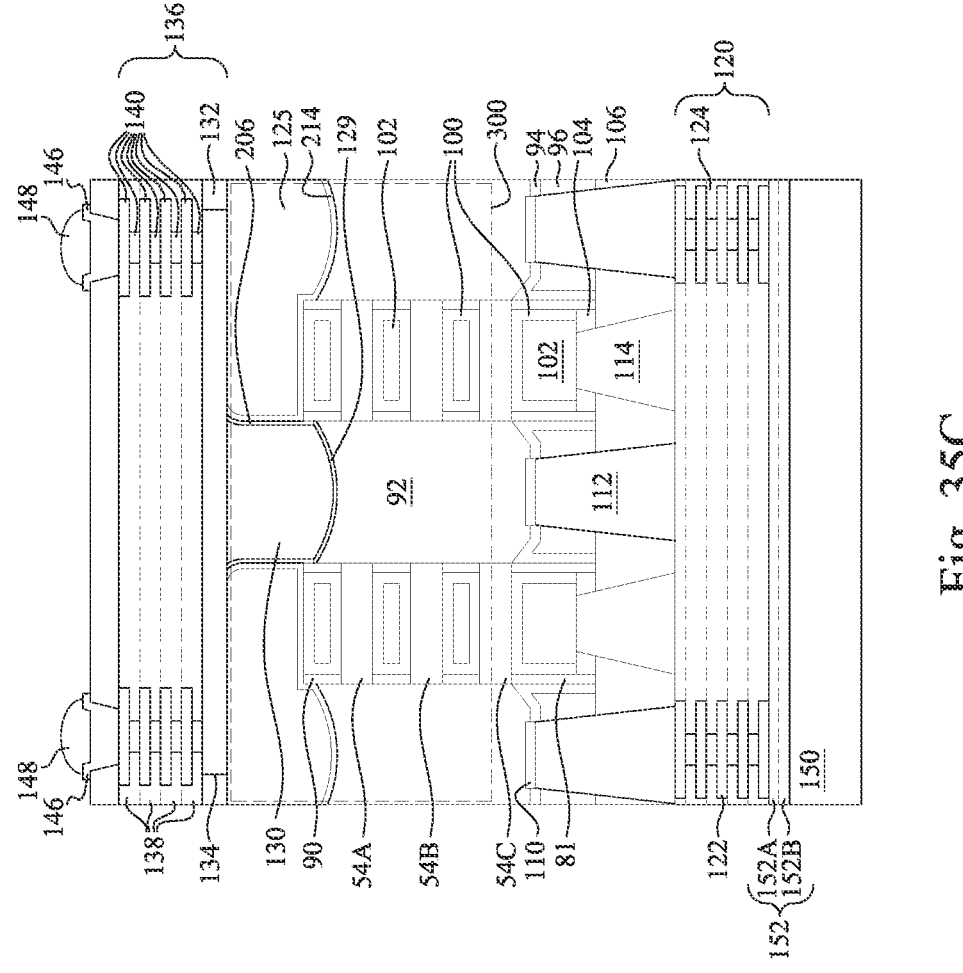

FIGS. 35A through 35E illustrate other embodiments in which the epitaxial source/drain regions 92 are separated by insulating fins 280. FIG. 35A is illustrated along cross-section A-A' and shows a similar structure as FIG. 34A but with insulating fins 280 adjacent to the gate electrode 102 and the gate dielectric 100 covering the insulating fins 280. FIG. 35B is illustrated along cross-section B-B' and shows a similar structure as FIG. 35B but with the epitaxial source/drain regions 92 disposed between the insulating fins 280 and the CESL 94 covering the insulating fins 280. FIG. 35C is illustrated along cross-section C-C' and shows a substantially similar structure as FIG. 34C. The insulating fins 280 may be formed after formation of the fins 66 by etching (see FIG. 4) and before formation of the dummy gates 76 (see FIG. 5). The insulating fins 280 may be formed by depositing sacrificial layer (not explicitly illustrated) on sidewalls of the fins 66 using a conformal deposition process, such as CVD, ALD, PECVD, or the like. In some embodiments, the sacrificial material is a semiconductor material (e.g., SiGe, Si, or the like) that has a same material composition as the first semiconductor layer 51 or the second semiconductor layer 53. The sacrificial material may define recesses between the fins 66 over the sacrificial material and between sidewalls of the sacrificial material. One or more insulating materials are deposited in the recesses to form the insulating fins 280. For example, a liner 281 and a fill material 283 may be deposited in the recesses by CVD, ALD, PECVD, or the like. The liner 281 may comprise, for example, a nitride (e.g., silicon nitride) or the like, and the fill material 283 may comprise, for example, an oxide (e.g., silicon oxide) or the like. In embodiments, a portion of the liner 281 and the fill material 283 may be partially etched, and a high-k material 285, such as HfO, ZrO, or the like, may be deposited into that recess over the liner 281 and the fill material 283.

The insulating fins 280 provide an insulating boundary between adjacent epitaxial source/drain regions 92, which may have different conductivity types. After the insulating fins 280 are formed, the sacrificial material may be removed concurrently with removing the first semiconductor layer 51 and/or the second semiconductor layer 53 to define the first nanostructures 52.

Figure 35E:
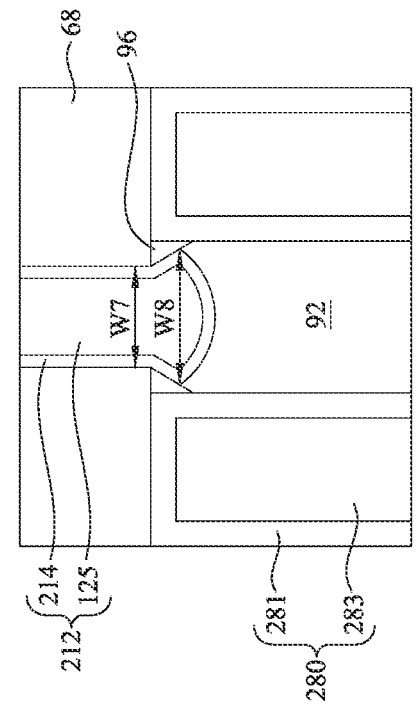
Figure 35D:
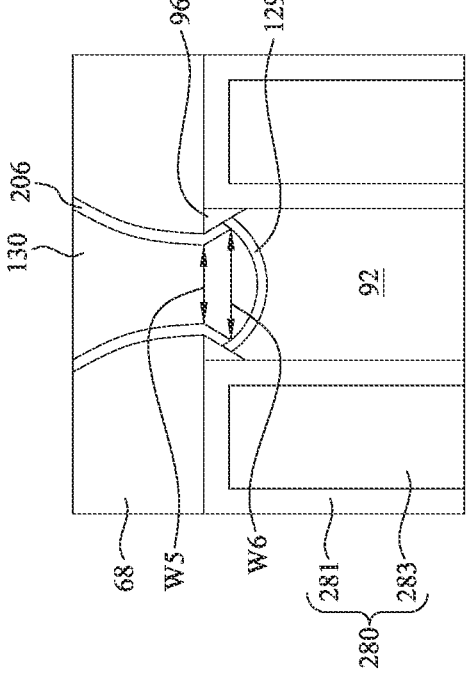

FIGS. 35D and 35E illustrate detailed views of region 600 shown in FIG. 35B and region 700 shown in FIG. 35B, respectively, in accordance with some embodiments. In some embodiments, the epitaxial source/drain regions 92 may contact sidewalls of the insulating fins 280, and a portion of the first ILD 96 may be deposited between the insulating fins 280, the STI regions 68, and the first liner 206 or the second liner 214. The portions of first ILD 96 may result in the backside vias 130 and the insulating plugs 212 to form bottleneck profiles with an upper width smaller than a lower width. FIG. 35D illustrates a minimum fifth width W5 of the backside vias 130 level with a bottom surface of the STI regions 68 and a sixth width W6 of the backside vias 130 measured across the widest portion of the backside vias 130 below the STI regions 68. The fifth width W5 is smaller than the sixth width W6, forming a bottleneck profile of the backside vias 130. FIG. 35E illustrates a minimum seventh width W7 of the insulating plug 212 level with a bottom surface of the STI regions 68 and an eighth width W8 of the insulating plug 212 measured across the widest portion of the insulating plug 212 below the STI regions 68. The seventh width W7 is smaller than the eighth width W8, forming a bottleneck profile of the backside vias 130.

Embodiments may achieve advantages. Backside vias may be widened by forming the backside vias prior to removing remaining portions of fins and substrates. Liner formation and subsequent etches may not reduce the width of the backside vias as they are applied to the outside of the backside vias. Better contact resistance, silicide formation, and resulting better device performance may be obtained from the wider backside vias formed prior to the fin and substrate removal.

In accordance with an embodiment, a device includes: a device layer including a first transistor; a first interconnect structure on a front-side of the device layer; and a second interconnect structure on a backside of the device layer. The second interconnect structure includes: a first dielectric material on the backside of the device layer; a contact extending through the first dielectric material to a first source/drain region of the first transistor, a first width of the contact being greater than a second width of the first source/drain region, the first width of the contact being measured at a level of the first dielectric material, and the second width of the first source/drain region being measured from a first nanostructure of the first transistor to a second nanostructure; and a first conductive layer including a first conductive line electrically connected to the first source/drain region through the contact. In an embodiment, the first width is in a range of 25 nm to 50 nm, the second width is in a range of 15 nm to 25 nm, and the contact has a height in a range of 15 nm to 50 nm. In an embodiment, the device further includes an insulating spacer on a sidewall of the contact, the spacer separating the contact from the first dielectric material. In an embodiment, the insulating spacer extends closer to the first interconnect structure than the first dielectric material. In an embodiment, the contact has tapering sidewalls in a cross-sectional view. In an embodiment, the contact extends between the first nanostructure and the second nanostructure.

In accordance with another embodiment, a device includes: a first transistor in a device layer, the first transistor including a first source/drain region and a second source/drain region; a first dielectric material on a backside of the device layer; a conductive contact extending through the first dielectric material to the first source/drain region; and an insulating plug extending through the first dielectric material to the second source/drain region, wherein a first width of the conductive contact is greater than a second width of the insulating plug, the first width and the second width each being measured at a level of the first dielectric material. In an embodiment, the insulating plug includes: a dielectric liner on sidewalls of the first dielectric material; and a second dielectric material on the dielectric liner, wherein the dielectric liner separates the second dielectric material from the first dielectric material, and wherein the dielectric liner separates the second dielectric material from the second source/drain region. In an embodiment, the first dielectric material is a shallow trench isolation (STI) region.

In an embodiment, the insulating plug includes a convex bottom profile physically contacting the second source/drain region. In an embodiment, the insulating plug includes a bottleneck profile. In an embodiment, the conductive contact includes a bottleneck profile. In an embodiment, the conductive contact has a tapering profile in a cross-sectional view.

In accordance with yet another embodiment, a method includes: forming a first transistor on a semiconductor substrate, the first transistor including a first source/drain region; planarizing the semiconductor substrate to expose a dummy semiconductor region; removing the dummy semiconductor region to define a first opening exposing a backside of the first source/drain region; widening the first opening, wherein widening the first opening includes etching the semiconductor substrate; after widening the first opening, forming a contact in the first opening, the contact being electrically coupled to the first source/drain region; and after forming the contact in the first opening, removing remaining portions of the semiconductor substrate. In an embodiment, removing remaining portions of the semiconductor substrate defines a second opening extending through a shallow trench isolation region, wherein the method further includes forming an insulating plug in the second opening, and wherein the insulating plug extends to a second source/drain region of the first transistor. In an embodiment, forming the insulating plug includes: depositing a first dielectric liner on sidewalls and a bottom surface of the second opening; and depositing a first dielectric material in the second opening over the first dielectric liner. In an embodiment, the method further includes: before forming the contact in the first opening, depositing a second dielectric liner on sidewalls of the first opening. In an embodiment, the method further includes: before forming the contact in the first opening, forming a silicide at the backside of the first source/drain region. In an embodiment, the method further includes: depositing a mask in the first opening, the mask covering the first source/drain region while widening the first opening; and removing the mask before forming in the contact in the first opening. In an embodiment, the mask includes a bottom anti-reflective coating (BARC) material. In an embodiment, after widening the first opening, the first opening includes a maximum width and a minimum width, a ratio of the maximum width to the minimum width being in a range of 1.1 to 1.8. In an embodiment, etching the semiconductor substrate includes performing a dry etching process using $O_2$, $Cl_2$, HCl, or HBr. In an embodiment, a first width of the contact is greater than a second width of the first source/drain region, the first width of the contact being measured at a level of a shallow trench isolation (STI) region, the contact extending through the STI region, and the second width of the first source/drain region being measured from a first nanostructure of the first transistor to a second nanostructure. In an embodiment, the first width is in a range of 25 nm to 50 nm and the second width is in a range of 15 nm to 25 nm.

In accordance with yet another embodiment, a device includes: a device layer including a first transistor, the first transistor including a first source/drain region and a second source/drain region; an isolation region on a backside of the device layer; a contact extending through the isolation region to physically contact the first source/drain region of the first transistor, a first width of the contact being greater than a second width of the first source/drain region; and an insulating plug extending through the isolation region to physically contact the second source/drain region. In an embodiment, the insulating plug has straight sidewalls in a cross-sectional view. In an embodiment, the contact has tapering sidewalls in a cross-sectional view. In an embodiment, the device further includes a liner between the contact and the first source/drain region, the liner having a thickness in a range of 1 nm to 5 nm. In an embodiment, the device further includes an insulating fin between the first source/drain region and the second source/drain region. In an embodiment, the device further includes a portion of an interlayer dielectric between the contact and the insulating fin. In an embodiment, the portion of the interlayer dielectric has a triangular profile in a cross-sectional view.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a device layer comprising a first source/drain region, a second source/drain region, a third source/drain region, a first nanostructure between the first source/drain region and the second source/drain region, a second nanostructure between the first source/drain region and the third source/drain region, a first inner spacer on the first nanostructure, and a second inner spacer on the second nanostructure;
   an isolation region on a backside of the device layer;
   a contact extending through the isolation region to electrically connect to the first source/drain region, a first width of the contact being greater than a second width of the first source/drain region, wherein the first width of the contact is between sidewalls of the contact in a plane over the first inner spacer and the second inner spacer, and wherein the second width is between a sidewall of the first nanostructure and a sidewall of the second nanostructure; and
   an insulating plug extending through the isolation region to physically contact the second source/drain region.

2. The device of claim 1, wherein the insulating plug has straight sidewalls in a cross-sectional view.

3. The device of claim 1, wherein the contact has tapering sidewalls in a cross-sectional view.

4. The device of claim 1, further comprising a liner between the contact and the isolation region, the liner having a thickness in a range of 1 nm to 5 nm.

5. The device of claim 1, further comprising an insulating fin between the first source/drain region and the second source/drain region.

6. The device of claim 5, further comprising a portion of an interlayer dielectric between the contact and the insulating fin.

7. The device of claim 6, wherein the portion of the interlayer dielectric has a triangular profile in a cross-sectional view.

8. A device comprising:
   a first transistor in a device layer, the first transistor comprising a first source/drain region and a second source/drain region;
   a first dielectric material on a backside of the device layer;

a conductive contact extending through the first dielectric material and electrically connected to the first source/drain region, wherein the conductive contact comprises a first width between opposing sidewalls of the conductive contact and in a first plane over a bottom surface of the first dielectric material; and
   an insulating plug extending through the first dielectric material to the second source/drain region, wherein the insulating plug comprises a second width between opposing sidewalls of the insulating plug and in a second plane over the bottom surface of the first dielectric material, and wherein the first width of the conductive contact is greater than the second width of the insulating plug.

9. The device of claim 8, wherein the insulating plug comprises:
   a dielectric liner on sidewalls of the first dielectric material; and
   a second dielectric material on the dielectric liner, wherein the dielectric liner separates the second dielectric material from the first dielectric material, and wherein the dielectric liner separates the second dielectric material from the second source/drain region.

10. The device of claim 8, wherein the first dielectric material is a shallow trench isolation (STI) region.

11. The device of claim 8, wherein the insulating plug comprises a convex bottom profile physically contacting the second source/drain region.

12. The device of claim 8, wherein the insulating plug comprises a bottleneck profile.

13. The device of claim 8, wherein the conductive contact comprises a bottleneck profile.

14. The device of claim 8, wherein the conductive contact has a tapering profile in a cross-sectional view.

15. A device comprising:
   a device layer comprising a first transistor;
   a first interconnect structure on a front-side of the device layer; and
   a second interconnect structure on a backside of the device layer, the second interconnect structure comprising:
      a first dielectric material on the backside of the device layer;
      a contact extending through the first dielectric material to a first source/drain region of the first transistor, a first width of the contact being greater than a second width of the first source/drain region, the first width of the contact being measured at a level of the first dielectric material, and the second width of the first source/drain region being measured from a first nanostructure of the first transistor to a second nanostructure of the first transistor; and
      a first conductive layer comprising a first conductive line electrically connected to the first source/drain region through the contact.

16. The device of claim 15, wherein the first width is in a range of 25 nm to 50 nm, the second width is in a range of 15 nm to 25 nm, and the contact has a height in a range of 15 nm to 50 nm.

17. The device of claim 15, further comprising an insulating spacer on a sidewall of the contact, the insulating spacer separating the contact from the first dielectric material.

18. The device of claim 17, wherein the insulating spacer extends closer to the first interconnect structure than the first dielectric material.

19. The device of claim 15, wherein the contact has tapering sidewalls in a cross-sectional view.

20. The device of claim 15, wherein the contact extends between the first nanostructure and the second nanostructure.

* * * * *